US010432161B2

(12) United States Patent
Ashida et al.

(10) Patent No.: US 10,432,161 B2
(45) Date of Patent: Oct. 1, 2019

(54) BAND-PASS FILTER

(71) Applicant: TDK CORPORATION, Minato-ku, Tokyo (JP)

(72) Inventors: Yuta Ashida, Tokyo (JP); Naoki Sotoma, Tokyo (JP); Shigemitsu Tomaki, Tokyo (JP); Yasuyuki Hiwatashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/877,534

(22) Filed: Jan. 23, 2018

(65) Prior Publication Data
US 2018/0226934 A1   Aug. 9, 2018

(30) Foreign Application Priority Data

Feb. 3, 2017   (JP) ................. 2017-018745

(51) Int. Cl.
*H03H 1/00* (2006.01)
*H03H 7/01* (2006.01)
*H01P 1/208* (2006.01)
*H04W 84/04* (2009.01)

(52) U.S. Cl.
CPC ............. *H03H 1/00* (2013.01); *H01P 1/2088* (2013.01); *H03H 7/01* (2013.01); *H03H 2001/0021* (2013.01); *H04W 84/042* (2013.01)

(58) Field of Classification Search
CPC .... H01P 1/2088; H01P 1/203; H01P 1/20345; H01P 1/2013; H03H 1/00; H03H 7/01; H03H 2001/0021; H04W 84/042

USPC ......................................................... 333/181
See application file for complete search history.

(56) References Cited

U.S. PATENT DOCUMENTS

| 2002/0057139 | A1 | 5/2002 | Matsumura et al. |
| 2008/0093112 | A1 | 4/2008 | Kushta |
| 2008/0116998 | A1 | 5/2008 | Sekine et al. |
| 2016/0365616 | A1* | 12/2016 | Baldwin ............. H01P 1/20327 |
| 2018/0323485 | A1* | 11/2018 | Gnanou ............. H01P 1/20318 |

FOREIGN PATENT DOCUMENTS

| CN | 1402377 A | 3/2003 |
| CN | 1989650 A | 6/2007 |
| JP | 2006-311100 A | 11/2006 |

OTHER PUBLICATIONS

Mar. 29, 2019 Translation of Office Action issued in Chinese Patent Application No. 201810106713.4.

* cited by examiner

Primary Examiner — Robert J Pascal
Assistant Examiner — Kimberly E Glenn
(74) Attorney, Agent, or Firm — Oliff PLC

(57) ABSTRACT

A band-pass filter includes a main body formed of a dielectric, a plurality of resonators, a shield, and a partition formed of a conductor. Each of the plurality of resonators includes a resonator conductor portion. The resonator conductor portion has a first end and a second end opposite to each other in the longitudinal direction. The first end is connected to a ground, and the second end is open. The partition extends to pass through between the respective resonator conductor portions of two resonators, and is electrically connected to the shield.

18 Claims, 28 Drawing Sheets

BAND-PASS FILTER

BACKGROUND OF THE INVENTION

1. Field of the Invention

The present invention relates to a band-pass filter including a plurality of resonators and a shield.

2. Description of the Related Art

The standardization of fifth-generation mobile communication systems (hereinafter referred to as 5G) is currently ongoing. For 5G, the use of frequency bands of 10 GHz or higher, particularly a quasi-millimeter wave band of 10 to 30 GHz and a millimeter wave band of 30 to 300 GHz, is being studied to expand the frequency band.

One of electronic components used in a communication apparatus is a band-pass filter including a plurality of resonators. Each of the plurality of resonators includes, for example, a conductor portion that is long in one direction. To avoid electromagnetic radiation to the surroundings, some band-pass filters are configured so that the plurality of resonators are surrounded by a shield.

JP2006-311100A describes a chip-type multistage filter device usable in quasi-millimeter and millimeter wave bands. The chip-type multistage filter device includes a multilayer substrate, first and second surface ground electrodes, first and second internal ground electrodes, and first and second $\lambda/2$ resonator electrodes. The multilayer substrate is formed by stacking a plurality of dielectric layers. The multilayer substrate has first and second main surfaces opposed to each other, and first to fourth side surfaces connecting the first and second main surfaces. The first side surface and the second side surface are opposed to each other. The first surface ground electrode is disposed on the first side surface. The second surface ground electrode is disposed on the second side surface. The first internal ground electrode is disposed on one of the dielectric layers of the multilayer substrate that is relatively close to the first main surface. The second internal ground electrode is disposed on another one of the dielectric layers of the multilayer substrate that is relatively close to the second main surface. The first and second $\lambda/2$ resonator electrodes are disposed in an area surrounded by the first and second surface ground electrodes and the first and second internal ground electrodes.

The chip-type multistage filter device described in JP2006-311100A further includes a via hole conductor and a capacitance unit. The via hole conductor is formed to run through at least some of the dielectric layers so that the first and second internal ground electrodes are electrically connected to each other. The first and second $\lambda/2$ resonator electrodes are opposed to each other with the via hole conductor interposed therebetween. The capacitance unit is disposed within the multilayer substrate to add a coupling capacitance to between the first and second $\lambda/2$ resonator electrodes.

In a band-pass filter that is configured so that a plurality of resonators are surrounded by a shield, the shield and a dielectric material inside the shield constitute a structure similar to a waveguide, thereby generating at least one propagation mode for electromagnetic waves. Such a propagation mode for electromagnetic waves will hereinafter be referred to as a waveguide mode. In the band-pass filter, disadvantageously, the waveguide mode produces unwanted resonance having a resonance frequency in a frequency region above the passband, thus degrading the attenuation characteristic in the frequency region above the passband. For a band-pass filter that is designed to have a passband in the quasi-millimeter or millimeter wave band, the above-described problem is particularly noticeable because even the resonance frequency of a waveguide mode that is the lowest in resonance frequency (hereinafter, referred to as a lowest-order waveguide mode) is relatively close to the passband.

The resonance frequency of the lowest-order waveguide mode varies depending on the shape of the space defined by the shield. Typically, the larger the space, the lower the resonance frequency of the lowest-order waveguide mode.

In the chip-type multistage filter device described in JP2006-311100A, the first and second $\lambda/2$ resonator electrodes have a length of one half the wavelength corresponding to the center frequency of the passband or a length close to that. Such a length is relatively large, and thus the space defined by the first and second surface ground electrodes and the first and second internal ground electrodes is also relatively large. Thus, for the chip-type multistage filter device, the resonance frequency of the lowest-order waveguide mode is relatively close to the passband and the foregoing problem related to the lowest-order waveguide mode is more likely to occur.

Suppose that a band-pass filter includes a plurality of resonators each including a conductor portion that is long in one direction. In such a band-pass filter, the conductor portions have a plurality of harmonic resonance modes, which are resonance modes of harmonics of different orders, in addition to a basic resonance mode having a basic resonance frequency which determines the passband. Such a band-pass filter suffers a problem that one of the plurality of harmonic resonance modes that is the lowest in resonance frequency (hereinafter, referred to as a lowest-order harmonic resonance mode) also causes degradation in the attenuation characteristic in a frequency region above the passband.

In the chip-type multistage filter device described in JP2006-311100A, the resonance frequency of the first and second $\lambda/2$ resonator electrodes in the lowest-order harmonic resonance mode is twice the basic resonance frequency. For the chip-type multistage filter device, the resonance frequency of the lowest-order harmonic resonance mode is relatively close to the passband and thus the foregoing problem related to the lowest-order harmonic resonance mode is more likely to occur.

SUMMARY OF THE INVENTION

It is an object of the present invention to provide a band-pass filter that includes a plurality of resonators and a shield and is capable of preventing the attenuation characteristic in a frequency region above the passband from being degraded by the lowest-order waveguide mode and the lowest-order harmonic resonance mode.

A band-pass filter of the present invention includes: a main body formed of a dielectric; a first input/output port and a second input/output port integrated with the main body; a plurality of resonators; a shield; and a partition. The plurality of resonators are provided within the main body, and are located between the first input/output port and the second input/output port in circuit configuration. The shield is formed of a conductor and integrated with the main body. The partition is formed of a conductor, provided within the main body, and electrically connected to the shield.

The shield includes a first portion and a second portion spaced from each other in a first direction, and a connecting portion connecting the first and second portions. The first portion, the second portion and the connecting portion are arranged to surround the plurality of resonators.

The plurality of resonators include a first resonator and a second resonator. The first resonator includes a first resonator conductor portion formed of a conductor. The second resonator includes a second resonator conductor portion formed of a conductor. Each of the first and second resonator conductor portions is shaped to be elongated in a direction intersecting the first direction, and has a first end and a second end opposite to each other in a longitudinal direction of the resonator conductor portion. The first end is connected to the ground, and the second end is open.

The partition extends in a direction intersecting the longitudinal direction of each of the first and second resonator conductor portions such that at least part of the partition passes through between the first and second resonator conductor portions, and is in contact with the first portion and the second portion.

In the band-pass filter of the present invention, each of the first and second resonator conductor portions may be shaped to be elongated in a direction orthogonal to the first direction.

In the band-pass filter of the present invention, each of the first and second resonator conductor portions may have a length smaller than or equal to ¼ a wavelength corresponding to a center frequency of a passband of the band-pass filter.

In the band-pass filter of the present invention, the partition may extend in the first direction and connect the first portion and the second portion of the shield via a shortest path.

In the band-pass filter of the present invention, the first resonator may further include a first capacitor provided between the second end of the first resonator conductor portion and the ground, and the second resonator may further include a second capacitor provided between the second end of the second resonator conductor portion and the ground.

In the band-pass filter of the present invention, the first resonator and the second resonator may be configured to be electromagnetically coupled to each other.

In the band-pass filter of the present invention, the plurality of resonators may be three or more resonators configured so that two resonators adjacent to each other in circuit configuration are electromagnetically coupled to each other. In such a case, the first resonator and the second resonator may or may not be adjacent to each other in circuit configuration.

In the band-pass filter of the present invention, when the plurality of resonators are the aforementioned three or more resonators, all the resonators except the first and second resonators may each include a third resonator conductor portion formed of a conductor. The third resonator conductor portion is shaped to be elongated in a direction intersecting the first direction, and has a first end and a second end opposite to each other in the longitudinal direction of the third resonator conductor portion. The first end of the third resonator conductor portion is connected to the ground, and the second end of the third resonator conductor portion is open. The third resonator conductor portion may be shaped to be elongated in a direction orthogonal to the first direction. The third resonator conductor portion may have a length smaller than or equal to ¼ the wavelength corresponding to the center frequency of the passband of the band-pass filter.

In the band-pass filter of the present invention, the main body may include a multilayer structure composed of a plurality of dielectric layers stacked on each other. In such a case, the multilayer structure may include a main portion composed of two or more dielectric layers stacked on each other, among the plurality of dielectric layers. The main portion has a first end face and a second end face located at opposite ends in a direction in which the two or more dielectric layers are stacked. The first portion may be formed of a first conductor layer disposed on the first end face. The second portion may be formed of a second conductor layer disposed on the second end face. The partition may run through the two or more dielectric layers. The partition may include a plurality of first through hole lines each running through the two or more dielectric layers. Each of the plurality of first through hole lines includes two or more through holes connected in series. The connecting portion of the shield may include a plurality of second through hole lines each running through the two or more dielectric layers. Each of the plurality of second through hole lines includes two or more through holes connected in series.

In the band-pass filter of the present invention, when the main body includes the aforementioned multilayer structure, the first resonator conductor portion and the second resonator conductor portion may be located at the same position in the multilayer structure in the first direction. In such a case, the first resonator conductor portion and the second resonator conductor portion may be formed of different portions of a single conductor layer.

In the band-pass filter of the present invention, the partition divides the space defined by the shield into a space in which the first resonator conductor portion is located and a space in which the second resonator conductor portion is located. The present invention thereby makes the resonance frequency of the lowest-order waveguide mode higher than in the case without the partition. Further, the present invention enables reduction in the length of each of the first and second resonator conductor portions, and consequently enables reduction in size of the space defined by the shield. The present invention thereby provides a higher resonance frequency of the lowest-order waveguide mode. Further, according to the present invention, the resonance frequency of the lowest-order harmonic resonance mode in each of the first and second resonator conductor portions is three times the basic resonance frequency. The present invention thus provides a higher resonance frequency of the lowest-order harmonic resonance mode. Consequently, the band-pass filter of the present invention enables preventing the attenuation characteristic in the frequency region above the passband from being degraded by the lowest-order waveguide mode and the lowest-order harmonic resonance mode.

Other and further objects, features and advantages of the invention will appear more fully from the following description.

DETAILED DESCRIPTION OF THE PREFERRED EMBODIMENT

First Embodiment

Figure 1:
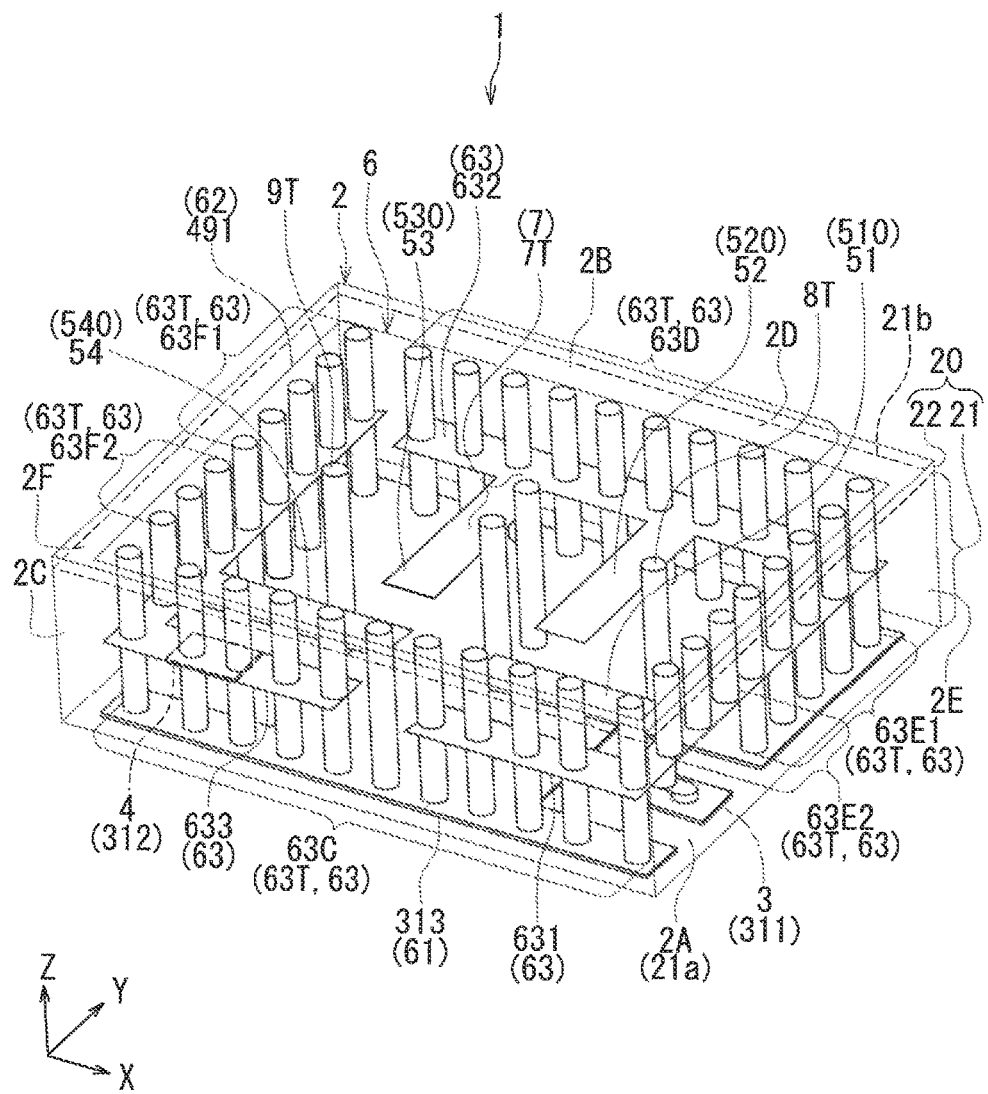
FIG. 1 is a perspective view illustrating the structure of a band-pass filter according to a first embodiment of the invention.
Figure 2:
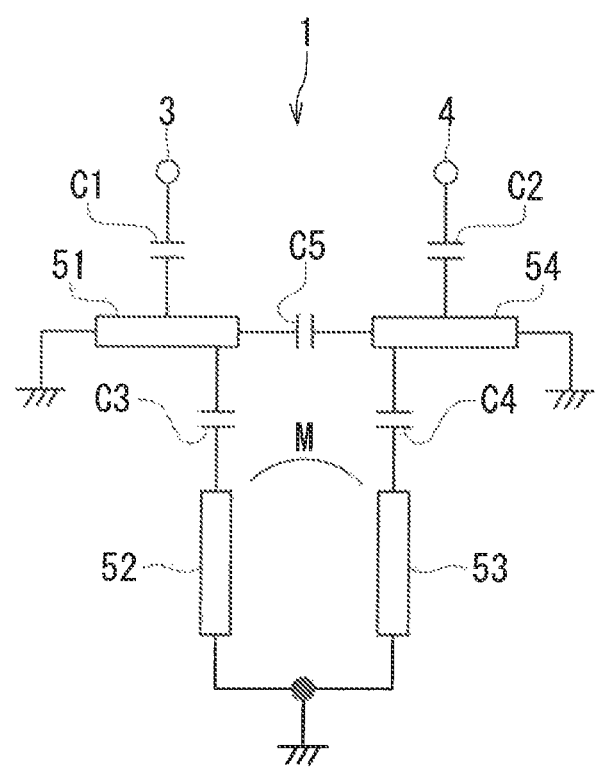
FIG. 2 is a circuit diagram illustrating the circuit configuration of the band-pass filter according to the first embodiment of the invention.

Preferred embodiments of the present invention will now be described in detail with reference to the drawings. First, reference is made to FIG. 1 and FIG. 2 to describe the configuration of a band-pass filter according to a first embodiment of the invention. FIG. 1 is a perspective view illustrating the structure of the band-pass filter according to the present embodiment. FIG. 2 is a circuit diagram illustrating the circuit configuration of the band-pass filter according to the present embodiment.

As shown in FIG. 1, the band-pass filter 1 according to the present embodiment includes: a main body 2 formed of a dielectric; a first input/output port 3 and a second input/output port 4 integrated with the main body 2; a plurality of resonators provided within the main body 2; a shield 6; and a partition 7. The shield 6 is formed of a conductor and integrated with the main body 2. The shield 6 is connected to the ground. The shield 6 has the function of preventing electromagnetic radiation to the surroundings of the band-pass filter 1. The partition 7 is formed of a conductor, provided within the main body 2 and electrically connected to the shield 6.

The main body 2 includes a multilayer structure 20 composed of a plurality of dielectric layers stacked on each other. Here, X, Y and Z directions are defined as shown in FIG. 1. The X, Y and Z directions are orthogonal to one another. In the present embodiment, the Z direction (in FIG. 1, the upward direction) is a direction parallel to the direction in which the plurality of dielectric layers are stacked. The Z direction corresponds to the first direction in the present invention.

The main body 2 is shaped like a rectangular solid. The main body 2 has a first end face 2A and a second end face 2B located at opposite ends of the main body 2 in the Z direction, and further has four side surfaces 2C, 2D, 2E and 2F connecting the first end face 2A and the second end face 2B. The first end face 2A is also the bottom surface of the main body 2. The second end face 2B is also the top surface of the main body 2. The side surfaces 2C and 2D are located at opposite ends of the main body 2 in the Y direction. The side surfaces 2E and 2F are located at opposite ends of the main body 2 in the X direction.

The plurality of resonators are located between the first input/output port 3 and the second input/output port 4 in circuit configuration. In this application, the phrase "in circuit configuration" is used to describe layout in a circuit diagram, not in a physical configuration. In the present embodiment, as shown in FIG. 2, the plurality of resonators include a first-stage resonator 51, a second-stage resonator 52, a third-stage resonator 53, and a fourth-stage resonator 54 which are arranged in this order from the first-input/output-port-3 side in circuit configuration. The resonators 51 to 54 are configured so that two resonators adjacent to each other in circuit configuration are electromagnetically coupled to each other. Specifically, the resonators 51 to 54 are configured so that: the resonators 51 and 52 are adjacent to each other in circuit configuration and are electromagnetically coupled to each other; the resonators 52 and 53 are adjacent to each other in circuit configuration and are electromagnetically coupled to each other; and the resonators 53 and 54 are adjacent to each other in circuit configuration and are electromagnetically coupled to each other.

The shield 6 includes a first portion 61 and a second portion 62 spaced from each other in the first direction, i.e., the Z direction, and a connecting portion 63 connecting the first portion 61 and the second portion 62. The first portion 61, the second portion 62 and the connecting portion 63 are arranged to surround the four resonators 51 to 54.

The multilayer structure 20 includes a main portion 21 and a coating portion 22. The main portion 21 is composed of two or more dielectric layers stacked on each other, among the plurality of dielectric layers constituting the multilayer structure 20. The coating portion 22 is composed of one or more dielectric layers other than the two or more dielectric layers constituting the main portion 21, among the plurality of dielectric layers constituting the multilayer structure 20. The main portion 21 has a first end face 21a and a second end face 21b located at opposite ends in the direction in which the two or more dielectric layers are stacked. The coating portion 22 covers the second end face 21b. The first end face 21a of the main portion 21 coincides with the first end face 2A of the main body 2. The second end face 21b of the main portion 21 is located within the main body 2.

The first portion 61 is formed of a first conductor layer 313 disposed on the first end face 21a. The second portion 62 is formed of a second conductor layer 491 disposed on the second end face 21b. The second portion 62 is interposed between the main portion 21 and the coating portion 22.

The resonator 51 includes a resonator conductor portion 510 formed of a conductor. The resonator 52 includes a resonator conductor portion 520 formed of a conductor. The resonator 53 includes a resonator conductor portion 530 formed of a conductor. The resonator 54 includes a resonator conductor portion 540 formed of a conductor.

Each of the resonator conductor portions 510, 520, 530 and 540 is shaped to be elongated in a direction intersecting the first direction or the Z direction, and has a first end and a second end opposite to each other in the longitudinal direction of the resonator conductor portion. In the present embodiment, in particular, each of the resonator conductor portions 510, 520, 530 and 540 is shaped to be elongated in a direction orthogonal to the first direction or the Z direction. To be more specific, the resonator conductor portion 510 and the resonator conductor portion 540 are shaped to be elongated in the X direction, whereas the resonator conductor portion 520 and the resonator conductor portion 530 are shaped to be elongated in the Y direction.

The first end of each of the resonator conductor portions 510, 520, 530 and 540 is connected to the ground. The second end of each of the resonator conductor portions 510, 520, 530 and 540 is open.

Each of the resonator conductor portions 510, 520, 530 and 540 has a length smaller than or equal to ¼ a wavelength corresponding to the center frequency of the passband of the band-pass filter 1. In the present embodiment, in particular, the length of each of the resonator conductor portions 510, 520, 530 and 540 is ¼ the wavelength corresponding to the center frequency of the passband of the band-pass filter 1.

In the present embodiment, the second-stage resonator 52 corresponds to the first resonator of the present invention, and the third-stage resonator 53 corresponds to the second resonator of the present invention. The resonator conductor portion 520 corresponds to the first resonator conductor portion of the present invention, and the resonator conductor portion 530 corresponds to the second resonator conductor portion of the present invention. Each of the resonator conductor portions 510 and 540 corresponds to the third resonator conductor portion of the present invention.

The partition 7 extends in a direction intersecting the longitudinal direction of each of the resonator conductor portions 520 and 530 (the Y direction) such that at least part of the partition 7 passes through between the resonator conductor portions 520 and 530, and is in contact with the first portion 61 and the second portion 62. The resonator conductor portions 520 and 530 are respective components of the resonators 52 and 53 which are adjacent to each other in circuit configuration. In the present embodiment, in particular, the partition 7 extends in the first direction, i.e., the Z direction. The partition 7 connects the first portion 61 and the second portion 62 via the shortest path. To be more specific, the length of the partition 7 in the Z direction is equal to the distance between the first portion 61 and the second portion 62.

The partition 7 runs through the two or more dielectric layers constituting the main portion 21. In the present embodiment, the partition 7 include a plurality of first through hole lines 7T each running through the two or more dielectric layers constituting the main portion 21. In FIG. 1, each through hole line 7T is represented by a circular column. Each of the plurality of first through hole lines 7T includes two or more through holes connected in series. Each of the plurality of first through hole lines 7T extends in the Z direction. The plurality of first through hole lines 7T are arranged to be adjacent to each other in the Y direction. In the present embodiment, the number of the first through hole lines 7T is two.

The connecting portion 63 of the shield 6 includes a plurality of second through hole lines 63T each running through the two or more dielectric layers constituting the main portion 21. In FIG. 1, each through hole line 63T is represented by a circular column. Each of the plurality of second through hole lines 63T includes two or more through holes connected in series. Each of the plurality of second through hole lines 63T extends in the Z direction.

The plurality of second through hole lines 63T include a plurality of through hole lines 63C, a plurality of through hole lines 63D, a plurality of through hole lines 63E1, a plurality of through hole lines 63E2, a plurality of through hole lines 63F1, and a plurality of through hole lines 63F2. The plurality of through hole lines 63C are located near the side surface 2C of the main body 2 and arranged to be adjacent to each other in the X direction. The plurality of through hole lines 63D are located near the side surface 2D of the main body 2 and arranged to be adjacent to each other in the X direction. The plurality of through hole lines 63E1 and 63E2 are located near the side surface 2E of the main body 2 and arranged to be adjacent to each other in the Y direction. The plurality of through hole lines 63F1 and 63F2 are located near the side surface 2F of the main body 2 and arranged to be adjacent to each other in the Y direction.

The connecting portion 63 of the shield 6 further includes three shield conductor portions 631, 632 and 633. The shield conductor portion 631 is connected to some of the plurality of through hole lines 63C, and to the plurality of through hole lines 63E1 and 63E2. The shield conductor portion 632 is connected to the plurality of through hole lines 63D. The shield conductor portion 633 is connected to other some of the plurality of through hole lines 63C, and to the plurality of through hole lines 63F1 and 63F2.

The band-pass filter 1 further includes through hole lines 8T and 9T provided within the main body 2. Each of the through hole lines 8T and 9T runs through the two or more dielectric layers constituting the main portion 21, extends in the Z direction and is in contact with the first portion 61 and the second portion 62. Each of the through hole lines 8T and 9T includes two or more through holes connected in series. The through hole line 8T is located near the resonator conductor portion 510 and the resonator conductor portion 520. The through hole line 9T is located near the resonator conductor portion 530 and the resonator conductor portion 540. The through hole lines 8T and 9T have the function of assisting the function of the shield 6.

As shown in FIG. 2, the band-pass filter 1 further includes a capacitor C1 provided between the first input/output port 3 and the first-stage resonator 51, and a capacitor C2 provided between the second input/output port 4 and the fourth-stage resonator 54.

In FIG. 2, the capacitor symbol C3 represents capacitive coupling between the resonators 51 and 52. The capacitor symbol C4 represents capacitive coupling between the resonators 53 and 54. The curve labeled M represents magnetic coupling between the resonators 52 and 53. In the present embodiment, the first-stage resonator 51 and the fourth-stage resonator 54 are configured to be capacitively coupled to each other. In FIG. 2, the capacitor symbol C5 represents the capacitive coupling between the resonators 51 and 54.

Reference is now made to FIG. 3A to FIG. 6 to describe an example of the dielectric layers constituting the multilayer structure 20 and the configuration of a plurality of conductor layers and through holes formed in the dielectric layers. In this example, the multilayer structure 20 includes nineteen dielectric layers stacked on each other. The nineteen dielectric layers will be referred to as the first to nineteenth dielectric layers in the order from bottom to top. The main portion 21 is composed of the first to eighteenth dielectric layers. The coating portion 22 is composed of the nineteenth dielectric layer.

Figure 3A:
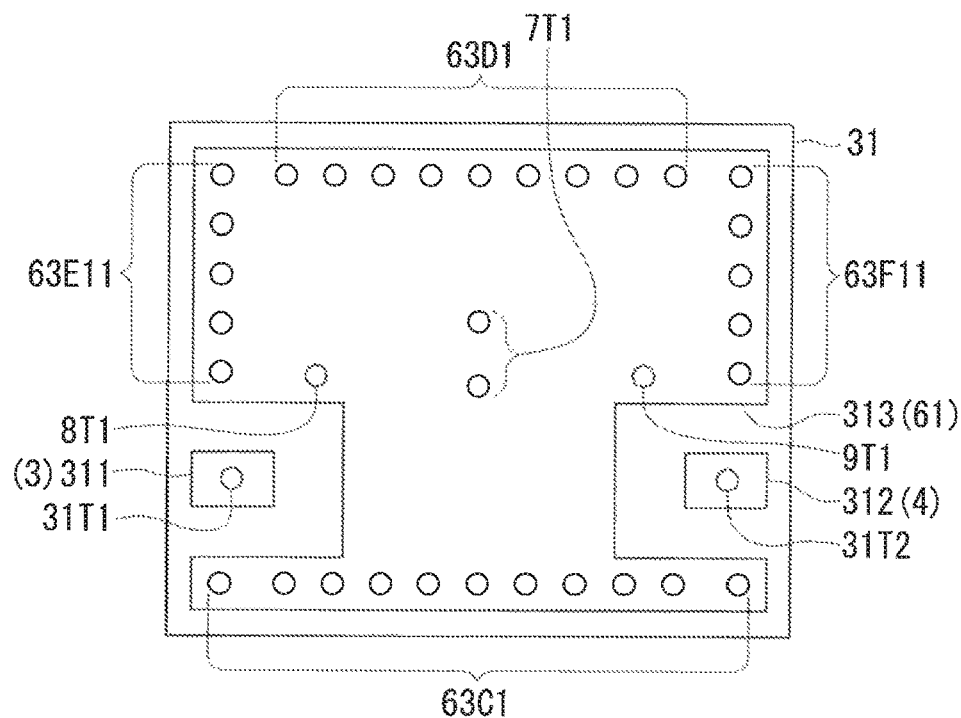
FIG. 3A is an explanatory diagram illustrating a patterned surface of a first dielectric layer of the band-pass filter of FIG. 1.
Figure 3B:
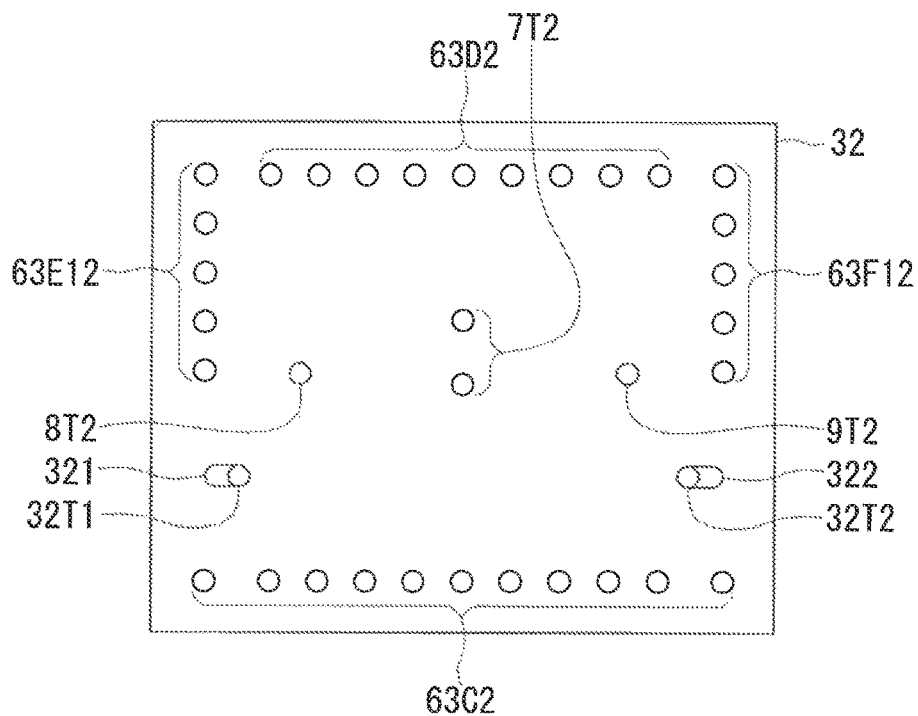
FIG. 3B is an explanatory diagram illustrating a patterned surface of a second dielectric layer of the band-pass filter of FIG. 1.
Figure 4A:
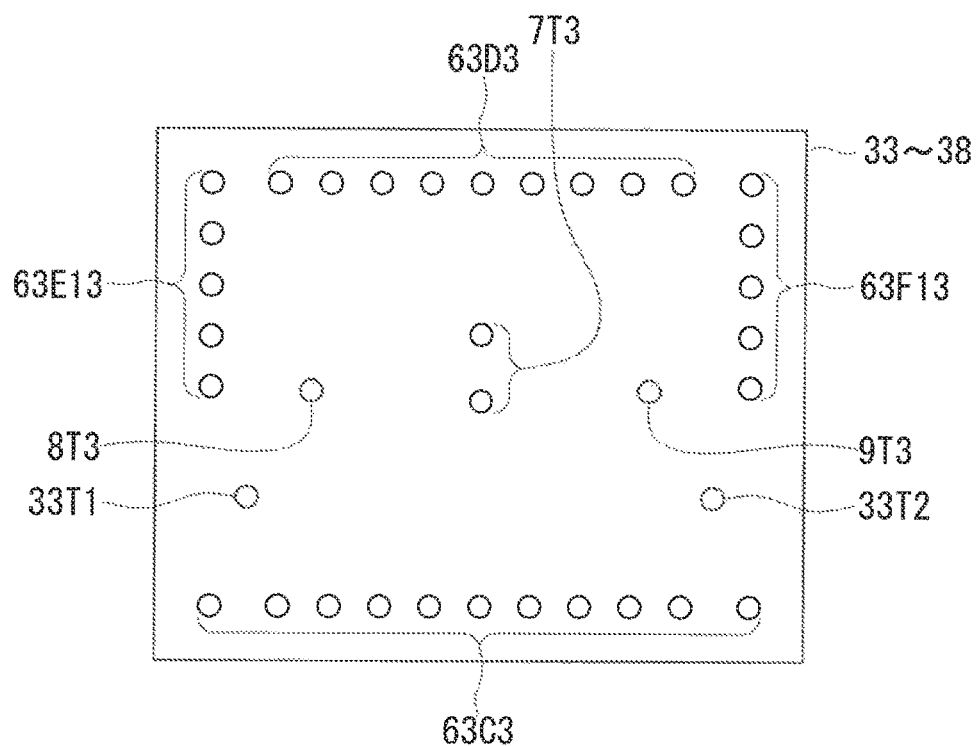
FIG. 4A is an explanatory diagram illustrating a patterned surface of each of a third to an eighth dielectric layer of the band-pass filter of FIG. 1.
Figure 4B:
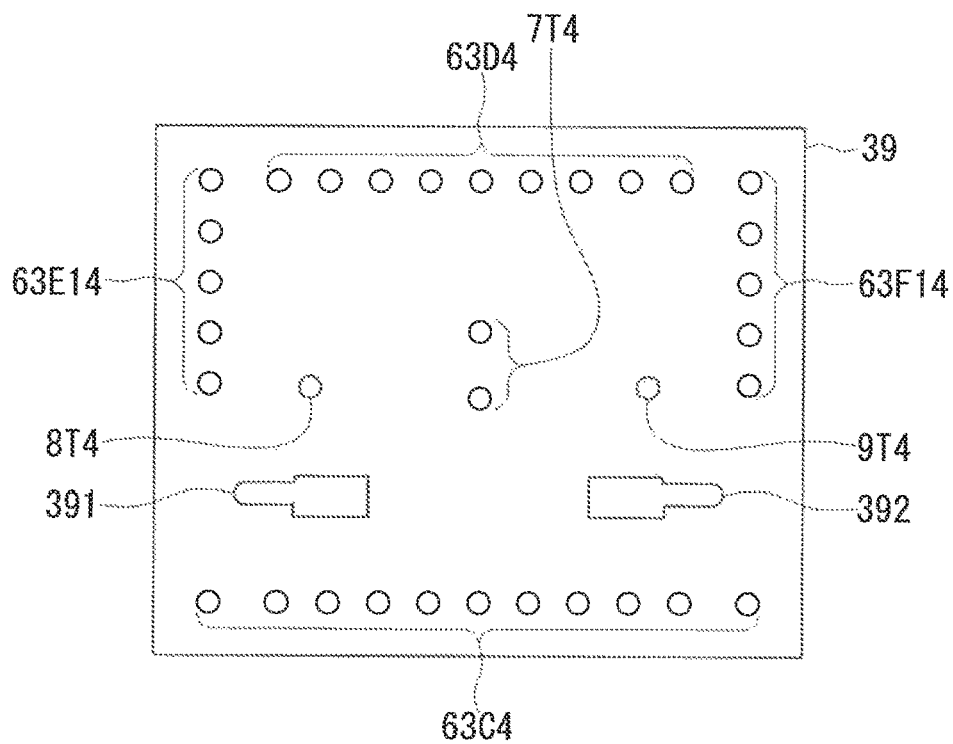
FIG. 4B is an explanatory diagram illustrating a patterned surface of a ninth dielectric layer of the band-pass filter of FIG. 1.
Figure 5A:
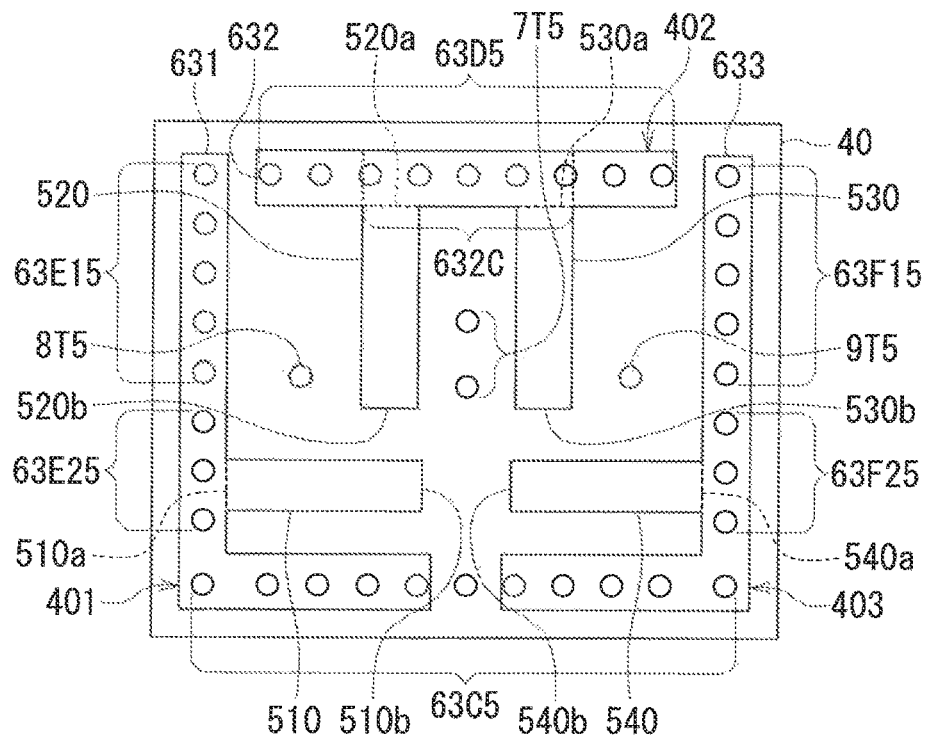
FIG. 5A is an explanatory diagram illustrating a patterned surface of a tenth dielectric layer of the band-pass filter of FIG. 1.
Figure 5B:
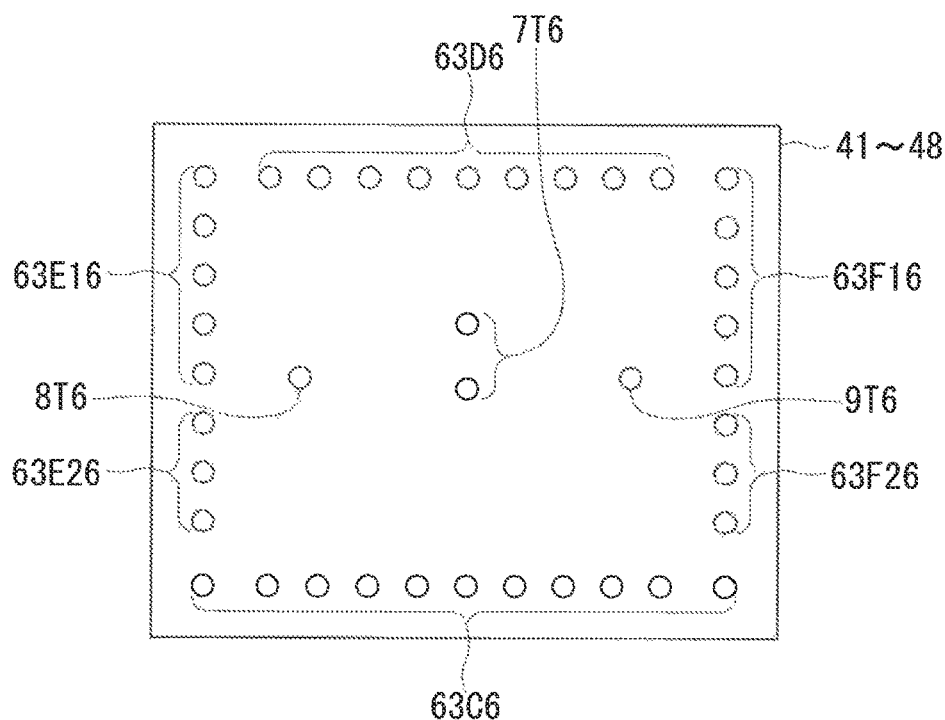
FIG. 5B is an explanatory diagram illustrating a patterned surface of each of an eleventh to an eighteenth dielectric layer of the band-pass filter of FIG. 1.
Figure 6:
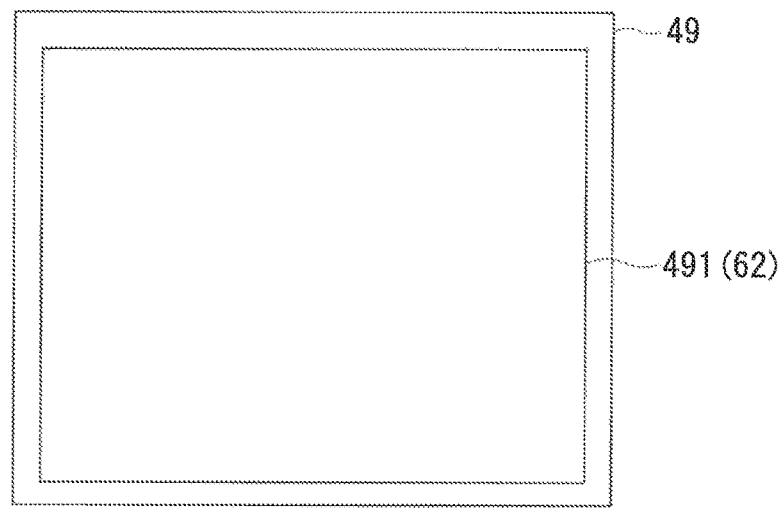
FIG. 6 is an explanatory diagram illustrating a patterned surface of a nineteenth dielectric layer of the band-pass filter of FIG. 1.

FIG. 3A illustrates a patterned surface of the first dielectric layer, and FIG. 3B illustrates a patterned surface of the second dielectric layer. FIG. 4A illustrates a patterned surface of the each of the third to the eighth dielectric layer, and FIG. 4B illustrates a patterned surface of the ninth dielectric layer. FIG. 5A illustrates a patterned surface of the tenth dielectric layer, and FIG. 5B illustrates a patterned surface of each of the eleventh to the eighteenth dielectric layer. FIG. 6 illustrates a patterned surface of the nineteenth dielectric layer. The first to the nineteenth dielectric layer are denoted by reference numerals 31 to 49.

On the patterned surface of the first dielectric layer 31, as shown in FIG. 3A, there are formed a conductor layer 311 forming the first input/output port 3, a conductor layer 312 forming the second input/output port 4, and the first conductor layer 313 forming the first portion 61 of the shield 6.

Further, formed in the dielectric layer 31 are a through hole 31T1 connected to the conductor layer 311, a through hole 31T2 connected to the conductor layer 312, a through hole 8T1 constituting part of the through hole line 8T, and a through hole 9T1 constituting part of the through hole line 9T. Further, two through holes 7T1 constituting respective portions of the two first through hole lines 7T are formed in the dielectric layer 31.

Further, formed in the dielectric layer 31 are a plurality of through holes 63C1 constituting respective portions of the plurality of through hole lines 63C, a plurality of through holes 63D1 constituting respective portions of the plurality of through hole lines 63D, a plurality of through holes 63E11 constituting respective portions of the plurality of through hole lines 63E1, and a plurality of through holes 63F11 constituting respective portions of the plurality of through hole lines 63F1.

The through holes 7T1, 8T1, 9T1, 63C1, 63D1, 63E11, and 63F11 are connected to the first conductor layer 313.

As shown in FIG. 3B, conductor layers 321 and 322 are formed on the patterned surface of the second dielectric layer 32. The through holes 31T1 and 31T2 shown in FIG. 3A are connected to the conductor layers 321 and 322, respectively.

In the dielectric layer 32, there are formed a through hole 32T1 connected to the conductor layer 321, a through hole 32T2 connected to the conductor layer 322, and through holes 8T2 and 9T2. The through holes 8T1 and 9T1 shown in FIG. 3A are connected to the through holes 8T2 and 9T2, respectively. Further, two through holes 7T2 are formed in the dielectric layer 32. The two through holes 7T1 shown in FIG. 3A are connected to the two through holes 7T2.

Further formed in the dielectric layer 32 are a plurality of through holes 63C2, a plurality of through holes 63D2, a plurality of through holes 63E12, and a plurality of through holes 63F12. The plurality of through holes 63C1 shown in FIG. 3A are connected to the plurality of through holes 63C2. The plurality of through holes 63D1 shown in FIG. 3A are connected to the plurality of through holes 63D2. The plurality of through holes 63E11 shown in FIG. 3A are connected to the plurality of through holes 63E12. The plurality of through holes 63F11 shown in FIG. 3A are connected to the plurality of through holes 63F12.

As shown in FIG. 4A, through holes 33T1, 33T2, 8T3 and 9T3 are formed in each of the third to eighth dielectric layers 33 to 38. The through holes 32T1, 32T2, 8T2 and 9T2 shown in FIG. 3B are respectively connected to the through holes 33T1, 33T2, 8T3 and 9T3 formed in the third dielectric layer 33.

Further, two through holes 7T3 are formed in each of the third to eighth dielectric layers 33 to 38. The two through holes 7T2 shown in FIG. 3B are respectively connected to the two through holes 7T3 formed in the third dielectric layer 33.

In each of the third to eighth dielectric layers 33 to 38, further formed are a plurality of through holes 63C3, a plurality of through holes 63D3, a plurality of through holes 63E13, and a plurality of through holes 63F13. The plurality of through holes 63C2 shown in FIG. 3B are connected to the plurality of through holes 63C3 formed in the third dielectric layer 33. The plurality of through holes 63D2 shown in FIG. 3B are connected to the plurality of through holes 63D3 formed in the third dielectric layer 33. The plurality of through holes 63E12 shown in FIG. 3B are connected to the plurality of through holes 63E13 formed in the third dielectric layer 33. The plurality of through holes 63F12 shown in FIG. 3B are connected to the plurality of through holes 63F13 formed in the third dielectric layer 33.

In the dielectric layers 33 to 38, every vertically adjacent through holes denoted by the same reference signs are connected to each other.

On the patterned surface of the ninth dielectric layer 39, as shown in FIG. 4B, there are formed a conductor layer 391 for forming the capacitor C1, and a conductor layer 392 for forming the capacitor C2. The through holes 33T1 and 33T2 formed in the eighth dielectric layer 38 (see FIG. 4A) are connected to the conductor layers 391 and 392, respectively.

Through holes 8T4 and 9T4 are formed in the dielectric layer 39. The through holes 8T3 and 9T3 formed in the eighth dielectric layer 38 are connected to the through holes 8T4 and 9T4, respectively.

Further, two through holes 7T4 are formed in the dielectric layer 39. The two through holes 7T3 formed in the eighth dielectric layer 38 are connected to the two through holes 7T4, respectively.

Further formed in the dielectric layer 39 are a plurality of through holes 63C4, a plurality of through holes 63D4, a plurality of through holes 63E14, and a plurality of through holes 63F14. The plurality of through holes 63C3 formed in the eighth dielectric layer 38 are connected to the plurality of through holes 63C4. The plurality of through holes 63D3 formed in the eighth dielectric layer 38 are connected to the plurality of through holes 63D4. The plurality of through holes 63E13 formed in the eighth dielectric layer 38 are connected to the plurality of through holes 63E14. The plurality of through holes 63F13 formed in the eighth dielectric layer 38 are connected to the plurality of through holes 63F14.

As shown in FIG. 5A, three conductor layers 401, 402 and 403 are formed on the patterned surface of the tenth dielectric layer 40. The conductor layer 401 includes the resonator conductor portion 510 and the shield conductor portion 631. The conductor layer 402 includes the resonator conductor portions 520 and 530 and the shield conductor portion 632. The conductor layer 403 includes the resonator conductor portion 540 and the shield conductor portion 633. In FIG. 5A the boundary between the resonator conductor portion 510 and the shield conductor portion 631, the boundary between the resonator conductor portion 520 and the shield conductor portion 632, the boundary between the resonator conductor portion 530 and the shield conductor portion 632, and the boundary between the resonator conductor portion 540 and the shield conductor portion 633 are indicated by broken lines.

The resonator conductor portion 510 has a first end 510a and a second end 510b opposite to each other in the longitudinal direction, i.e., the X direction. The first end 510a is connected to the shield conductor portion 631 and thereby connected to the ground. The second end 510b is open.

The resonator conductor portion 520 has a first end 520a and a second end 520b opposite to each other in the longitudinal direction, i.e., the Y direction. The first end 520a is connected to the shield conductor portion 632 and thereby connected to the ground. The second end 520b is open.

The resonator conductor portion 530 has a first end 530a and a second end 530b opposite to each other in the longitudinal direction, i.e., the Y direction. The first end 530a is connected to the shield conductor portion 632 and thereby connected to the ground. The second end 530b is open.

The resonator conductor portion 540 has a first end 540a and a second end 540b opposite to each other in the longitudinal direction, i.e., the X direction. The first end 540a is connected to the shield conductor portion 633 and thereby connected to the ground. The second end 540b is open.

In the present embodiment, as shown in FIG. 5A, the resonator conductor portions 520 and 530 are formed of different portions of the single conductor layer 402. The shield conductor portion 632 of the conductor layer 402 includes a connecting portion 632C connecting the first end 520a of the resonator conductor portion 520 and the first end 530a of the resonator conductor portion 530. In FIG. 5A, the two boundaries between the connecting portion 632C and the other portions of the shield conductor portion 632 are indicated by dotted lines. The connecting portion 632C has the role of enhancing the magnetic coupling between the resonators 52 and 53. The magnitude of the magnetic coupling between the resonators 52 and 53 is adjusted by the magnitude of the magnetic coupling between the resonators 52 and 53 without the connection portion 632C taken into consideration, and the connection portion 632C.

Through holes 8T5 and 9T5 are formed in the tenth dielectric layer 40 shown in FIG. 5A. The through holes 8T4 and 9T4 shown in FIG. 4B are connected to the through holes 8T5 and 9T5, respectively.

Further, two through holes 7T5 are formed in the dielectric layer 40. The two through holes 7T4 shown in FIG. 4B are connected to the two through holes 7T5.

Further formed in the dielectric layer 40 are a plurality of through holes 63C5, a plurality of through holes 63D5, a plurality of through holes 63E15, a plurality of through holes 63E25, a plurality of through holes 63F15, and a plurality of through holes 63F25.

Some of the plurality of through holes 63C5 are connected to the shield conductor portion 631. Other some of the plurality of through holes 63C5 are connected to the shield conductor portion 633. The plurality of through holes 63C4 shown in FIG. 4B are connected to the plurality of through holes 63C5.

The plurality of through holes 63D5 are connected to the shield conductor portion 632. The plurality of through holes 63D4 shown in FIG. 4B are connected to the plurality of through holes 63D5.

The plurality of through holes 63E15 and the plurality of through holes 63E25 are connected to the shield conductor portion 631. The plurality of through holes 63E14 shown in FIG. 4B are connected to the plurality of through holes 63E15.

The plurality of through holes 63F15 and the plurality of through holes 63F25 are connected to the shield conductor portion 633. The plurality of through holes 63F14 shown in FIG. 4B are connected to the plurality of through holes 63F15.

As shown in FIG. 5B, through holes 8T6 and 9T6 are formed in each of the eleventh to eighteenth dielectric layers 41 to 48. The through holes 8T5 and 9T5 shown in FIG. 5A are respectively connected to the through holes 8T6 and 9T6 formed in the eleventh dielectric layer 41.

Further, two through holes 7T6 are formed in each of the eleventh to eighteenth dielectric layers 41 to 48. The two through holes 7T5 shown in FIG. 5A are respectively connected to the two through holes 7T6 formed in the eleventh dielectric layer 41.

In each of the eleventh to eighteenth dielectric layers 41 to 48, further formed are a plurality of through holes 63C6, a plurality of through holes 63D6, a plurality of through holes 63E16, a plurality of through holes 63E26, a plurality of through holes 63F16, and a plurality of through holes 63F26. The plurality of through holes 63C5 shown in FIG. 5A are connected to the plurality of through holes 63C6 formed in the eleventh dielectric layer 41. The plurality of through holes 63D5 shown in FIG. 5A are connected to the plurality of through holes 63D6 formed in the eleventh dielectric layer 41.

The plurality of through holes 63E15 shown in FIG. 5A are connected to the plurality of through holes 63E16 formed in the eleventh dielectric layer 41. The plurality of through holes 63E25 shown in FIG. 5A are connected to the plurality of through holes 63E26 formed in the eleventh dielectric layer 41. The plurality of through holes 63F15 shown in FIG. 5A are connected to the plurality of through holes 63F16 formed in the eleventh dielectric layer 41. The plurality of through holes 63F25 shown in FIG. 5A are connected to the plurality of through holes 63F26 formed in the eleventh dielectric layer 41.

In the dielectric layers 41 to 48, every vertically adjacent through holes denoted by the same reference signs are connected to each other.

As shown in FIG. 6, the second conductor layer 491 forming the second portion 62 of the shield 6 is formed on the patterned surface of the nineteenth dielectric layer 49.

The through holes 7T6, 8T6, 9T6, 63C6, 63D6, 63E16, 63E26, 63F16 and 63F26 formed in the eighteenth dielectric layer 48 (see FIG. 5B) are connected to the second conductor layer 491.

The band-pass filter 1 according to the present embodiment is formed by stacking the first to the nineteenth dielectric layer 31 to 49 such that the patterned surface of the first dielectric layer 31 also serves as the first end face 2A of the main body 2. A surface of the nineteenth dielectric layer 49 opposite to the patterned surface serves as the second end face 2B of the main body 2. The first to nineteenth dielectric layers 31 to 49 constitute the multilayer structure 20.

The resonator conductor portions 510, 520, 530 and 540 are located at the same position in the multilayer structure 20 in the first direction, i.e., the Z direction.

The conductor layer 311 forming the first input/output port 3 is connected to the conductor layer 391 shown in FIG. 4B via the through hole 31T1, the conductor layer 321 and the through holes 32T1 and 33T1. The conductor layer 391 is opposed to the resonator conductor portion 510 shown in FIG. 5A with the dielectric layer 39 interposed therebetween. The capacitor C1 shown in FIG. 2 is composed of the conductor layer 391 and the resonator conductor portion 510, and the dielectric layer 39 interposed therebetween.

The conductor layer 312 forming the second input/output port 4 is connected to the conductor layer 392 shown in FIG. 4B via the through hole 31T2, the conductor layer 322 and the through holes 32T2 and 33T2. The conductor layer 392 is opposed to the resonator conductor portion 540 shown in FIG. 5A with the dielectric layer 39 interposed therebetween. The capacitor C2 shown in FIG. 2 is composed of the conductor layer 392 and the resonator conductor portion 540, and the dielectric layer 39 interposed therebetween.

The plurality of through hole lines 7T of the partition 7 are formed by connecting the plurality of through holes 7T1, 7T2, 7T3, 7T4, 7T5 and 7T6 in series in the Z direction.

The through hole line 8T is formed by connecting the plurality of through holes 8T1, 8T2, 8T3, 8T4, 8T5 and 8T6 in series in the Z direction. The through hole line 9T is formed by connecting the plurality of through holes 9T1, 9T2, 9T3, 9T4, 9T5 and 9T6 in series in the Z direction.

The plurality of through hole lines 63C are formed by connecting the plurality of through holes 63C1, 63C2, 63C3, 63C4, 63C5 and 63C6 in series in the Z direction.

The plurality of through hole lines 63D are formed by connecting the plurality of through holes 63D1, 63D2, 63D3, 63D4, 63D5 and 63D6 in series in the Z direction.

The plurality of through hole lines 63E1 are formed by connecting the plurality of through holes 63E11, 63E12, 63E13, 63E14, 63E15 and 63E16 in series in the Z direction. The plurality of through hole lines 63E2 are formed by connecting the plurality of through holes 63E25 and 63E26 in series in the Z direction.

The plurality of through hole lines 63F1 are formed by connecting the plurality of through holes 63F11, 63F12, 63F13, 63F14, 63F15 and 63F16 in series in the Z direction.

The plurality of through hole lines 63F2 are formed by connecting the plurality of through holes 63F25 and 63F26 in series in the Z direction.

The function and effects of the band-pass filter 1 according to the present embodiment will now be described. For example, the band-pass filter 1 is designed and configured to have a passband in a quasi-millimeter wave band of 10 to 30 GHz or a millimeter wave band of 30 to 300 GHz.

The band-pass filter 1 includes the resonators 51, 52, 53, and 54 which are provided between the first input/output port 3 and the second input/output port 4 and arranged in the listed order from the first-input/output-port-3 side in circuit configuration. Every two resonators that are adjacent to each other in circuit configuration are configured to be electromagnetically coupled to each other.

The resonators 51, 52, 53 and 54 include the resonator conductor portions 510, 520, 530 and 540, respectively. The first end of each of the resonator conductor portions 510, 520, 530 and 540 is connected to the ground. The second end of each of the resonator conductor portions 510, 520, 530 and 540 is open. Each of the resonator conductor portions 510, 520, 530 and 540 has a length of ¼ the wavelength corresponding to the center frequency of the passband of the band-pass filter 1. In this case, each of the resonators 51, 52, 53 and 54 operates as a quarter-wave resonator.

The band-pass filter 1 includes the shield 6. The shield 6 has the function of preventing electromagnetic radiation to the surroundings of the band-pass filter 1. In the present embodiment, the shield 6 and the dielectric inside the shield 6 constitute a structure similar to a waveguide, thereby generating one or more waveguide modes. The one or more waveguide modes usually have resonance frequencies in a frequency region higher than the passband of the band-pass filter 1. If one of the waveguide modes that is the lowest in resonance frequency, i.e., the lowest-order waveguide mode, has a resonance frequency relatively close to the passband of the band-pass filter 1, there occurs the problem that the attenuation characteristic in the frequency region above the passband deteriorates due to unwanted resonance at the resonance frequency of the lowest-order waveguide mode.

The band-pass filter 1 according to the present embodiment prevents the occurrence of the foregoing problem by the provision of the partition 7. A detailed description thereof will be given below. Assuming that there is no partition 7, the resonance frequency of the lowest-order waveguide mode depends on the shape of the space defined by the shield 6. Typically, the larger the space, the lower the resonance frequency of the lowest-order waveguide mode.

In the present embodiment, the partition 7 extends in a direction (Z direction) intersecting the longitudinal direction (Y direction) of each of the resonator conductor portions 520 and 530 such that at least part of the partition 7 passes through between the resonator conductor portions 520 and 530, and is in contact with the first portion 61 and the second portion 62 of the shield 6. In the present embodiment, the partition 7 divides the space defined by the shield 6 into a space in which the resonator conductor portion 520 is located and a space in which the resonator conductor portion 530 is located.

In the present embodiment, the resonance frequency of the lowest-order waveguide mode depends on the shape of each of the two spaces divided by the partition 7. Each of the two spaces is smaller than the space defined by the shield 6 when there is assumed to be no partition 7. The present invention thus makes the resonance frequency of the lowest-order waveguide mode higher than in the case without the partition 7.

In the present embodiment, the four resonators 51, 52, 53, and 54 each operate as a quarter-wave resonator. Thus, in the present embodiment, the resonator conductor portions 510, 520, 530, and 540 constituting the resonators 51, 52, 53, and 54 can each have a smaller length than in the case where four resonators including one or more half-wave resonators are used to form a band-pass filter. As a result, the space defined by the shield 6 can be made smaller. According to the present embodiment, this also contributes to making the resonance frequency of the lowest-mode waveguide mode higher.

In the present embodiment, the resonance frequency of the lowest-order harmonic resonance mode in each of the resonator conductor portions 510, 520, 530 and 540 is three times the basic resonance frequency. The present invention thus provides a higher resonance frequency of the lowest-order harmonic resonance mode. In the case of half-wave resonators, the resonance frequency of the lowest-order harmonic resonance mode is twice the basic resonance frequency.

Consequently, the band-pass filter 1 according to the present embodiment enables preventing the attenuation characteristic in the frequency region above the passband from being degraded by the lowest-order waveguide mode and the lowest-order harmonic resonance mode.

Figure 7:
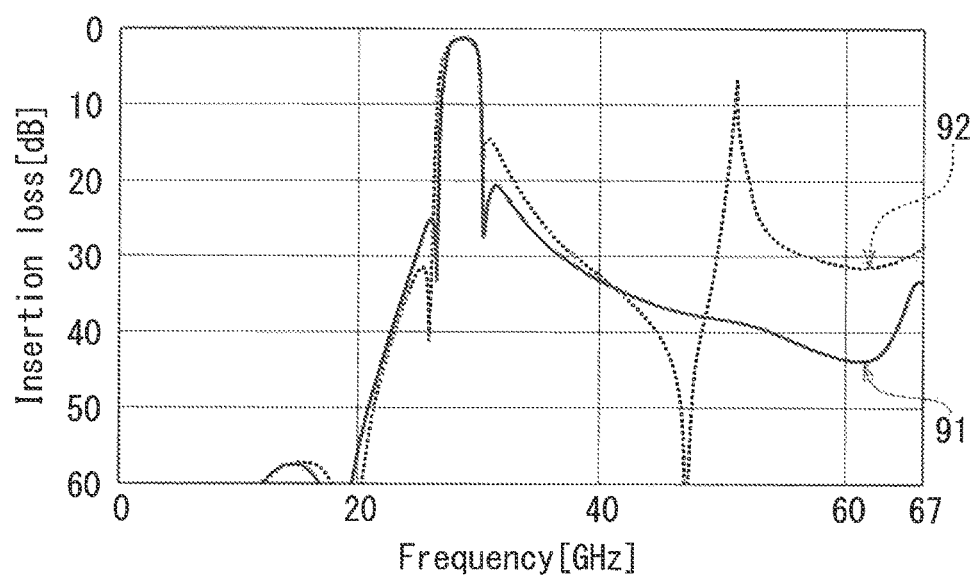
FIG. 7 is a characteristic diagram illustrating an example of the frequency characteristic of the insertion loss of each of the band-pass filter according to the first embodiment of the invention and a band-pass filter of a comparative example.

The effects of the band-pass filter 1 according to the present embodiment will be described in further detail below with reference to FIG. 7. FIG. 7 shows an example of the frequency characteristic of the insertion loss of each of the band-pass filter 1 according to the present embodiment and a band-pass filter of a comparative example. The characteristics shown in FIG. 7 were obtained by simulation. The band-pass filter of the comparative example is configured by removing the partition 7 from the band-pass filter 1 and adjusting the impedance to have a similar characteristic to that of the band-pass filter 1 in the passband. In FIG. 7, the horizontal axis represents frequency, and the vertical axis represents insertion loss. In FIG. 7, the line designated by the reference numeral 91 represents the characteristic of the band-pass filter 1. The line designated by the reference numeral 92 represents the characteristic of the band-pass filter of the comparative example. In the example shown in FIG. 7, the passbands of the band-pass filter 1 and the band-pass filter of the comparative example have a center frequency in the range of approximately 28 to 29 GHz. A passband refers to, for example, a frequency band between two frequencies at which the insertion loss is higher by 3 dB than the minimum value of the insertion loss.

As shown in FIG. 7, the characteristic 92 of the band-pass filter of the comparative example has a peak, at approximately 51 GHz, where the insertion loss is extremely small. This is considered to be due to unwanted resonance caused by the lowest-order waveguide mode at approximately 51 GHz. Due to the presence of the aforementioned peak, the characteristic 92 shows a deterioration in the attenuation characteristic in the frequency region above the passband. In contrast, the characteristic 91 of the band-pass filter 1 shows no such peak as that occurring in the characteristic 92, thus exhibiting better attenuation characteristic in the frequency region above the passband, compared to that of the characteristic 92.

A band-pass filter that is formed using a plurality of half-wave resonators may exhibit an extreme drop in the insertion loss at and near a frequency twice the center frequency of the passband due to the lowest-order harmonic resonance mode. On the other hand, the characteristic 91 of the band-pass filter 1 shows no extreme drop in the insertion loss at and near the frequency twice the center frequency of the passband.

It can be seen from FIG. 7 that the band-pass filter 1 according to the present embodiment is capable of preventing the attenuation characteristic in the frequency region above the passband from being degraded by the lowest-order waveguide mode and the lowest-order harmonic resonance mode.

Second Embodiment

Figure 8:
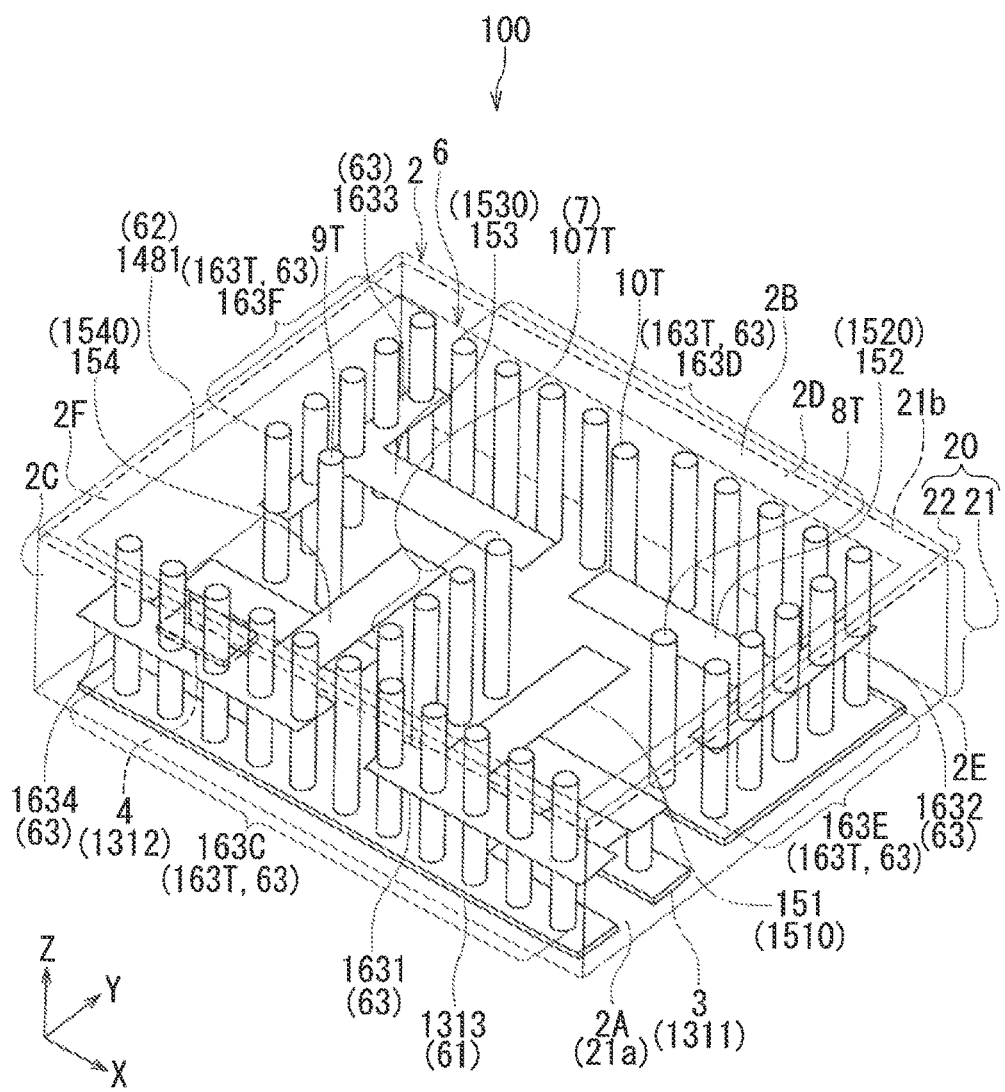
FIG. 8 is a perspective view illustrating the structure of a band-pass filter according to a second embodiment of the invention.
Figure 9:
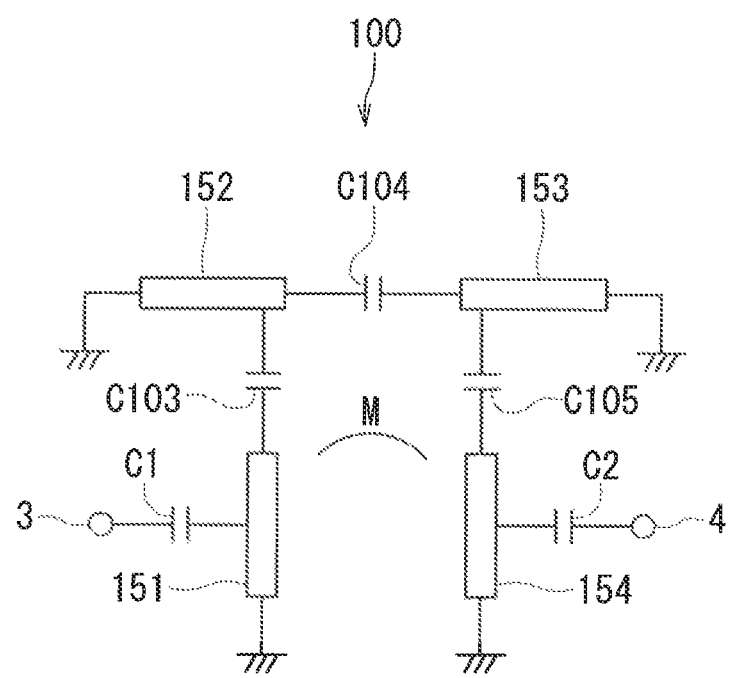
FIG. 9 is a circuit diagram illustrating the circuit configuration of the band-pass filter according to the second embodiment of the invention.

A second embodiment of the present invention will now be described. First, the configuration of a band-pass filter according to the present embodiment will be described with reference to FIG. 8 and FIG. 9. FIG. 8 is a perspective view illustrating the structure of the band-pass filter according to the present embodiment. FIG. 9 is a circuit diagram illustrating the circuit configuration of the band-pass filter according to the present embodiment.

The band-pass filter 100 according to the present embodiment includes the main body 2, the first input/output port 3 and the second input/output port 4, a plurality of resonators, the shield 6, the partition 7, the through hole lines 8T and 9T, and the capacitors C1 and C2. The main body 2 includes the multilayer structure 20.

In the present embodiment, the plurality of resonators include a first-stage resonator 151, a second-stage resonator 152, a third-stage resonator 153, and a fourth-stage resonator 154 which are arranged in this order from the first-input/output-port-3 side in circuit configuration, instead of the resonators 51, 52, 53 and 54 of the first embodiment. The resonators 151 to 154 are configured so that two resonators adjacent to each other in circuit configuration are electromagnetically coupled to each other. Specifically, the resonators 151 to 154 are configured so that: the resonators 151 and 152 are adjacent to each other in circuit configuration and are electromagnetically coupled to each other; the resonators 152 and 153 are adjacent to each other in circuit configuration and are electromagnetically coupled to each other; and the resonators 153 and 154 are adjacent to each other in circuit configuration and are electromagnetically coupled to each other. The first portion 61, the second portion 62 and the connecting portion 63 of the shield 6 are arranged to surround the four resonators 151 to 154.

In the present embodiment, the first portion 61 is formed of a first conductor layer 1313 disposed on the first end face 21a of the main portion 21 of the multilayer structure 20. The second portion 62 is formed of a second conductor layer 1481 disposed on the second end face 21b of the main portion 21 of the multilayer structure 20.

The resonator 151 includes a resonator conductor portion 1510 formed of a conductor. The resonator 152 includes a resonator conductor portion 1520 formed of a conductor. The resonator 153 includes a resonator conductor portion 1530 formed of a conductor. The resonator 154 includes a resonator conductor portion 1540 formed of a conductor.

Each of the resonator conductor portions 1510, 1520, 1530 and 1540 is shaped to be elongated in a direction intersecting the first direction or the Z direction, and has a first end and a second end opposite to each other in the longitudinal direction of the resonator conductor portion. In the present embodiment, in particular, each of the resonator conductor portions 1510, 1520, 1530 and 1540 is shaped to be elongated in a direction orthogonal to the first direction or the Z direction. To be more specific, the resonator conductor portion 1510 and the resonator conductor portion 1540 are shaped to be elongated in the Y direction, whereas the resonator conductor portion 1520 and the resonator conductor portion 1530 are shaped to be elongated in the X direction.

The first end of each of the resonator conductor portions 1510, 1520, 1530 and 1540 is connected to the ground. The second end of each of the resonator conductor portions 1510, 1520, 1530 and 1540 is open.

Each of the resonator conductor portions 1510, 1520, 1530 and 1540 has a length smaller than or equal to ¼ a wavelength corresponding to the center frequency of the passband of the band-pass filter 100. In the present embodiment, in particular, the length of each of the resonator conductor portions 1510, 1520, 1530 and 1540 is ¼ the wavelength corresponding to the center frequency of the passband of the band-pass filter 100.

In the present embodiment, the first-stage resonator 151 corresponds to the first resonator of the present invention, and the fourth-stage resonator 154 corresponds to the second resonator of the present invention. The resonator conductor portion 1510 corresponds to the first resonator conductor portion of the present invention, and the resonator conductor portion 1540 corresponds to the second resonator conductor portion of the present invention. Each of the resonator conductor portions 1520 and 1530 corresponds to the third resonator conductor portion of the present invention.

In the present embodiment, the partition 7 extends in a direction (the Z direction) intersecting the longitudinal direction (the Y direction) of each of the resonator conductor portions 1510 and 1540 such that at least part of the partition 7 passes through between the resonator conductor portions 1510 and 1540, and is in contact with the first portion 61 and the second portion 62. The partition 7 includes a plurality of first through hole lines 107T instead of the plurality of first through hole lines 7T of the first embodiment, each of the first through hole lines 107T running through the two or more dielectric layers constituting the main portion 21. In FIG. 8, each through hole line 107T is represented by a circular column. Each of the plurality of first through hole lines 107T includes two or more through holes connected in series. Each of the plurality of first through hole lines 107T extends in the Z direction. The plurality of first through hole lines 107T are arranged to be adjacent to each other in the Y direction. In the present embodiment, the number of the first through hole lines 107T is four.

In the present embodiment, the connecting portion 63 of the shield 6 includes a plurality of second through hole lines 163T instead of the plurality of second through hole lines 63T of the first embodiment, each of the second through hole lines 163T running through the two or more dielectric layers constituting the main portion 21. In FIG. 8, each through hole line 163T is represented by a circular column. Each of the plurality of second through hole lines 163T includes two or more through holes connected in series. Each of the plurality of second through hole lines 163T extends in the Z direction.

The plurality of second through hole lines 163T include a plurality of through hole lines 163C, a plurality of through hole lines 163D, a plurality of through hole lines 163E, and a plurality of through hole lines 163F. The plurality of through hole lines 163C are located near the side surface 2C of the main body 2 and arranged to be adjacent to each other in the X direction. The plurality of through hole lines 163D are located near the side surface 2D of the main body 2 and arranged to be adjacent to each other in the X direction. The plurality of through hole lines 163E are located near the side surface 2E of the main body 2 and arranged to be adjacent to each other in the Y direction. The plurality of through hole lines 163F are located near the side surface 2F of the main body 2 and arranged to be adjacent to each other in the Y direction.

The connecting portion 63 of the shield 6 includes four shield conductor portions 1631, 1632, 1633 and 1634, instead of the shield conductor portions 631, 632 and 633 of the first embodiment. The shield conductor portion 1631 is connected to some of the plurality of through hole lines 163C. The shield conductor portion 1632 is connected to the plurality of through hole lines 163E. The shield conductor portion 1633 is connected to the plurality of through hole lines 163F. The shield conductor portion 1634 is connected to other some of the plurality of through hole lines 163C.

In the present embodiment, as shown in FIG. 8, the through hole line 8T is located near the resonator conductor portion 1510 and the resonator conductor portion 1520. The through hole line 9T is located near the resonator conductor portion 1530 and the resonator conductor portion 1540.

The band-pass filter 100 according to the present embodiment further includes a through hole line 10T provided within the main body 2. The through hole line 10T runs through the two or more dielectric layers constituting the main portion 21, extends in the Z direction and is in contact with the first portion 61 and the second portion 62. The through hole line 10T includes two or more through holes connected in series. The through hole line 10T is located near the resonator conductor portion 1520 and the resonator conductor portion 1530. The through hole line 10T has the function of assisting the function of the shield 6.

In the present embodiment, as shown in FIG. 9, the capacitor C1 is provided between the first input/output port 3 and the first-stage resonator 151. The capacitor C2 is provided between the second input/output port 4 and the fourth-stage resonator 154.

In FIG. 9, the capacitor symbol C103 represents capacitive coupling between the resonators 151 and 152. The capacitor symbol C104 represents capacitive coupling between the resonators 152 and 153. The capacitor symbol C105 represents capacitive coupling between the resonators 153 and 154. The curve labeled M represents magnetic coupling between the resonators 151 and 154. Since the resonator conductor portion 1510 and the resonator conductor portion 1540 are formed of different conductor layers, the magnetic coupling between the resonators 151 and 154 is lower than the magnetic coupling between the resonators 52 and 53 in the first embodiment.

Reference is now made to FIG. 10A to FIG. 13 to describe an example of the dielectric layers constituting the multilayer structure 20 of the present embodiment and the configuration of a plurality of conductor layers and through holes formed in the dielectric layers. In this example, the multilayer structure 20 includes eighteen dielectric layers stacked on each other. The eighteen dielectric layers will be referred to as the first to eighteenth dielectric layers in the order from bottom to top. In the present embodiment, the main portion 21 is composed of the first to seventeenth dielectric layers. The coating portion 22 is composed of the eighteenth dielectric layer.

Figure 10A:
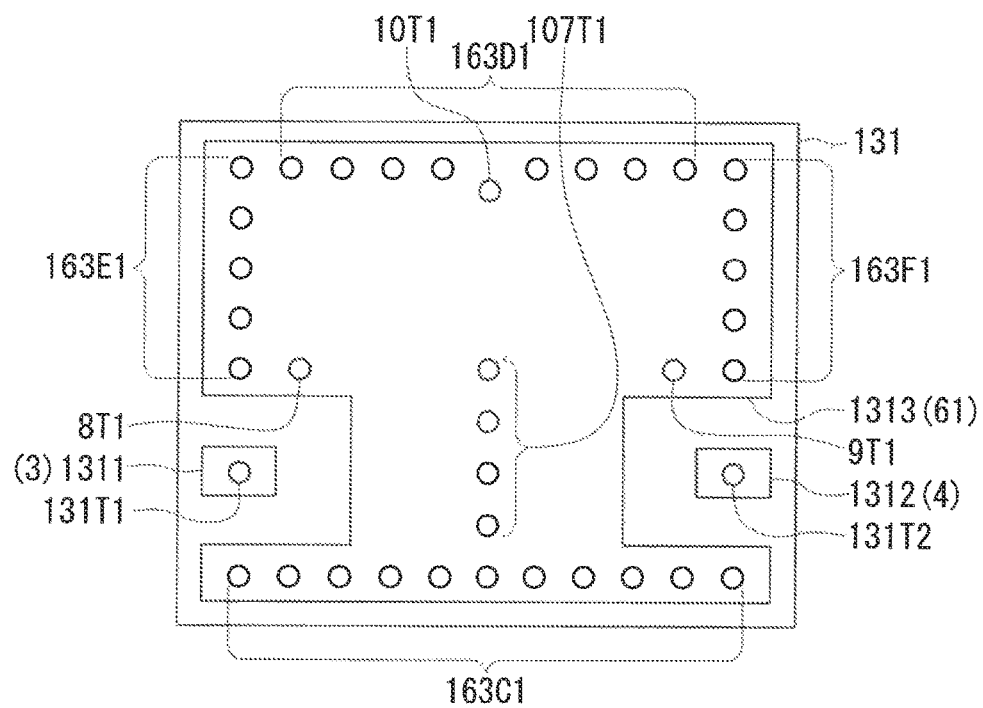
FIG. 10A is an explanatory diagram illustrating a patterned surface of a first dielectric layer of the band-pass filter of FIG. 8.
Figure 10B:
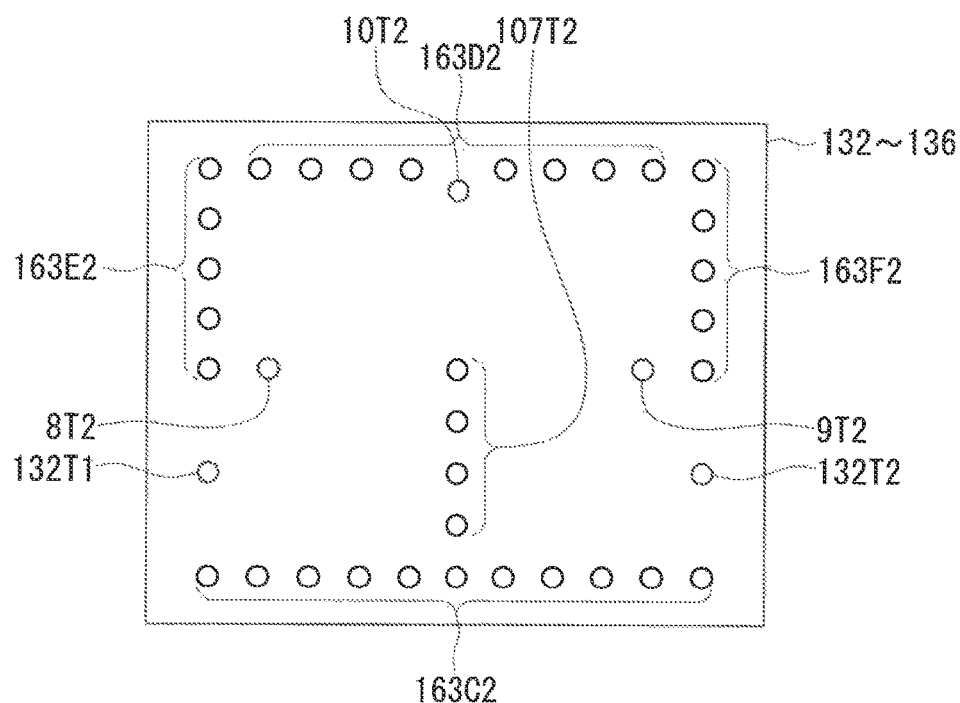
FIG. 10B is an explanatory diagram illustrating a patterned surface of each of a second to a sixth dielectric layer of the band-pass filter of FIG. 8.
Figure 11A:
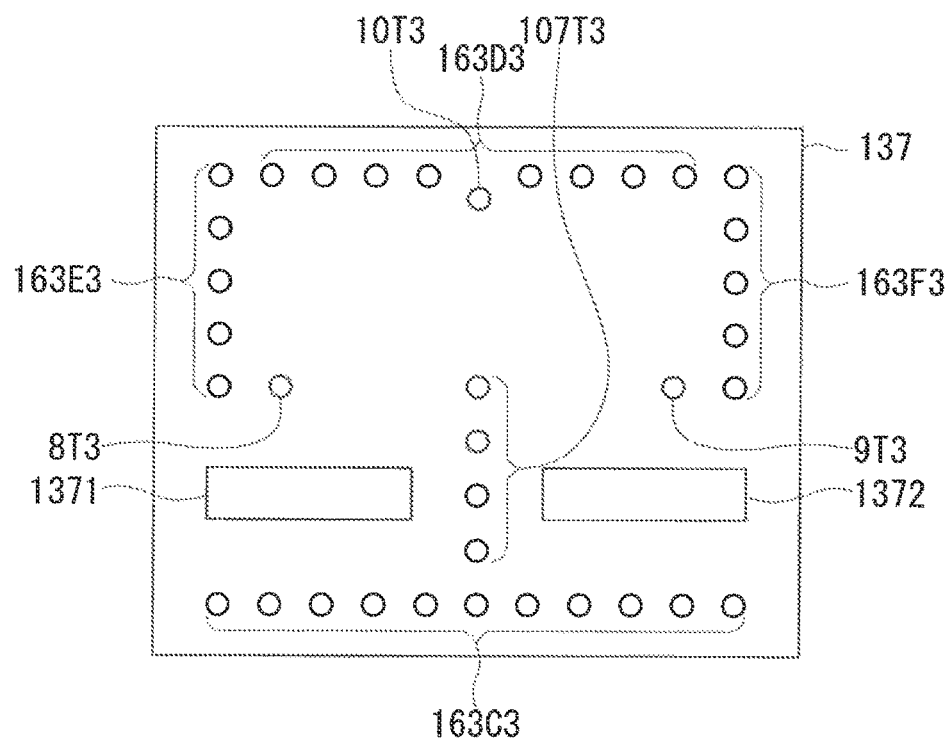
FIG. 11A is an explanatory diagram illustrating a patterned surface of a seventh dielectric layer of the band-pass filter of FIG. 8.
Figure 11B:
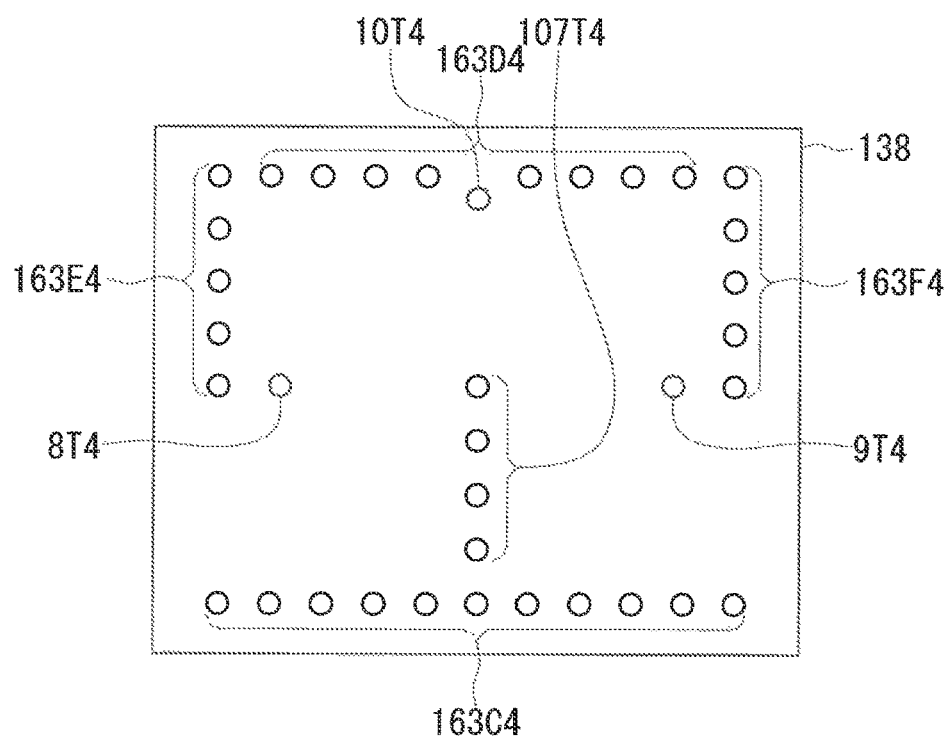
FIG. 11B is an explanatory diagram illustrating a patterned surface of an eighth dielectric layer of the band-pass filter of FIG. 8.
Figure 12A:
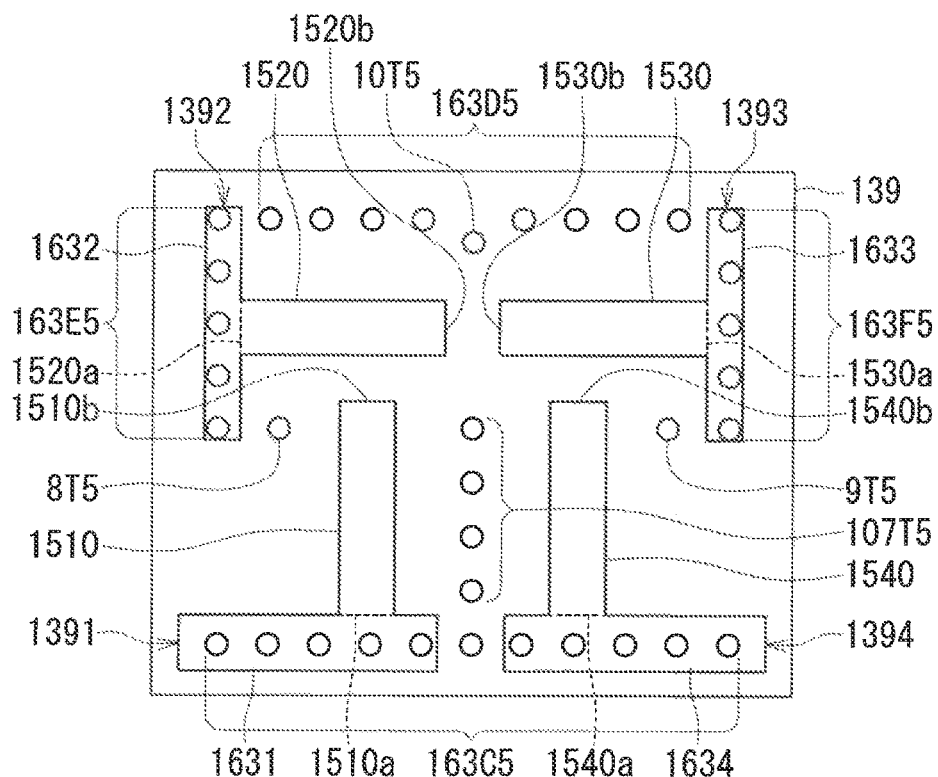
FIG. 12A is an explanatory diagram illustrating a patterned surface of a ninth dielectric layer of the band-pass filter of FIG. 8.
Figure 12B:
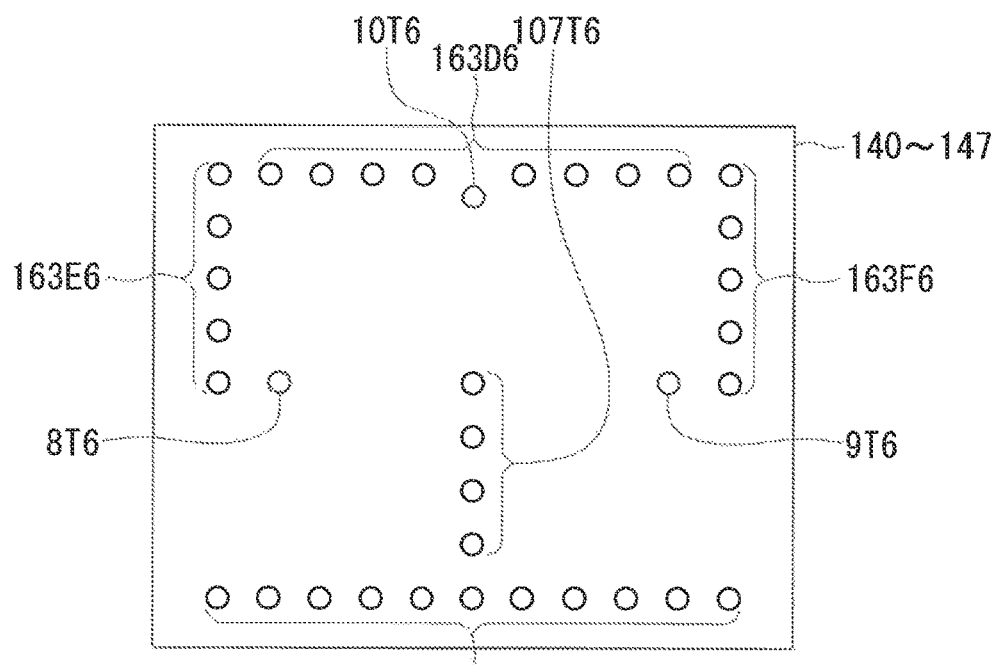
FIG. 12B is an explanatory diagram illustrating a patterned surface of each of a tenth to a seventeenth dielectric layer of the band-pass filter of FIG. 8.
Figure 13:
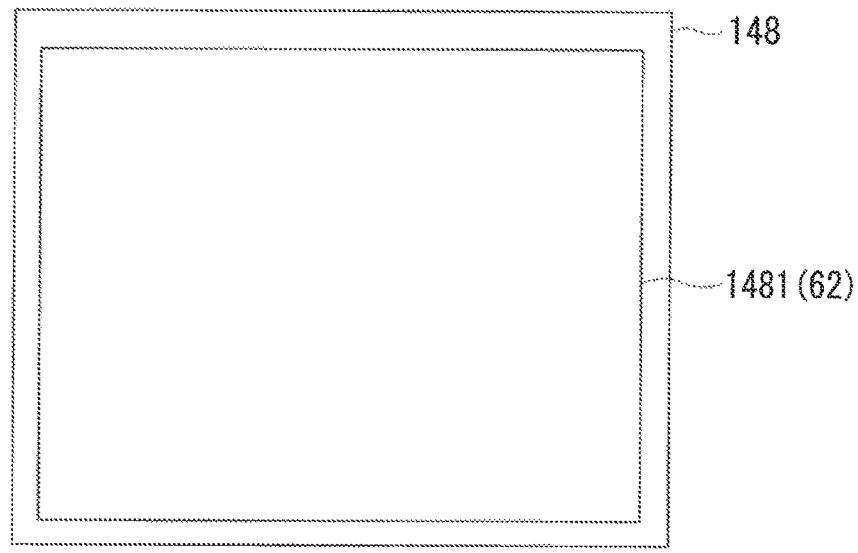
FIG. 13 is an explanatory diagram illustrating a patterned surface of an eighteenth dielectric layer of the band-pass filter of FIG. 8.

FIG. 10A illustrates a patterned surface of the first dielectric layer, and FIG. 10B illustrates a patterned surface of each of the second to the sixth dielectric layer. FIG. 11A illustrates a patterned surface of the seventh dielectric layer, and FIG. 11B illustrates a patterned surface of the eighth dielectric layer. FIG. 12A illustrates a patterned surface of the ninth dielectric layer, and FIG. 12B illustrates a patterned surface of each of the tenth to the seventeenth dielectric layer. FIG. 13 illustrates a patterned surface of the eighteenth dielectric layer. The first to the eighteenth dielectric layer are denoted by reference numerals 131 to 148.

On the patterned surface of the first dielectric layer 131, as shown in FIG. 10A, there are formed a conductor layer 1311 forming the first input/output port 3, a conductor layer 1312 forming the second input/output port 4, and the first conductor layer 1313 forming the first portion 61 of the shield 6.

Further, formed in the dielectric layer 131 are a through hole 131T1 connected to the conductor layer 1311, a through hole 131T2 connected to the conductor layer 1312, a through hole 8T1 constituting part of the through hole line 8T, a through hole 9T1 constituting part of the through hole line 9T, and a through hole 10T1 constituting part of the through hole line 10T. Further, four through holes 107T1 constituting respective portions of the four first through hole lines 107T are formed in the dielectric layer 131.

Further, formed in the dielectric layer 131 are a plurality of through holes 163C1 constituting respective portions of the plurality of through hole lines 163C, a plurality of through holes 163D1 constituting respective portions of the plurality of through hole lines 163D, a plurality of through holes 163E1 constituting respective portions of the plurality of through hole lines 163E, and a plurality of through holes 163F1 constituting respective portions of the plurality of through hole lines 163F.

The through holes 8T1, 9T1, 10T1, 107T1, 163C1, 163D1, 163E1, and 163F1 are connected to the first conductor layer 1313.

As shown in FIG. 10B, through holes 132T1, 132T2, 8T2, 9T2 and 10T2 are formed in each of the second to the sixth dielectric layer 132 to 136. The through holes 131T1, 131T2, 8T1, 9T1 and 10T1 shown in FIG. 10A are respectively connected to the through holes 132T1, 132T2, 8T2, 9T2 and 10T2 formed in the second dielectric layer 132.

Further, four through holes 107T2 are formed in each of the second to the sixth dielectric layers 132 to 136. The four through holes 107T1 shown in FIG. 10A are respectively connected to the four through holes 107T2 formed in the second dielectric layer 132.

In each of the second to the sixth dielectric layer 132 to 136, further formed are a plurality of through holes 163C2, a plurality of through holes 163D2, a plurality of through holes 163E2, and a plurality of through holes 163F2. The plurality of through holes 163C1 shown in FIG. 10A are connected to the plurality of through holes 163C2 formed in the second dielectric layer 132. The plurality of through holes 163D1 shown in FIG. 10A are connected to the plurality of through holes 163D2 formed in the second dielectric layer 132. The plurality of through holes 163E1 shown in FIG. 10A are connected to the plurality of through holes 163E2 formed in the second dielectric layer 132. The plurality of through holes 163F1 shown in FIG. 10A are connected to the plurality of through holes 163F2 formed in the second dielectric layer 132.

In the dielectric layers 132 to 136, every vertically adjacent through holes denoted by the same reference signs are connected to each other.

On the patterned surface of the seventh dielectric layer 137, as shown in FIG. 11A, there are formed a conductor layer 1371 for forming the capacitor C1, and a conductor layer 1372 for forming the capacitor C2. The through holes 132T1 and 132T2 formed in the sixth dielectric layer 136 (see FIG. 10B) are connected to the conductor layers 1371 and 1372, respectively.

Through holes 8T3, 9T3 and 10T3 are formed in the dielectric layer 137. The through holes 8T2, 9T2 and 10T2 formed in the sixth dielectric layer 136 are connected to the through holes 8T3, 9T3 and 10T3, respectively.

Further, four through holes 107T3 are formed in the dielectric layer 137. The four through holes 107T2 formed in the sixth dielectric layer 136 are connected to the four through holes 107T3, respectively.

Further formed in the dielectric layer 137 are a plurality of through holes 163C3, a plurality of through holes 163D3, a plurality of through holes 163E3, and a plurality of through holes 163F3. The plurality of through holes 163C2 formed in the sixth dielectric layer 136 are connected to the plurality of through holes 163C3. The plurality of through holes 163D2 formed in the sixth dielectric layer 136 are connected to the plurality of through holes 163D3. The plurality of through holes 163E2 formed in the sixth dielectric layer 136 are connected to the plurality of through holes 163E3. The plurality of through holes 163F2 formed in the sixth dielectric layer 136 are connected to the plurality of through holes 163F3.

As shown in FIG. 11B, through holes 8T4, 9T4 and 10T4 are formed in the eighth dielectric layer 138. The through holes 8T3, 9T3 and 10T3 shown in FIG. 11A are connected to the through holes 8T4, 9T4 and 10T4, respectively.

Four through holes 107T4 are further formed in the dielectric layer 138. The four through holes 107T3 shown in FIG. 11A are connected to the four through holes 107T4.

Further formed in the dielectric layer 138 are a plurality of through holes 163C4, a plurality of through holes 163D4, a plurality of through holes 163E4, and a plurality of through holes 163F4. The plurality of through holes 163C3 shown in FIG. 11A are connected to the plurality of through holes 163C4. The plurality of through holes 163D3 shown in FIG. 11A are connected to the plurality of through holes 163D4. The plurality of through holes 163E3 shown in FIG. 11A are connected to the plurality of through holes 163E4. The plurality of through holes 163F3 shown in FIG. 11A are connected to the plurality of through holes 163F4.

As shown in FIG. 12A, four conductor layers 1391, 1392, 1393 and 1394 are formed on the patterned surface of the ninth dielectric layer 139. The conductor layer 1391 includes the resonator conductor portion 1510 and the shield conductor portion 1631. The conductor layer 1392 includes the resonator conductor portion 1520 and the shield conductor portion 1632. The conductor layer 1393 includes the resonator conductor portion 1530 and the shield conductor portion 1633. The conductor layer 1394 includes the resonator conductor portion 1540 and the shield conductor portion 1634. In FIG. 12A the boundary between the resonator conductor portion 1510 and the shield conductor portion 1631, the boundary between the resonator conductor portion 1520 and the shield conductor portion 1632, the boundary between the resonator conductor portion 1530 and the shield conductor portion 1633, and the boundary between the resonator conductor portion 1540 and the shield conductor portion 1634 are indicated by broken lines.

The resonator conductor portion 1510 has a first end 1510a and a second end 1510b opposite to each other in the longitudinal direction, i.e., the Y direction. The first end 1510a is connected to the shield conductor portion 1631 and thereby connected to the ground. The second end 1510b is open.

The resonator conductor portion 1520 has a first end 1520a and a second end 1520b opposite to each other in the longitudinal direction, i.e., the X direction. The first end 1520a is connected to the shield conductor portion 1632 and thereby connected to the ground. The second end 1520b is open.

The resonator conductor portion 1530 has a first end 1530a and a second end 1530b opposite to each other in the longitudinal direction, i.e., the X direction. The first end 1530a is connected to the shield conductor portion 1633 and thereby connected to the ground. The second end 1530b is open.

The resonator conductor portion 1540 has a first end 1540a and a second end 1540b opposite to each other in the longitudinal direction, i.e., the Y direction. The first end 1540a is connected to the shield conductor portion 1641 and thereby connected to the ground. The second end 1540b is open.

Through holes 8T5, 9T5 and 10T5 are formed in the ninth dielectric layer 139 shown in FIG. 12A. The through holes 8T4, 9T4 and 10T4 shown in FIG. 11B are connected to the through holes 8T5, 9T5 and 10T5, respectively.

Four through holes 107T5 are further formed in the dielectric layer 139. The four through holes 107T4 shown in FIG. 11B are connected to the four through holes 107T5.

Further formed in the dielectric layer 139 are a plurality of through holes 163C5, a plurality of through holes 163D5, a plurality of through holes 163E5, and a plurality of through holes 163F5.

Some of the plurality of through holes 163C5 are connected to the shield conductor portion 1631. Other some of the plurality of through holes 163C5 are connected to the shield conductor portion 1634. The plurality of through holes 163C4 shown in FIG. 11B are connected to the plurality of through holes 163C5.

The plurality of through holes 163D4 shown in FIG. 11B are connected to the plurality of through holes 163D5.

The plurality of through holes 163E5 are connected to the shield conductor portion 1632. The plurality of through holes 163E4 shown in FIG. 11B are connected to the plurality of through holes 163E5.

The plurality of through holes 163F5 are connected to the shield conductor portion 1633. The plurality of through holes 163F4 shown in FIG. 11B are connected to the plurality of through holes 163F5.

As shown in FIG. 12B, through holes 8T6, 9T6 and 10T6 are formed in each of the tenth to the seventeenth dielectric layer 140 to 147. The through holes 8T5, 9T5 and 10T5 shown in FIG. 12A are respectively connected to the through holes 8T6, 9T6 and 10T6 formed in the tenth dielectric layer 140.

Four through holes 107T6 are further formed in each of the tenth to the seventeenth dielectric layer 140 to 147. The four through holes 107T5 shown in FIG. 12A are connected to the four through holes 107T6 formed in the tenth dielectric layer 140.

In each of the tenth to the seventeenth dielectric layer 140 to 147, further formed are a plurality of through holes 163C6, a plurality of through holes 163D6, a plurality of through holes 163E6, and a plurality of through holes 163F6. The plurality of through holes 163C5 shown in FIG. 12A are connected to the plurality of through holes 163C6 formed in the tenth dielectric layer 140. The plurality of through holes 163D5 shown in FIG. 12A are connected to the plurality of through holes 163D6 formed in the tenth dielectric layer 140. The plurality of through holes 163E5 shown in FIG. 12A are connected to the plurality of through holes 163E6 formed in the tenth dielectric layer 140. The plurality of through holes 163F5 shown in FIG. 12A are connected to the plurality of through holes 163F6 formed in the tenth dielectric layer 140.

In the dielectric layers 140 to 147, every vertically adjacent through holes denoted by the same reference signs are connected to each other.

As shown in FIG. 13, the second conductor layer 1481 forming the second portion 62 of the shield 6 is formed on the patterned surface of the eighteenth dielectric layer 148. The through holes 8T6, 9T6, 10T6, 107T6, 163C6, 163D6, 163E6 and 163F6 formed in the seventeenth dielectric layer 147 (see FIG. 12B) are connected to the second conductor layer 1481.

The band-pass filter 100 according to the present embodiment is formed by stacking the first to the eighteenth dielectric layer 131 to 148 such that the patterned surface of the first dielectric layer 131 also serves as the first end face 2A of the main body 2. A surface of the eighteenth dielectric layer 148 opposite to the patterned surface serves as the second end face 2B of the main body 2. The first to the eighteenth dielectric layer 131 to 148 constitute the multilayer structure 20.

The resonator conductor portions 1510, 1520, 1530 and 1540 are located at the same position in the multilayer structure 20 in the first direction, i.e., the Z direction. The conductor layer 1311 forming the first input/output port 3 is connected to the conductor layer 1371 shown in FIG. 11A via the through holes 131T1 and 132T1. The conductor layer 1371 is opposed to the resonator conductor portion 1510 shown in FIG. 12A with the dielectric layers 137 and 138 interposed therebetween. The capacitor C1 shown in FIG. 9 is composed of the conductor layer 1371 and the resonator conductor portion 1510, and the dielectric layers 137 and 138 interposed therebetween.

The conductor layer 1312 forming the second input/output port 4 is connected to the conductor layer 1372 shown in FIG. 11A via the through holes 131T2 and 132T2. The conductor layer 1372 is opposed to the resonator conductor portion 1540 shown in FIG. 12A with the dielectric layers 137 and 138 interposed therebetween. The capacitor C2 shown in FIG. 9 is composed of the conductor layer 1372 and the resonator conductor portion 1540, and the dielectric layers 137 and 138 interposed therebetween.

The plurality of through hole lines 107T of the partition 7 are formed by connecting the plurality of through holes 107T1, 107T2, 107T3, 107T4, 107T5 and 107T6 in series in the Z direction.

The through hole line 8T is formed by connecting the plurality of through holes 8T1, 8T2, 8T3, 8T4, 8T5 and 8T6 in series in the Z direction. The through hole line 9T is formed by connecting the plurality of through holes 9T1, 9T2, 9T3, 9T4, 9T5 and 9T6 in series in the Z direction. The through hole line 10T is formed by connecting the plurality of through holes 10T1, 10T2, 10T3, 10T4, 10T5 and 10T6 in series in the Z direction.

The plurality of through hole lines 163C are formed by connecting the plurality of through holes 163C1, 163C2, 163C3, 163C4, 163C5 and 163C6 in series in the Z direction. The plurality of through hole lines 163D are formed by connecting the plurality of through holes 163D1, 163D2, 163D3, 163D4, 163D5 and 163D6 in series in the Z direction. The plurality of through hole lines 163E are formed by connecting the plurality of through holes 163E1, 163E2, 163E3, 163E4, 163E5 and 163E6 in series in the Z direction. The plurality of through hole lines 163F are formed by connecting the plurality of through holes 163F1, 163F2, 163F3, 163F4, 163F5 and 163F6 in series in the Z direction.

The band-pass filter 100 according to the present embodiment includes the resonators 151, 152, 153, and 154 which are provided between the first input/output port 3 and the second input/output port 4 and arranged in the listed order from the first-input/output-port-3 side in circuit configuration. Every two resonators that are adjacent to each other in circuit configuration are configured to be electromagnetically coupled to each other.

The resonators 151, 152, 153 and 154 include the resonator conductor portions 1510, 1520, 1530 and 1540, respectively. Each of the resonator conductor portions 1510, 1520, 1530 and 1540 has a length of ¼ the wavelength corresponding to the center frequency of the passband of the band-pass filter 100. Each of the resonators 151, 152, 153 and 154 operates as a quarter-wave resonator.

In the present embodiment, the partition 7 extends in a direction intersecting the longitudinal direction of each of the resonator conductor portions 1510 and 1540 (the Y direction) such that at least part of the partition 7 passes through between the resonator conductor portions 1510 and 1540, and is in contact with the first portion 61 and the second portion 62. The resonator conductor portions 1510 and 1540 are respective components of the resonators 151 and 154 which are not adjacent to each other in circuit configuration.

Figure 14:
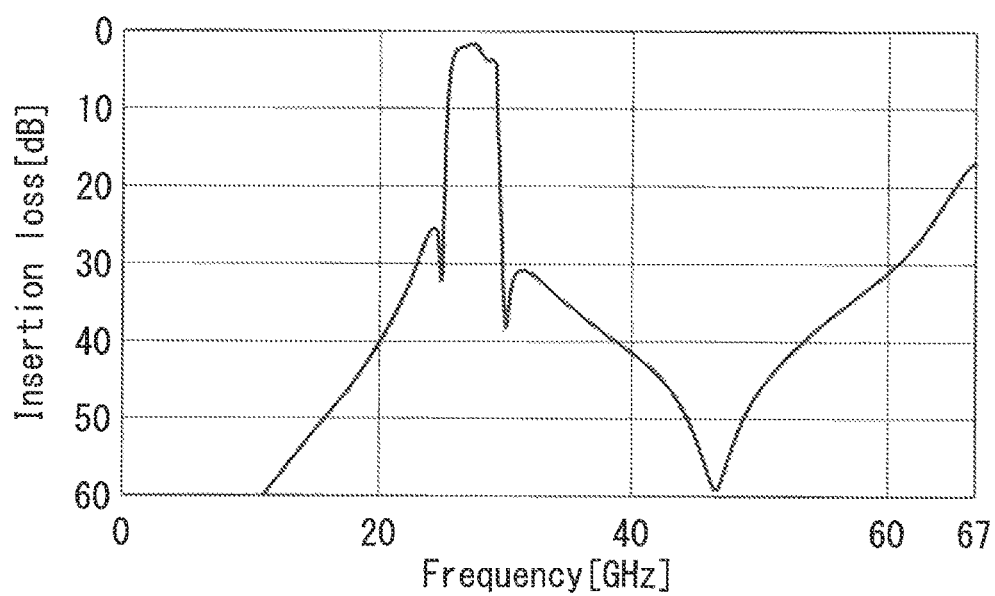
FIG. 14 is a characteristic diagram illustrating an example of the frequency characteristic of the insertion loss of the band-pass filter according to the second embodiment of the invention.

FIG. 14 shows an example of the frequency characteristic of the insertion loss of the band-pass filter 100 according to the present embodiment. The characteristic shown in FIG. 14 was obtained by simulation. In FIG. 14, the horizontal axis represents frequency, and the vertical axis represents insertion loss.

The other configuration, function, and effects of the present embodiment are the same as those of the first embodiment.

Third Embodiment

Figure 15:
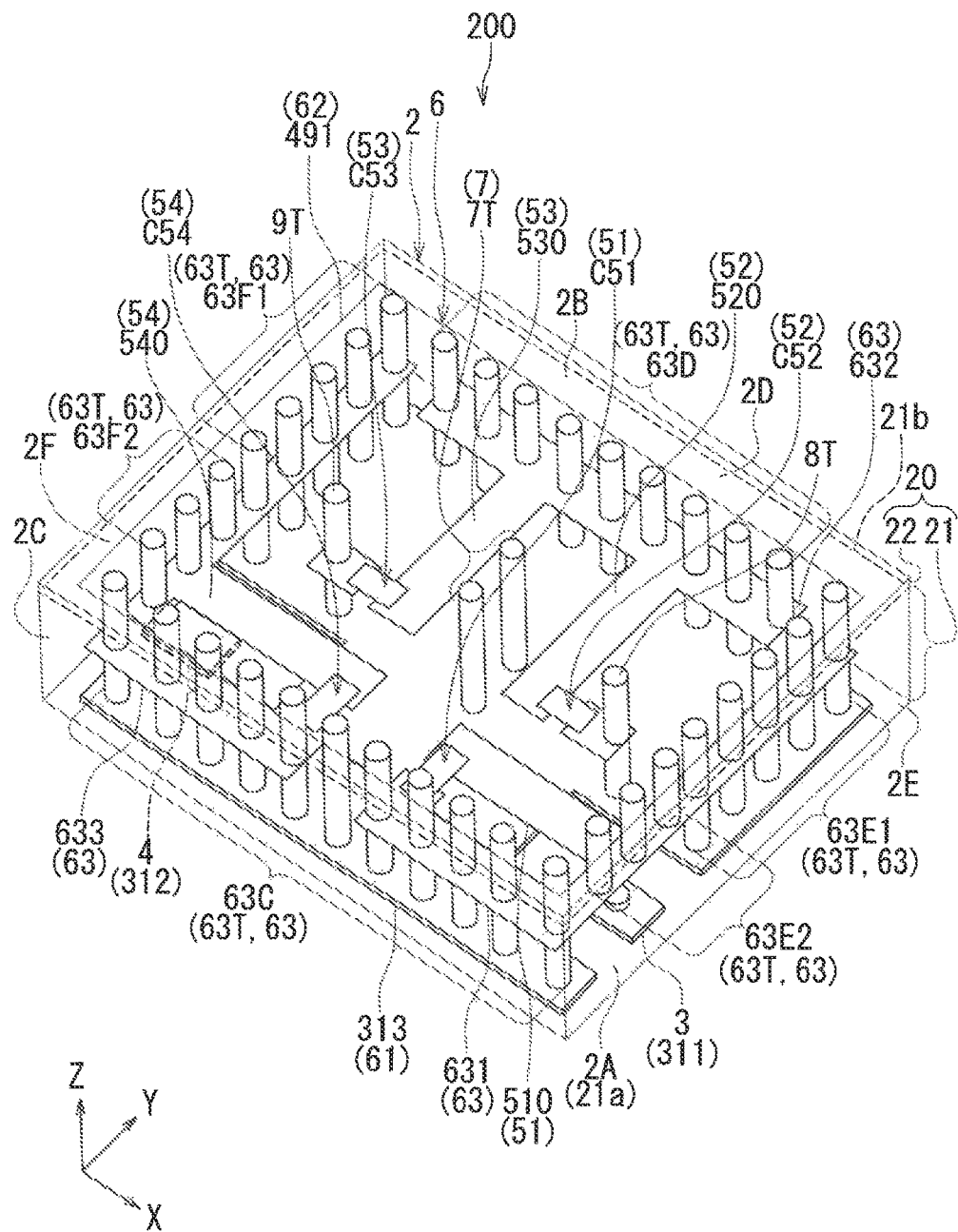
FIG. 15 is a perspective view illustrating the structure of a band-pass filter according to a third embodiment of the invention.
Figure 16:
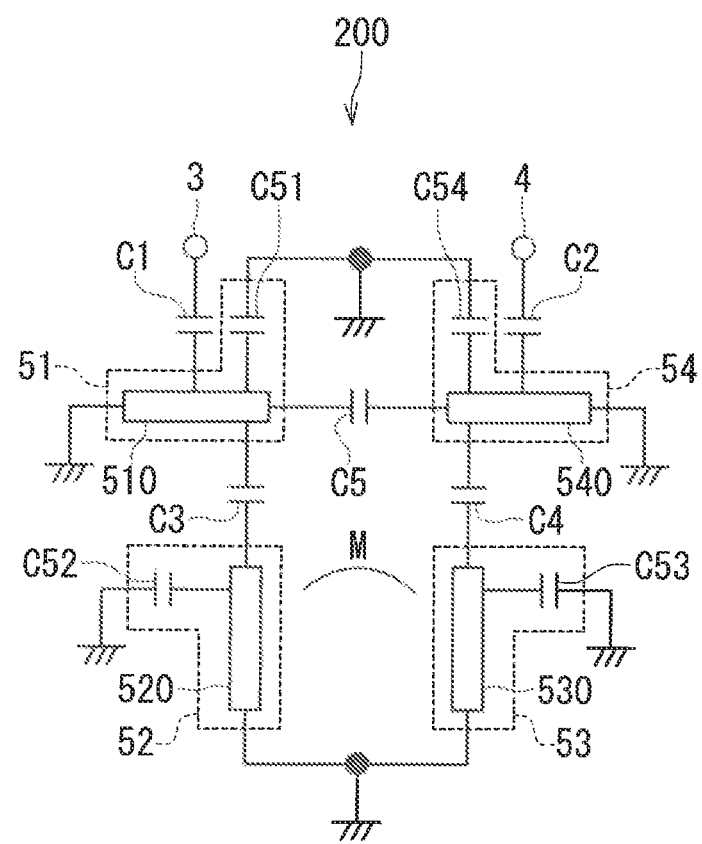
FIG. 16 is a circuit diagram illustrating the circuit configuration of the band-pass filter according to the third embodiment of the invention.

A third embodiment of the present invention will now be described. First, the configuration of a band-pass filter according to the present embodiment will be described with reference to FIG. 15 and FIG. 16. FIG. 15 is a perspective view illustrating the structure of the band-pass filter according to the present embodiment. FIG. 16 is a circuit diagram illustrating the circuit configuration of the band-pass filter according to the present embodiment.

The band-pass filter 200 according to the present embodiment includes the main body 2, the first input/output port 3 and the second input/output port 4, a plurality of resonators, the shield 6, the partition 7, the through hole lines 8T and 9T, and the capacitors C1 and C2. The main body 2 includes the multilayer structure 20. The plurality of resonators include resonators 51, 52, 53 and 54. The resonator 51 includes a resonator conductor portion 510. The resonator 52 includes a resonator conductor portion 520. The resonator 53 includes a resonator conductor portion 530. The resonator 54 includes a resonator conductor portion 540. Each of the resonator conductor portions 510, 520, 530 and 540 has a first end and a second end.

In the present embodiment, the resonator 51 further includes a capacitor C51 provided between the second end of the resonator conductor portion 510 and the ground. The resonator 52 further includes a capacitor C52 provided between the second end of the resonator conductor portion 520 and the ground. The resonator 53 further includes a capacitor C53 provided between the second end of the resonator conductor portion 530 and the ground. The resonator 54 further includes a capacitor C54 provided between the second end of the resonator conductor portion 540 and the ground.

In the present embodiment, each of the resonator conductor portions 510, 520, 530 and 540 has a length smaller than ¼ a wavelength corresponding to the center frequency of the passband of the band-pass filter 200.

In the present embodiment, the capacitor C52 corresponds to the first capacitor of the present invention, and the capacitor C53 corresponds to the second capacitor of the present invention.

Figure 17A:
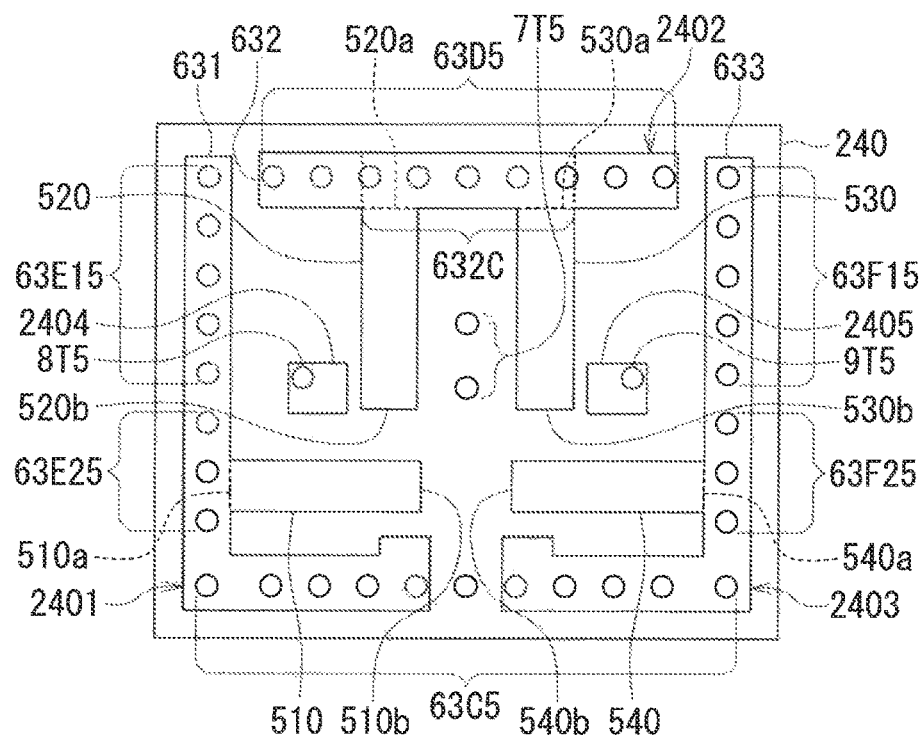
FIG. 17A is an explanatory diagram illustrating a patterned surface of a tenth dielectric layer of the band-pass filter of FIG. 15.
Figure 17B:
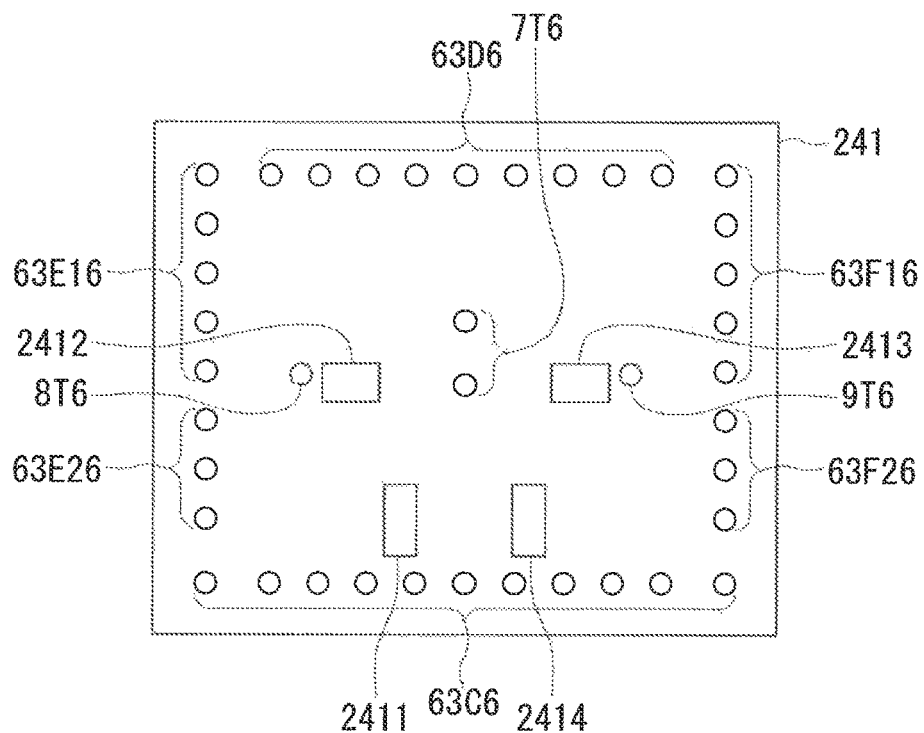
FIG. 17B is an explanatory diagram illustrating a patterned surface of an eleventh dielectric layer of the band-pass filter of FIG. 15.

Reference is now made to FIGS. 17A and 17B to describe an example of the dielectric layers constituting the multilayer structure 20 of the present embodiment and the configuration of a plurality of conductor layers and through holes formed in the dielectric layers. In the present embodiment, the multilayer structure 20 includes tenth and eleventh dielectric layers 240 and 241, instead of the tenth and eleventh dielectric layers 40 and 41 of the first embodiment. FIG. 17A illustrates a patterned surface of the tenth dielectric layer 240, and FIG. 17B illustrates a patterned surface of the eleventh dielectric layer 241.

As shown in FIG. 17A, five conductor layers 2401, 2402, 2403, 2404 and 2405 are formed on the patterned surface of the tenth dielectric layer 240. The conductor layer 2401 includes the resonator conductor portion 510 and the shield conductor portion 631. The conductor layer 2402 includes the resonator conductor portions 520 and 530 and the shield conductor portion 632. The conductor layer 2403 includes the resonator conductor portion 540 and the shield conductor portion 633. In FIG. 17A the boundary between the resonator conductor portion 510 and the shield conductor portion 631, the boundary between the resonator conductor portion 520 and the shield conductor portion 632, the boundary between the resonator conductor portion 530 and the shield conductor portion 632, and the boundary between the resonator conductor portion 540 and the shield conductor portion 633 are indicated by broken lines. The shapes of the resonator conductor portions 510, 520, 530 and 540 are the same as those in the first embodiment.

In the present embodiment, as shown in FIG. 17A, the resonator conductor portions 520 and 530 are formed of different portions of the single conductor layer 2402.

The shield conductor portion 632 of the conductor layer 2402 includes a connecting portion 632C connecting the first end 520a of the resonator conductor portion 520 and the first end 530a of the resonator conductor portion 530. In FIG. 17A, the two boundaries between the connecting portion 632C and the other portions of the shield conductor portion 632 are indicated by dotted lines.

Through holes 8T5 and 9T5 are formed in the tenth dielectric layer 240 shown in FIG. 17A. The through hole 8T5 is connected to the conductor layer 2404. The through hole 9T5 is connected to the conductor layer 2405. The through holes 8T4 and 9T4 of the first embodiment shown in FIG. 4B are connected to the through holes 8T5 and 9T5, respectively.

Further, two through holes 7T5 are formed in the dielectric layer 240. The two through holes 7T4 of the first embodiment shown in FIG. 4B are connected to the two through holes 7T5.

Further formed in the dielectric layer 240 are a plurality of through holes 63C5, a plurality of through holes 63D5, a plurality of through holes 63E15, a plurality of through holes 63E25, a plurality of through holes 63F15, and a plurality of through holes 63F25. The connection relationships between the through holes 63C5, 63D5, 63E15, 63E25, 63F15 and 63F25 and the shield conductor portions 631, 632 and 633 are the same as those in the first embodiment.

The plurality of through holes 63C4 of the first embodiment shown in FIG. 4B are connected to the plurality of through holes 63C5. The plurality of through holes 63D4 shown in FIG. 4B are connected to the plurality of through holes 63D5. The plurality of through holes 63E14 shown in FIG. 4B are connected to the plurality of through holes 63E15. The plurality of through holes 63F14 shown in FIG. 4B are connected to the plurality of through holes 63F15.

On the patterned surface of the eleventh dielectric layer 241, as shown in FIG. 17B, there are formed a conductor layer 2411 for forming the capacitor C51, a conductor layer 2412 for forming the capacitor C52, a conductor layer 2413 for forming the capacitor C53, and a conductor layer 2414 for forming the capacitor C54.

Through holes 8T6 and 9T6 are formed in the dielectric layer 241. The through holes 8T5 and 9T5 shown in FIG. 17A are respectively connected to the through holes 8T6 and 9T6 formed in the dielectric layer 241.

Further, two through holes 7T6 are formed in the dielectric layer 241. The two through holes 7T5 shown in FIG. 17A are respectively connected to the two through holes 7T6 formed in the dielectric layer 241.

Further formed in the dielectric layer 241 are a plurality of through holes 63C6, a plurality of through holes 63D6, a plurality of through holes 63E16, a plurality of through holes 63E26, a plurality of through holes 63F16, and a plurality of through holes 63F26. The plurality of through holes 63C5 shown in FIG. 17A are connected to the plurality of through holes 63C6 formed in the dielectric layer 241. The plurality of through holes 63D5 shown in FIG. 17A are connected to the plurality of through holes 63D6 formed in the dielectric layer 241.

The plurality of through holes 63E15 shown in FIG. 17A are connected to the plurality of through holes 63E16 formed in the dielectric layer 241. The plurality of through holes 63E25 shown in FIG. 17A are connected to the plurality of through holes 63E26 formed in the dielectric layer 241. The plurality of through holes 63F15 shown in FIG. 17A are connected to the plurality of through holes 63F16 formed in the dielectric layer 241. The plurality of through holes 63F25 shown in FIG. 17A are connected to the plurality of through holes 63F26 formed in the dielectric layer 241.

The plurality of through holes 63C6 formed in the eleventh dielectric layer 241 are connected to the plurality of through holes 63C6 formed in the twelfth dielectric layer 42 of the first embodiment shown in FIG. 5B. The plurality of through holes 63D6 formed in the eleventh dielectric layer 241 are connected to the plurality of through holes 63D6 formed in the twelfth dielectric layer 42.

The plurality of through holes 63E16 formed in the eleventh dielectric layer 241 are connected to the plurality of through holes 63E16 formed in the twelfth dielectric layer 42. The plurality of through holes 63E26 formed in the eleventh dielectric layer 241 are connected to the plurality of through holes 63E26 formed in the twelfth dielectric layer 42. The plurality of through holes 63F16 formed in the eleventh dielectric layer 241 are connected to the plurality of through holes 63F16 formed in the twelfth dielectric layer 42. The plurality of through holes 63F26 formed in the eleventh dielectric layer 241 are connected to the plurality of through holes 63F26 formed in the twelfth dielectric layer 42.

The conductor layer 2411 shown in FIG. 17B is opposed to the resonator conductor portion 510 and the shield conductor portion 631 shown in FIG. 17A, with the dielectric layer 240 interposed therebetween. The capacitor C51 shown in FIG. 16 is composed of the conductor layer 2411, the resonator conductor portion 510, the shield conductor portion 631, and the dielectric layer 240.

The conductor layer 2412 shown in FIG. 17B is opposed to the resonator conductor portion 520 and the conductor layer 2404 shown in FIG. 17A, with the dielectric layer 240 interposed therebetween. The capacitor C52 shown in FIG. 16 is composed of the conductor layers 2404 and 2412, the resonator conductor portion 520, and the dielectric layer 240. The conductor layer 2404 is connected to the through hole line 8T, and the capacitor C52 is thereby connected to the ground.

The conductor layer 2413 shown in FIG. 17B is opposed to the resonator conductor portion 530 and the conductor layer 2405 shown in FIG. 17A, with the dielectric layer 240 interposed therebetween. The capacitor C53 shown in FIG. 16 is composed of the conductor layers 2405 and 2413, the resonator conductor portion 530, and the dielectric layer 240. The conductor layer 2405 is connected to the through hole line 9T, and the capacitor C53 is thereby connected to the ground.

The conductor layer 2414 shown in FIG. 17B is opposed to the resonator conductor portion 540 and the shield conductor portion 633 shown in FIG. 17A, with the dielectric layer 240 interposed therebetween. The capacitor C54 shown in FIG. 16 is composed of the conductor layer 2414, the resonator conductor portion 540, the shield conductor portion 633, and the dielectric layer 240.

In the present embodiment, the resonator 51 includes the resonator conductor portion 510 and the capacitor C51. The resonator 52 includes the resonator conductor portion 520 and the capacitor C52. The resonator 53 includes the resonator conductor portion 530 and the capacitor C53. The resonator 54 includes the resonator conductor portion 540 and the capacitor C54.

According to the present embodiment, if the resonator conductor portions 510, 520, 530, and 540 each have the same length as that in the first embodiment, the resonance frequencies of the resonators 51, 52, 53, and 54 become lower than in the first embodiment. This means that the resonator conductor portions 510, 520, 530, and 540 of the present embodiment have a length smaller than ¼ the wavelength corresponding to the resonance frequency of the resonators 51, 52, 53 and 54. Accordingly, in the present embodiment, the length of each of the resonator conductor portions 510, 520, 530, and 540 is smaller than ¼ the wavelength corresponding to the center frequency of the passband of the band-pass filter 200.

According to the present embodiment, given the same passband, each of the resonator conductor portions 510, 520, 530, and 540 can be reduced in length as compared with the first embodiment. The present embodiment thus enables further reduction in size of the band-pass filter 200.

Figure 18:
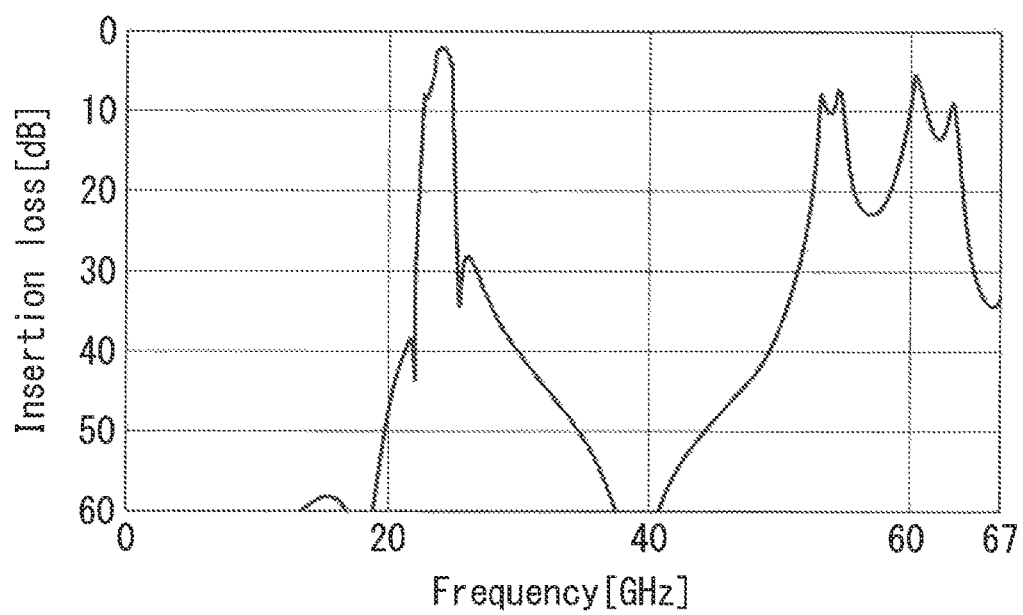
FIG. 18 is a characteristic diagram illustrating an example of the frequency characteristic of the insertion loss of the band-pass filter according to the third embodiment of the invention.

FIG. 18 shows an example of the frequency characteristic of the insertion loss of the band-pass filter 200 according to the present embodiment. The characteristic shown in FIG. 18 was obtained by simulation. In FIG. 18, the horizontal axis represents frequency, and the vertical axis represents insertion loss. FIG. 18 shows an example obtained with the resonator conductor portions 510, 520, 530 and 540 each having the same length as that in the first embodiment. Thus, the center frequency of the passband in the characteristic shown in FIG. 18 is lower than that of the passband in the characteristic 91 of the band-pass filter 1 shown in FIG. 7.

The other configuration, function, and effects of the present embodiment are the same as those of the first embodiment.

Fourth Embodiment

Figure 19:
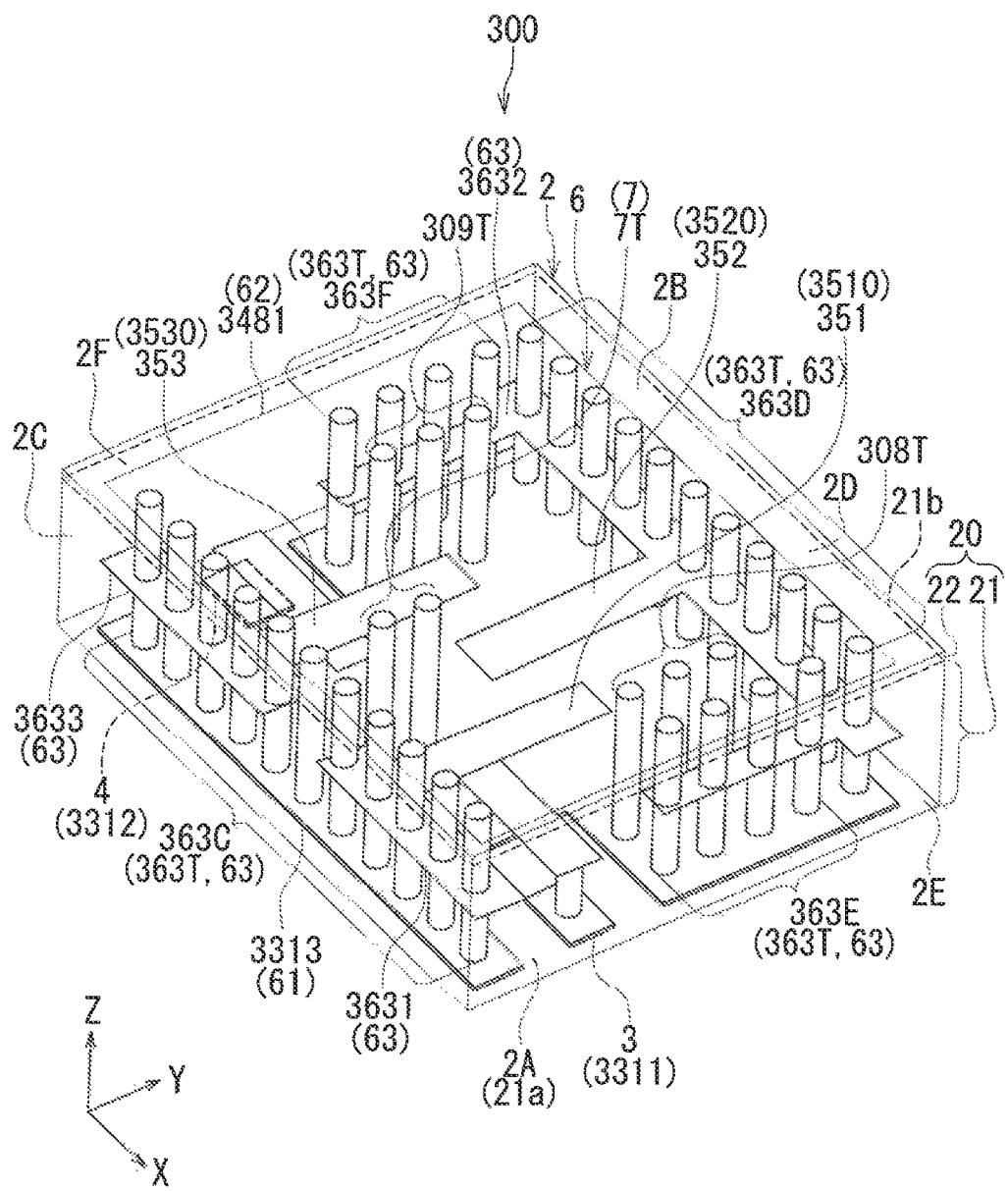
FIG. 19 is a perspective view illustrating the structure of a band-pass filter according to a fourth embodiment of the invention.
Figure 20:
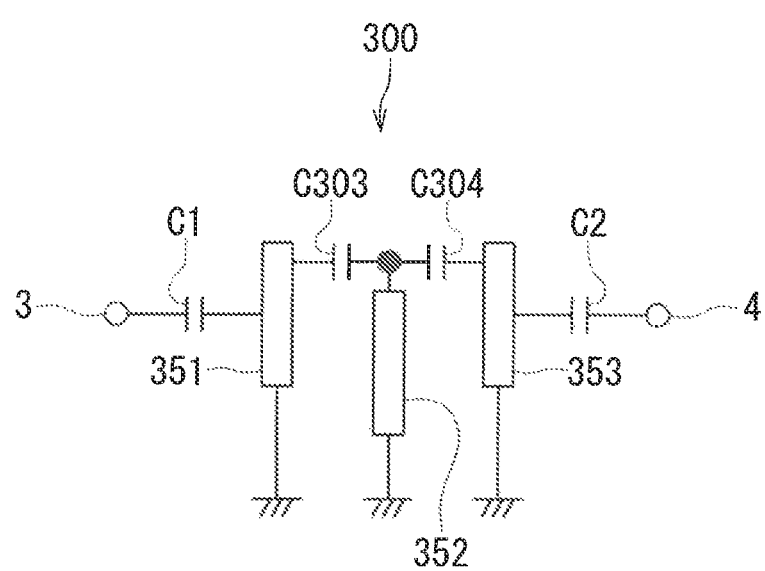
FIG. 20 is a circuit diagram illustrating the circuit configuration of the band-pass filter according to the fourth embodiment of the invention.

A fourth embodiment of the present invention will now be described. First, the configuration of a band-pass filter according to the present embodiment will be described with reference to FIG. 19 and FIG. 20. FIG. 19 is a perspective view illustrating the structure of the band-pass filter according to the present embodiment. FIG. 20 is a circuit diagram illustrating the circuit configuration of the band-pass filter according to the present embodiment.

The band-pass filter 300 according to the present embodiment includes the main body 2, the first input/output port 3 and the second input/output port 4, a plurality of resonators, the shield 6, the partition 7, and the capacitors C1 and C2. In the present embodiment, however, the through hole lines 8T and 9T (see FIG. 1) are omitted. The main body 2 includes the multilayer structure 20.

In the present embodiment, the plurality of resonators include a first-stage resonator 351, a second-stage resonator 352, and a third-stage resonator 353 which are arranged in this order from the first-input/output-port-3 side in circuit configuration, instead of the resonators 51, 52, 53 and 54 of the first embodiment. The resonators 351 to 353 are configured so that two resonators adjacent to each other in circuit configuration are electromagnetically coupled to each other. Specifically, the resonators 351 to 353 are configured so that: the resonators 351 and 352 are adjacent to each other in circuit configuration and are electromagnetically coupled to each other; and the resonators 352 and 353 are adjacent to each other in circuit configuration and are electromagnetically coupled to each other. The first portion 61, the second portion 62 and the connecting portion 63 of the shield 6 are arranged to surround the three resonators 351 to 353.

In the present embodiment, the first portion 61 is formed of a first conductor layer 3313 disposed on the first end face 21a of the main portion 21 of the multilayer structure 20. The second portion 62 is formed of a second conductor layer 3481 disposed on the second end face 21b of the main portion 21 of the multilayer structure 20.

The resonator 351 includes a resonator conductor portion 3510 formed of a conductor. The resonator 352 includes a resonator conductor portion 3520 formed of a conductor. The resonator 353 includes a resonator conductor portion 3530 formed of a conductor.

Each of the resonator conductor portions 3510, 3520 and 3530 is shaped to be elongated in a direction intersecting the first direction or the Z direction, and has a first end and a second end opposite to each other in the longitudinal direction of the resonator conductor portion. In the present embodiment, in particular, each of the resonator conductor portions 3510, 3520 and 3530 is shaped to be elongated in the Y direction orthogonal to the Z direction.

The first end of each of the resonator conductor portions 3510, 3520 and 3530 is connected to the ground. The second end of each of the resonator conductor portions 3510, 3520 and 3530 is open.

Each of the resonator conductor portions 3510, 3520 and 3530 has a length smaller than or equal to ¼ a wavelength corresponding to the center frequency of the passband of the band-pass filter 300. In the present embodiment, in particular, the length of each of the resonator conductor portions 3510, 3520 and 3530 is ¼ the wavelength corresponding to the center frequency of the passband of the band-pass filter 300.

In the present embodiment, the first-stage resonator 351 corresponds to the first resonator of the present invention, and the third-stage resonator 353 corresponds to the second resonator of the present invention. The resonator conductor portion 3510 corresponds to the first resonator conductor portion of the present invention, and the resonator conductor portion 3530 corresponds to the second resonator conductor portion of the present invention. The resonator conductor portion 3520 corresponds to the third resonator conductor portion of the present invention.

In the present embodiment, the partition 7 extends in a direction (the Z direction) intersecting the longitudinal direction (the Y direction) of each of the resonator conductor portions 3510 and 3530 such that at least part of the partition 7 passes through between the resonator conductor portions 3510 and 3530, and is in contact with the first portion 61 and the second portion 62.

In the present embodiment, the connecting portion 63 of the shield 6 includes a plurality of second through hole lines 363T instead of the plurality of second through hole lines 63T of the first embodiment, each of the second through hole lines 363T running through the two or more dielectric layers constituting the main portion 21. In FIG. 19, each through hole line 363T is represented by a circular column. Each of the plurality of second through hole lines 363T includes two or more through holes connected in series. Each of the plurality of second through hole lines 363T extends in the Z direction.

The plurality of second through hole lines 363T include a plurality of through hole lines 363C, a plurality of through hole lines 363D, a plurality of through hole lines 363E, and a plurality of through hole lines 363F. The plurality of through hole lines 363C are located near the side surface 2C of the main body 2 and arranged to be adjacent to each other in the X direction. The plurality of through hole lines 363D are located near the side surface 2D of the main body 2 and arranged to be adjacent to each other in the X direction. The plurality of through hole lines 363E are located near the side surface 2E of the main body 2 and arranged to be adjacent to each other in the Y direction. The plurality of through hole lines 363F are located near the side surface 2F of the main body 2 and arranged to be adjacent to each other in the Y direction.

The connecting portion 63 of the shield 6 includes three shield conductor portions 3631, 3632 and 3633, instead of the shield conductor portions 631, 632 and 633 of the first embodiment. The shield conductor portion 3631 is connected to some of the plurality of through hole lines 363C. The shield conductor portion 3632 is connected to the plurality of through hole lines 363D, the plurality of through hole lines 363E and the plurality of through hole lines 163F. The shield conductor portion 3633 is connected to other some of the plurality of through hole lines 363C.

The band-pass filter 300 according to the present embodiment includes a plurality of through hole lines 308T and a plurality of through hole lines 309T provided within the main body 2. Each of the plurality of through hole lines 308T and 309T runs through the two or more dielectric layers constituting the main portion 21, extends in the Z direction and is in contact with the first portion 61 and the second portion 62. Each of the plurality of through hole lines 308T and 309T includes two or more through holes connected in series. The plurality of through hole lines 308T are located near the resonator conductor portion 3510 and the plurality of through hole lines 363E. The plurality of through hole lines 309T are located near the resonator conductor portion 3530 and the plurality of through hole lines 363F. The plurality of through hole lines 308T and 309T have the function of assisting the function of the shield 6.

In the present embodiment, as shown in FIG. 20, the capacitor C1 is provided between the first input/output port 3 and the first-stage resonator 351. The capacitor C2 is provided between the second input/output port 4 and the third-stage resonator 353.

In FIG. 20, the capacitor symbol C303 represents capacitive coupling between the resonators 351 and 352. The capacitor symbol C304 represents capacitive coupling between the resonators 352 and 353.

Reference is now made to FIG. 21A to FIG. 24 to describe an example of the dielectric layers constituting the multilayer structure 20 and the configuration of a plurality of conductor layers and through holes formed in the dielectric layers. In this example, the multilayer structure 20 includes eighteen dielectric layers stacked on each other. The eighteen dielectric layers will be referred to as the first to eighteenth dielectric layers in the order from bottom to top. In the present embodiment, the main portion 21 is composed of the first to seventeenth dielectric layers. The coating portion 22 is composed of the eighteenth dielectric layer.

Figure 21A:
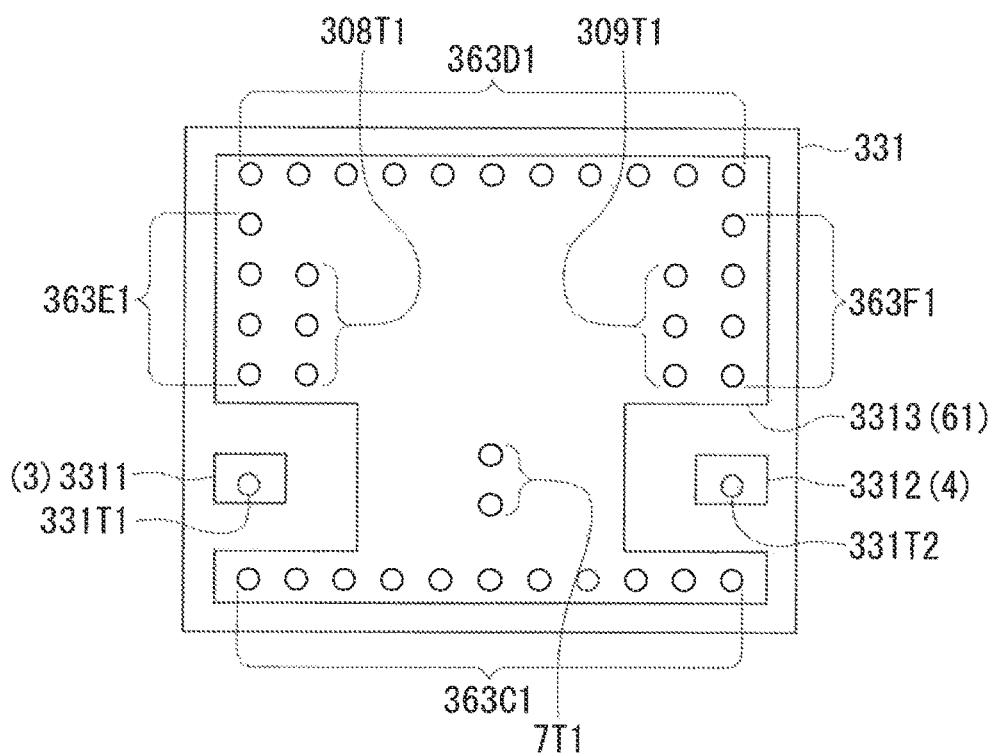
FIG. 21A is an explanatory diagram illustrating a patterned surface of a first dielectric layer of the band-pass filter of FIG. 19.
Figure 21B:
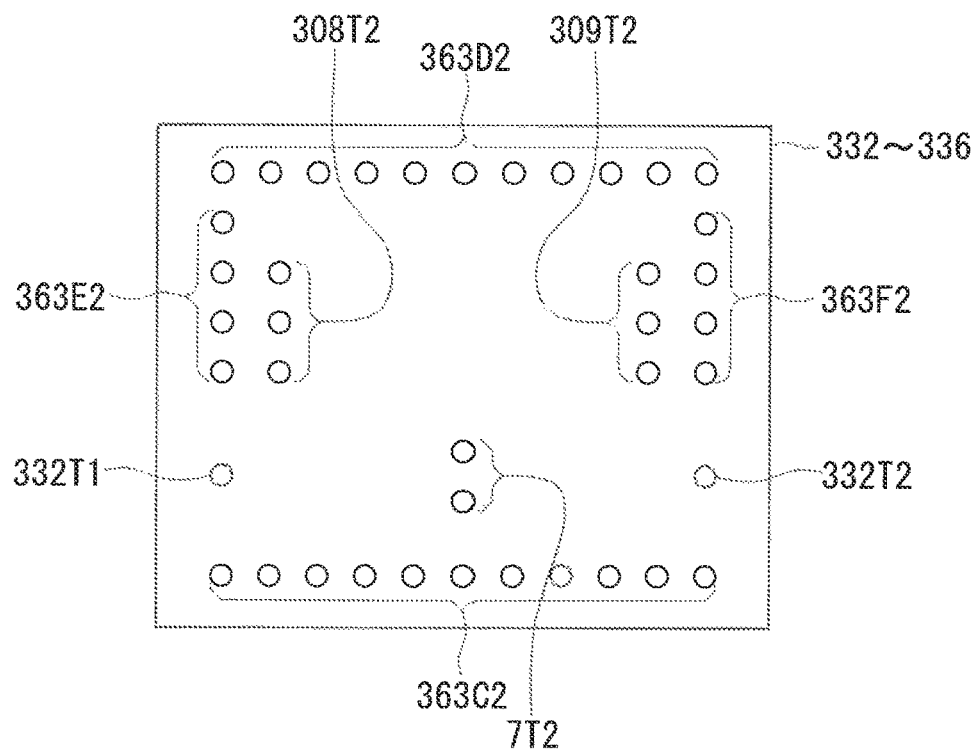
FIG. 21B is an explanatory diagram illustrating a patterned surface of each of a second to a sixth dielectric layer of the band-pass filter of FIG. 19.
Figure 22A:
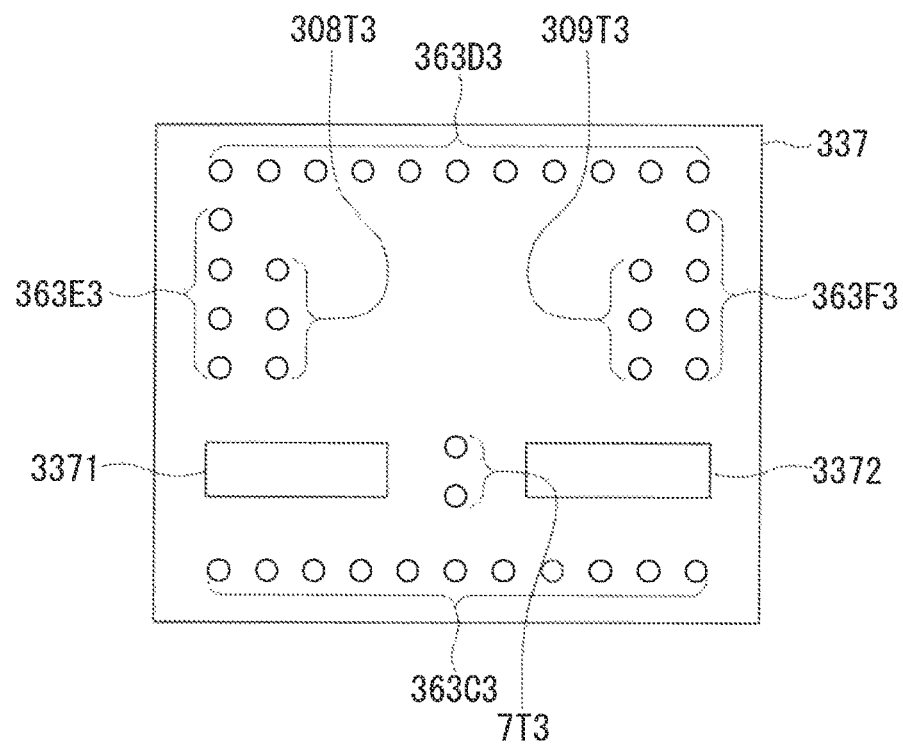
FIG. 22A is an explanatory diagram illustrating a patterned surface of a seventh dielectric layer of the band-pass filter of FIG. 19.
Figure 22B:
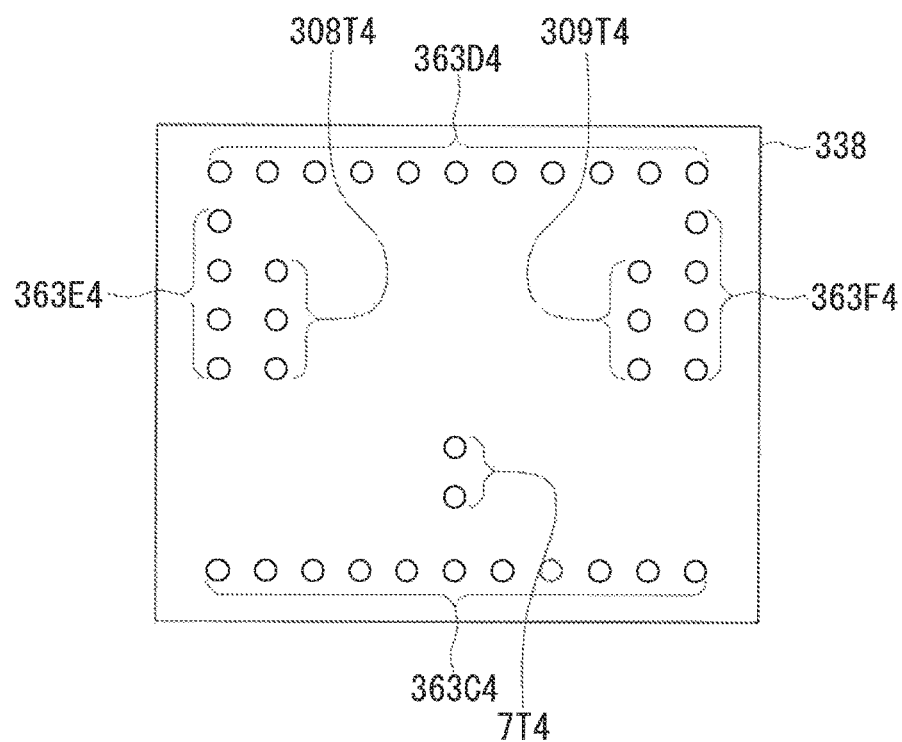
FIG. 22B is an explanatory diagram illustrating a patterned surface of an eighth dielectric layer of the band-pass filter of FIG. 19.
Figure 23A:
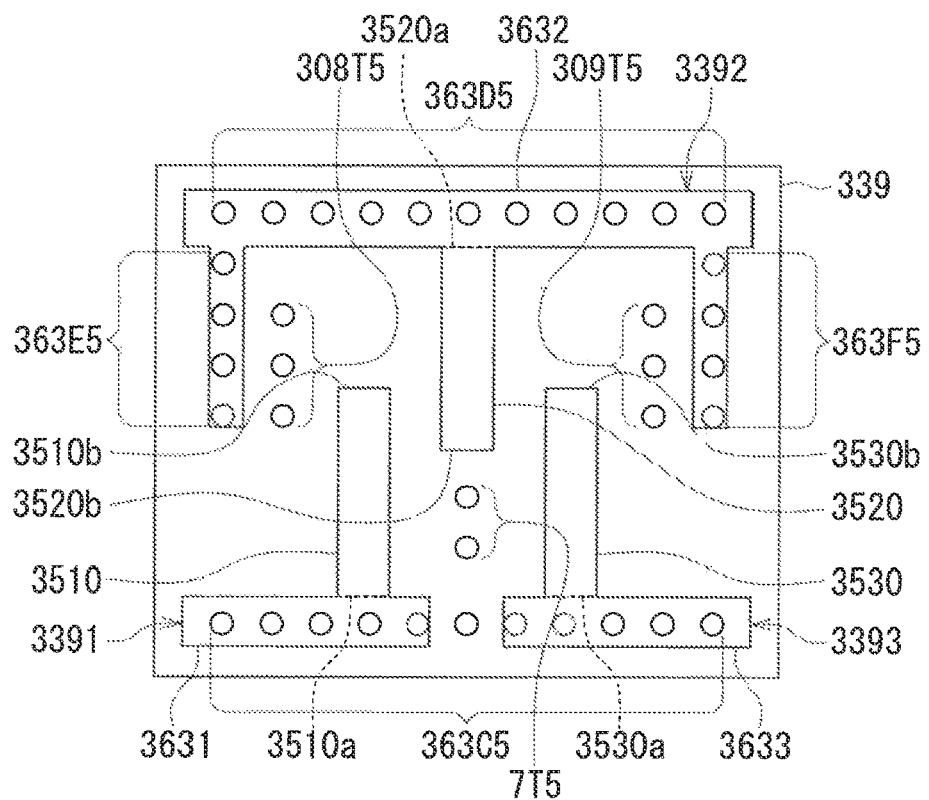
FIG. 23A is an explanatory diagram illustrating a patterned surface of a ninth dielectric layer of the band-pass filter of FIG. 19.
Figure 23B:
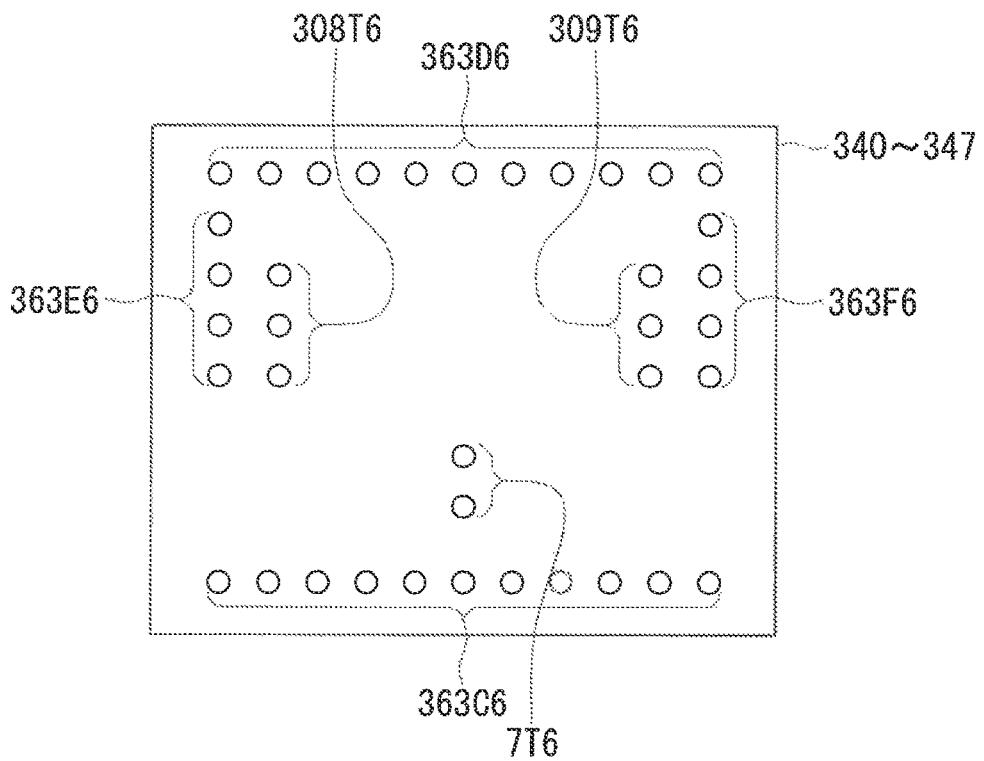
FIG. 23B is an explanatory diagram illustrating a patterned surface of each of a tenth to a seventeenth dielectric layer of the band-pass filter of FIG. 19.
Figure 24:
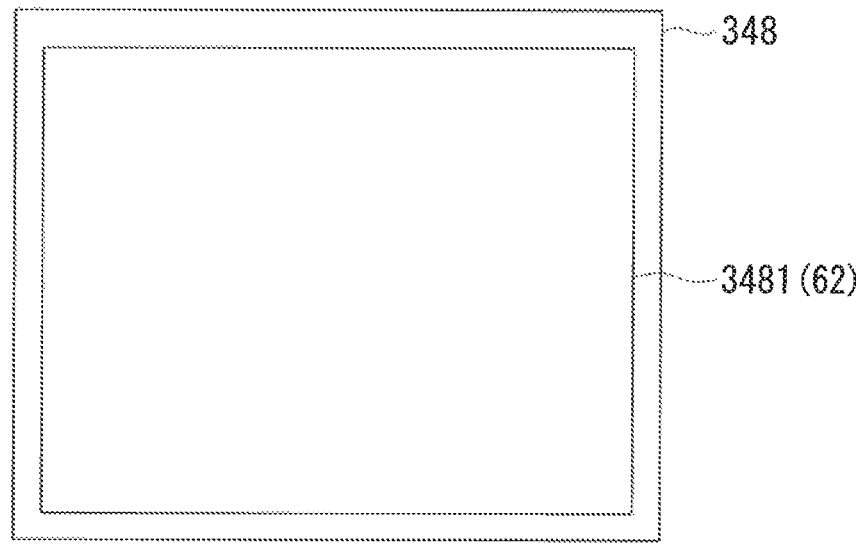
FIG. 24 is an explanatory diagram illustrating a patterned surface of an eighteenth dielectric layer of the band-pass filter of FIG. 19.

FIG. 21A illustrates the patterned surface of the first dielectric layer. FIG. 21B illustrates a patterned surface of each of the second to the sixth dielectric layer. FIG. 22A illustrates a patterned surface of the seventh dielectric layer. FIG. 22B illustrates a patterned surface of the eighth dielectric layer. FIG. 23A illustrates a patterned surface of the ninth dielectric layer. FIG. 23B illustrates a patterned surface of each of the tenth to the seventeenth dielectric layer. FIG. 24 illustrates a patterned surface of the eighteenth dielectric layer. The first to the eighteenth dielectric layer are denoted by reference numerals 331 to 348.

On the patterned surface of the first dielectric layer 331, as shown in FIG. 21A, there are formed a conductor layer 3311 forming the first input/output port 3, a conductor layer 3312 forming the second input/output port 4, and the first conductor layer 3313 forming the first portion 61 of the shield 6.

Further, formed in the dielectric layer 331 are a through hole 331T1 connected to the conductor layer 3311 and a through hole 331T2 connected to the conductor layer 3312. Further, two through holes 7T1 constituting respective portions of the two first through hole lines 7T are formed in the dielectric layer 331.

Further, formed in the dielectric layer 331 are a plurality of through holes 308T1 constituting respective portions of the plurality of through holes lines 308T, a plurality of through holes 309T1 constituting respective portions of the plurality of through hole lines 309T, a plurality of through holes 363C1 constituting respective portions of the plurality of through hole lines 363C, a plurality of through holes 363D1 constituting respective portions of the plurality of through hole lines 363D, a plurality of through holes 363E1 constituting respective portions of the plurality of through hole lines 363E, and a plurality of through holes 363F1 constituting respective portions of the plurality of through hole lines 363F.

The through holes 7T1, 308T1, 309T1, 363C1, 363D1, 363E1, and 363F1 are connected to the first conductor layer 3313.

As shown in FIG. 21B, through holes 332T1 and 332T2 are formed in each of the second to the sixth dielectric layer 332 to 336. The through holes 331T1 and 331T2 shown in FIG. 21A are respectively connected to the through holes 332T1 and 332T2 formed in the second dielectric layer 332.

Further, two through holes 7T2 are formed in each of the second to the sixth dielectric layer 332 to 336. The two through holes 7T1 shown in FIG. 21A are respectively connected to the two through holes 7T2 formed in the second dielectric layer 332.

In each of the second to the sixth dielectric layer 332 to 336, further formed are a plurality of through holes 308T2, a plurality of through holes 309T2, a plurality of through holes 363C2, a plurality of through holes 363D2, a plurality of through holes 363E2, and a plurality of through holes 363F2. The plurality of through holes 308T1 shown in FIG. 21A are connected to the plurality of through holes 308T2 formed in the second dielectric layer 332. The plurality of through holes 309T1 shown in FIG. 21A are connected to the plurality of through holes 309T2 formed in the second dielectric layer 332. The plurality of through holes 363C1 shown in FIG. 21A are connected to the plurality of through holes 363C2 formed in the second dielectric layer 332. The plurality of through holes 363D1 shown in FIG. 21A are connected to the plurality of through holes 363D2 formed in the second dielectric layer 332. The plurality of through holes 363E1 shown in FIG. 21A are connected to the plurality of through holes 363E2 formed in the second dielectric layer 332. The plurality of through holes 363F1 shown in FIG. 21A are connected to the plurality of through holes 363F2 formed in the second dielectric layer 332.

In the dielectric layers 332 to 336, every vertically adjacent through holes denoted by the same reference signs are connected to each other.

On the patterned surface of the seventh dielectric layer 337, as shown in FIG. 22A, there are formed a conductor layer 3371 for forming the capacitor C1, and a conductor layer 3372 for forming the capacitor C2. The through holes 332T1 and 332T2 formed in the sixth dielectric layer 336 (see FIG. 21B) are connected to the conductor layers 3371 and 3372, respectively.

Further, two through holes 7T3 are formed in the dielectric layer 337. The two through holes 7T2 formed in the sixth dielectric layer 336 are connected to the two through holes 7T3, respectively.

Further formed in the dielectric layer 337 are a plurality of through holes 308T3, a plurality of through holes 309T3, a plurality of through holes 363C3, a plurality of through holes 363D3, a plurality of through holes 363E3, and a plurality of through holes 363F3. The plurality of through holes 308T2 formed in the sixth dielectric layer 336 are connected to the plurality of through holes 308T3. The plurality of through holes 309T2 formed in the sixth dielectric layer 336 are connected to the plurality of through holes 309T3. The plurality of through holes 363C2 formed in the sixth dielectric layer 336 are connected to the plurality of through holes 363C3. The plurality of through holes 363D2 formed in the sixth dielectric layer 336 are connected to the plurality of through holes 363D3. The plurality of through holes 363E2 formed in the sixth dielectric layer 336 are connected to the plurality of through holes 363E3. The plurality of through holes 363F2 formed in the sixth dielectric layer 336 are connected to the plurality of through holes 363F3.

As shown in FIG. 22B, two through holes 7T4 are formed in the eighth dielectric layer 338. The two through holes 7T3 shown in FIG. 22A are connected to the two through holes 7T4.

Further formed in the dielectric layer 338 are a plurality of through holes 308T4, a plurality of through holes 309T4, a plurality of through holes 363C4, a plurality of through holes 363D4, a plurality of through holes 363E4, and a plurality of through holes 363F4. The plurality of through holes 308T3 shown in FIG. 22A are connected to the plurality of through holes 308T4. The plurality of through holes 309T3 shown in FIG. 22A are connected to the plurality of through holes 309T4. The plurality of through holes 363C3 shown in FIG. 22A are connected to the plurality of through holes 363C4. The plurality of through holes 363D3 shown in FIG. 22A are connected to the plurality of through holes 363D4. The plurality of through holes 363E3 shown in FIG. 22A are connected to the plurality of through holes 363E4. The plurality of through holes 363F3 shown in FIG. 22A are connected to the plurality of through holes 363F4.

As shown in FIG. 23A, three conductor layers 3391, 3392 and 3393 are formed on the patterned surface of the ninth dielectric layer 339. The conductor layer 3391 includes the resonator conductor portion 3510 and the shield conductor portion 3631. The conductor layer 3392 includes the resonator conductor portion 3520 and the shield conductor portion 3632. The conductor layer 3393 includes the resonator conductor portion 3530 and the shield conductor portion 3633. In FIG. 23A the boundary between the resonator conductor portion 3510 and the shield conductor portion 3631, the boundary between the resonator conductor portion 3520 and the shield conductor portion 3632, and the boundary between the resonator conductor portion 3530 and the shield conductor portion 3633 are indicated by broken lines.

The resonator conductor portion 3510 has a first end 3510$a$ and a second end 3510$b$ opposite to each other in the longitudinal direction, i.e., the Y direction. The first end 3510$a$ is connected to the shield conductor portion 3631 and thereby connected to the ground. The second end 3510$b$ is open.

The resonator conductor portion 3520 has a first end 3520$a$ and a second end 3520$b$ opposite to each other in the longitudinal direction, i.e., the Y direction. The first end 3520$a$ is connected to the shield conductor portion 3632 and thereby connected to the ground. The second end 3520$b$ is open.

The resonator conductor portion 3530 has a first end 3530$a$ and a second end 3530$b$ opposite to each other in the longitudinal direction, i.e., the Y direction. The first end 3530$a$ is connected to the shield conductor portion 3633 and thereby connected to the ground. The second end 3530$b$ is open.

The direction from the first end 3510$a$ to the second end 3510$b$ of the resonator conductor portion 3510 and the direction from the first end 3530$a$ to the second end 3530$b$ of the resonator conductor portion 3530 are opposite to the direction from the first end 3520$a$ to the second end 3520$b$ of the resonator conductor portion 3520. The second ends 3510$b$, 3520$b$, and 3530$b$ of the resonator conductor portions 3510, 3520, and 3530 are located close to each other.

Two through holes 7T5 are formed in the ninth dielectric layer 339 shown in FIG. 23A. The two through holes 7T4 shown in FIG. 22B are connected to the two through holes 7T5.

Further formed in the dielectric layer 339 are a plurality of through holes 308T5, a plurality of through holes 309T5, a plurality of through holes 363C5, a plurality of through holes 363D5, a plurality of through holes 363E5, and a plurality of through holes 363F5.

The plurality of through holes 308T4 shown in FIG. 22B are connected to the plurality of through holes 308T5. The plurality of through holes 309T4 shown in FIG. 22B are connected to the plurality of through holes 309T5.

Some of the plurality of through holes 363C5 are connected to the shield conductor portion 3631. Other some of the plurality of through holes 363C5 are connected to the shield conductor portion 3633. The plurality of through holes 363C4 shown in FIG. 22B are connected to the plurality of through holes 363C5.

The plurality of through holes 363D5, the plurality of through holes 363E5 and the plurality of through holes 363F5 are connected to the shield conductor portion 3632. The plurality of through holes 363D4 shown in FIG. 22B are connected to the plurality of through holes 363D5. The plurality of through holes 363E4 shown in FIG. 22B are connected to the plurality of through holes 363E5. The plurality of through holes 363F4 shown in FIG. 22B are connected to the plurality of through holes 363F5.

As shown in FIG. 23B, two through holes 7T6 are formed in each of the tenth to the seventeenth dielectric layer 340 to 347. The two through holes 7T5 shown in FIG. 23A are connected to the two through holes 7T6 formed in the tenth dielectric layer 340.

In each of the tenth to the seventeenth dielectric layer 340 to 347, further formed are a plurality of through holes 308T6, a plurality of through holes 309T6, a plurality of through holes 363C6, a plurality of through holes 363D6, a plurality of through holes 363E6, and a plurality of through holes 363F6. The plurality of through holes 308T5 shown in FIG. 23A are connected to the plurality of through holes 308T6 formed in the tenth dielectric layer 340. The plurality of through holes 309T5 shown in FIG. 23A are connected to the plurality of through holes 309T6 formed in the tenth dielectric layer 340. The plurality of through holes 363C5 shown in FIG. 23A are connected to the plurality of through holes 363C6 formed in the tenth dielectric layer 340. The plurality of through holes 363D5 shown in FIG. 23A are connected to the plurality of through holes 363D6 formed in the tenth dielectric layer 340. The plurality of through holes 363E5 shown in FIG. 23A are connected to the plurality of through holes 363E6 formed in the tenth dielectric layer 340. The plurality of through holes 363F5 shown in FIG. 23A are connected to the plurality of through holes 363F6 formed in the tenth dielectric layer 340.

In the dielectric layers 340 to 347, every vertically adjacent through holes denoted by the same reference signs are connected to each other.

As shown in FIG. 24, the second conductor layer 3481 forming the second portion 62 of the shield 6 is formed on the patterned surface of the eighteenth dielectric layer 348. The through holes 7T6, 308T6, 309T6, 363C6, 363D6, 363E6, and 363F6 formed in the seventeenth dielectric layer 347 (see FIG. 23B) are connected to the second conductor layer 3481.

The band-pass filter 300 according to the present embodiment is formed by stacking the first to the eighteenth dielectric layer 331 to 348 such that the patterned surface of the first dielectric layer 331 also serves as the first end face 2A of the main body 2. A surface of the eighteenth dielectric layer 348 opposite to the patterned surface serves as the second end face 2B of the main body 2. The first to the eighteenth dielectric layer 331 to 348 constitute the multilayer structure 20.

The resonator conductor portions 3510, 3520, and 3530 are located at the same position in the multilayer structure 20 in the first direction, i.e., the Z direction.

The conductor layer 3311 forming the first input/output port 3 is connected to the conductor layer 3371 shown in FIG. 22A via the through holes 331T1 and 332T1. The conductor layer 3371 is opposed to the resonator conductor portion 3510 shown in FIG. 23A with the dielectric layers 337 and 338 interposed therebetween. The capacitor C1 shown in FIG. 20 is composed of the conductor layer 3371 and the resonator conductor portion 3510, and the dielectric layers 337 and 338 interposed therebetween.

The conductor layer 3312 forming the second input/output port 4 is connected to the conductor layer 3372 shown in FIG. 22A via the through holes 331T2 and 332T2. The conductor layer 3372 is opposed to the resonator conductor portion 3530 shown in FIG. 23A with the dielectric layers 337 and 338 interposed therebetween. The capacitor C2 shown in FIG. 20 is composed of the conductor layer 3372 and the resonator conductor portion 3530, and the dielectric layers 337 and 338 interposed therebetween.

The plurality of through hole lines 7T of the partition 7 are formed by connecting the plurality of through holes 7T1, 7T2, 7T3, 7T4, 7T5 and 7T6 in series in the Z direction.

The plurality of through hole lines 308T are formed by connecting the plurality of through holes 308T1, 308T2, 308T3, 308T4, 308T5 and 308T6 in series in the Z direction. The plurality of through hole lines 309T are formed by connecting the plurality of through holes 309T1, 309T2, 309T3, 309T4, 309T5 and 309T6 in series in the Z direction.

The plurality of through hole lines 363C are formed by connecting the plurality of through holes 363C1, 363C2, 363C3, 363C4, 363C5 and 363C6 in series in the Z direction. The plurality of through hole lines 363D are formed by connecting the plurality of through holes 363D1, 363D2, 363D3, 363D4, 363D5 and 363D6 in series in the Z direction. The plurality of through hole lines 363E are formed by connecting the plurality of through holes 363E1, 363E2, 363E3, 363E4, 363E5 and 363E6 in series in the Z direction. The plurality of through hole lines 363F are formed by connecting the plurality of through holes 363F1, 363F2, 363F3, 363F4, 363F5 and 363F6 in series in the Z direction.

The band-pass filter 300 according to the present embodiment includes the resonators 351, 352, and 353 which are provided between the first input/output port 3 and the second input/output port 4 and arranged in the listed order from the first-input/output-port-3 side in circuit configuration. Every two resonators that are adjacent to each other in circuit configuration are configured to be electromagnetically coupled to each other.

The resonators 351, 352, and 353 include the resonator conductor portions 3510, 3520, and 3530, respectively. Each of the resonator conductor portions 3510, 3520, and 3530 has a length of ¼ the wavelength corresponding to the center frequency of the passband of the band-pass filter 300. Each of the resonators 351, 352, and 353 operates as a quarter-wave resonator.

In the present embodiment, the partition 7 extends in a direction intersecting the longitudinal direction of each of the resonator conductor portions 3510 and 3530 (the Y direction) such that at least part of the partition 7 passes through between the resonator conductor portions 3510 and 3530, and is in contact with the first portion 61 and the second portion 62. The resonator conductor portions 3510 and 3530 are respective components of the resonators 351 and 353 which are not adjacent to each other in circuit configuration.

Figure 25:
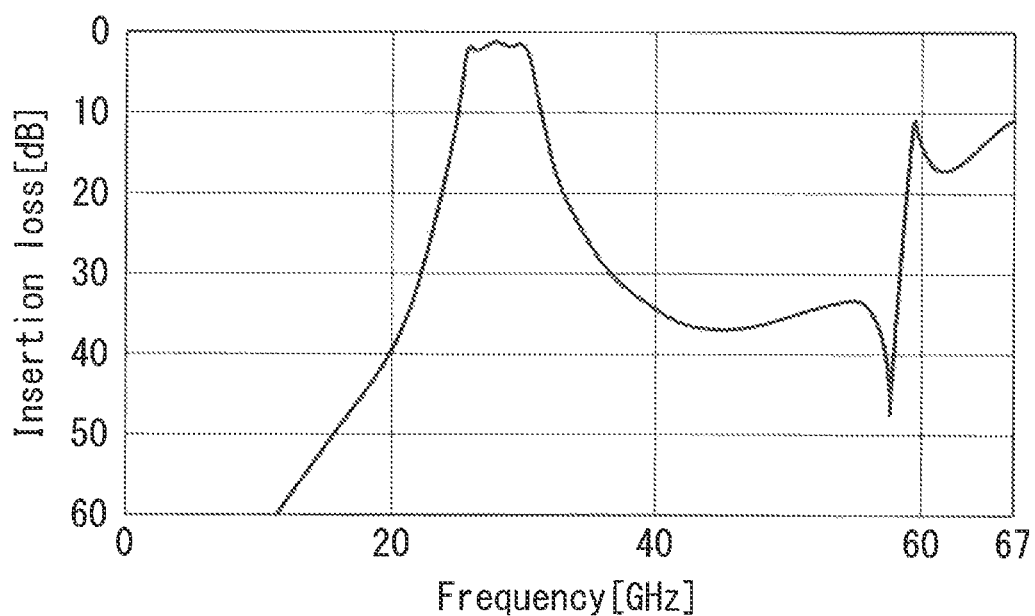
FIG. 25 is a characteristic diagram illustrating an example of the frequency characteristic of the insertion loss of the band-pass filter according to the fourth embodiment of the invention.

FIG. 25 shows an example of the frequency characteristic of the insertion loss of the band-pass filter 300 according to the present embodiment. The characteristic shown in FIG.

25 was obtained by simulation. In FIG. 25, the horizontal axis represents frequency, and the vertical axis represents insertion loss.

The other configuration, function, and effects of the present embodiment are the same as those of the first embodiment.

Fifth Embodiment

Figure 26:
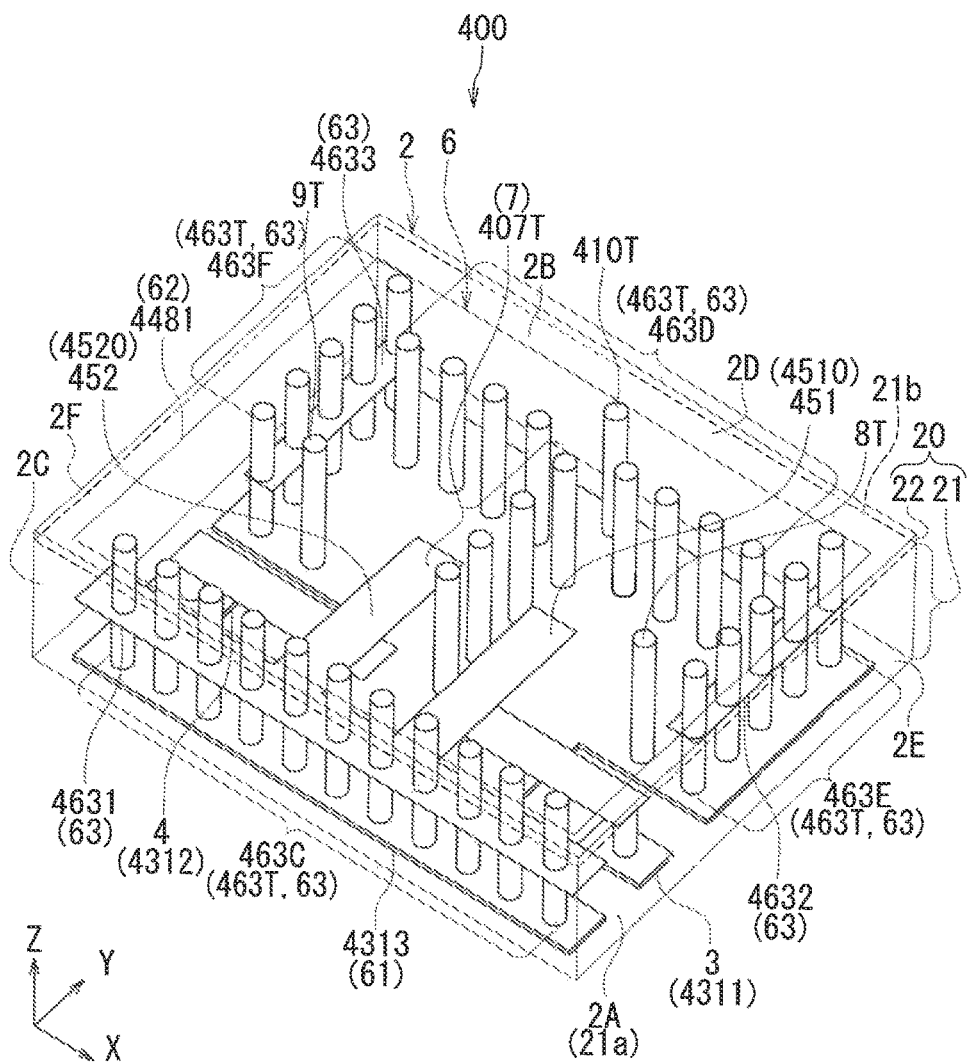
FIG. 26 is a perspective view illustrating the structure of a band-pass filter according to a fifth embodiment of the invention.
Figure 27:
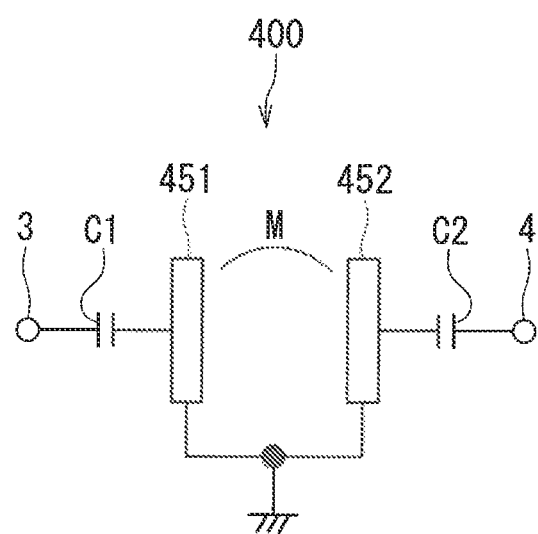
FIG. 27 is a circuit diagram illustrating the circuit configuration of the band-pass filter according to the fifth embodiment of the invention.

A fifth embodiment of the present invention will now be described. First, the configuration of a band-pass filter according to the present embodiment will be described with reference to FIG. 26 and FIG. 27. FIG. 26 is a perspective view illustrating the structure of the band-pass filter according to the present embodiment. FIG. 27 is a circuit diagram illustrating the circuit configuration of the band-pass filter according to the present embodiment.

The band-pass filter 400 according to the present embodiment includes the main body 2, the first input/output port 3 and the second input/output port 4, a plurality of resonators, the shield 6, the partition 7, the through hole lines 8T and 9T, and the capacitors C1 and C2. The main body 2 includes the multilayer structure 20.

In the present embodiment, the plurality of resonators include a first-stage resonator 451 and a second-stage resonator 452, which are arranged in this order from the first-input/output-port-3 side in circuit configuration, instead of the resonators 51, 52, 53 and 54 of the first embodiment. The resonators 451 and 452 are configured to be electromagnetically coupled to each other. The first portion 61, the second portion 62 and the connecting portion 63 of the shield 6 are arranged to surround the two resonators 451 and 452.

In the present embodiment, the first portion 61 is formed of a first conductor layer 4313 disposed on the first end face 21a of the main portion 21 of the multilayer structure 20. The second portion 62 is formed of a second conductor layer 4481 disposed on the second end face 21b of the main portion 21 of the multilayer structure 20.

The resonator 451 includes a resonator conductor portion 4510 formed of a conductor. The resonator 452 includes a resonator conductor portion 4520 formed of a conductor.

Each of the resonator conductor portions 4510 and 4520 is shaped to be elongated in a direction intersecting the first direction or the Z direction, and has a first end and a second end opposite to each other in the longitudinal direction of the resonator conductor portion. In the present embodiment, in particular, each of the resonator conductor portions 4510 and 4520 is shaped to be elongated in the Y direction orthogonal to the Z direction.

The first end of each of the resonator conductor portions 4510 and 4520 is connected to the ground. The second end of each of the resonator conductor portions 4510 and 4520 is open.

Each of the resonator conductor portions 4510 and 4520 has a length smaller than or equal to ¼ a wavelength corresponding to the center frequency of the passband of the band-pass filter 400. In the present embodiment, in particular, the length of each of the resonator conductor portions 4510 and 4520 is ¼ the wavelength corresponding to the center frequency of the passband of the band-pass filter 400.

In the present embodiment, the first-stage resonator 451 corresponds to the first resonator of the present invention, and the second-stage resonator 452 corresponds to the second resonator of the present invention. The resonator conductor portion 4510 corresponds to the first resonator conductor portion of the present invention, and the resonator conductor portion 4520 corresponds to the second resonator conductor portion of the present invention.

In the present embodiment, the partition 7 extends in a direction (the Z direction) intersecting the longitudinal direction (the Y direction) of each of the resonator conductor portions 4510 and 4520 such that at least part of the partition 7 passes through between the resonator conductor portions 4510 and 4520, and is in contact with the first portion 61 and the second portion 62. The partition 7 includes a plurality of first through hole lines 407T instead of the plurality of first through hole lines 7T of the first embodiment, each of the first though hole lines 407T running through the two or more dielectric layers constituting the main portion 21. In FIG. 26, each through hole line 407T is represented by a circular column. Each of the plurality of first through hole lines 407T includes two or more through holes connected in series. Each of the plurality of first through hole lines 407T extends in the Z direction. The plurality of first through hole lines 407T are arranged to be adjacent to each other in the Y direction. In the present embodiment, the number of the first through hole lines 407T is four.

In the present embodiment, the connecting portion 63 of the shield 6 includes a plurality of second through hole lines 463T instead of the plurality of second through hole lines 63T of the first embodiment, each of the second through hole lines 463T running through the two or more dielectric layers constituting the main portion 21. In FIG. 26, each through hole line 463T is represented by a circular column. Each of the plurality of second through hole lines 463T includes two or more through holes connected in series. Each of the plurality of second through hole lines 463T extends in the Z direction.

The plurality of second through hole lines 463T include a plurality of through hole lines 463C, a plurality of through hole lines 463D, a plurality of through hole lines 463E, and a plurality of through hole lines 463F. The plurality of through hole lines 463C are located near the side surface 2C of the main body 2 and arranged to be adjacent to each other in the X direction. The plurality of through hole lines 463D are located near the side surface 2D of the main body 2 and arranged to be adjacent to each other in the X direction. The plurality of through hole lines 463E are located near the side surface 2E of the main body 2 and arranged to be adjacent to each other in the Y direction. The plurality of through hole lines 463F are located near the side surface 2F of the main body 2 and arranged to be adjacent to each other in the Y direction.

The connecting portion 63 of the shield 6 includes three shield conductor portions 4631, 4632 and 4633, instead of the shield conductor portions 631, 632 and 633 of the first embodiment. The shield conductor portion 4631 is connected to the plurality of through hole lines 463C. The shield conductor portion 4632 is connected to the plurality of through hole lines 463E. The shield conductor portion 4633 is connected to the plurality of through hole lines 463F.

In the present embodiment, as shown in FIG. 26, the through hole line 8T is located near the resonator conductor portion 4510 and the shield conductor portion 4632. The through hole line 9T is located near the resonator conductor portion 4520 and the shield conductor portion 4633.

The band-pass filter 400 according to the present embodiment further includes a through hole line 410T provided within the main body 2. The through hole line 410T runs through the two or more dielectric layers constituting the main portion 21, extends in the Z direction and is in contact with the first portion 61 and the second portion 62. The through hole line 410T includes two or more through holes connected in series. The through hole line 410T is located near the side surface 2D of the main body 2. The through hole line 410T has the function of assisting the function of the shield 6.

In the present embodiment, as shown in FIG. 27, the capacitor C1 is provided between the first input/output port 3 and the first-stage resonator 451. The capacitor C2 is provided between the second input/output port 4 and the second-stage resonator 452. In FIG. 27, the curve labeled M represents magnetic coupling between the resonators 451 and 452.

Reference is now made to FIG. 28A to FIG. 31 to describe an example of the dielectric layers constituting the multilayer structure 20 and the configuration of a plurality of conductor layers and through holes formed in the dielectric layers. In this example, the multilayer structure 20 includes eighteen dielectric layers stacked on each other. The eighteen dielectric layers will be referred to as the first to eighteenth dielectric layers in the order from bottom to top. In the present embodiment, the main portion 21 is composed of the first to seventeenth dielectric layers. The coating portion 22 is composed of the eighteenth dielectric layer.

Figure 28A:
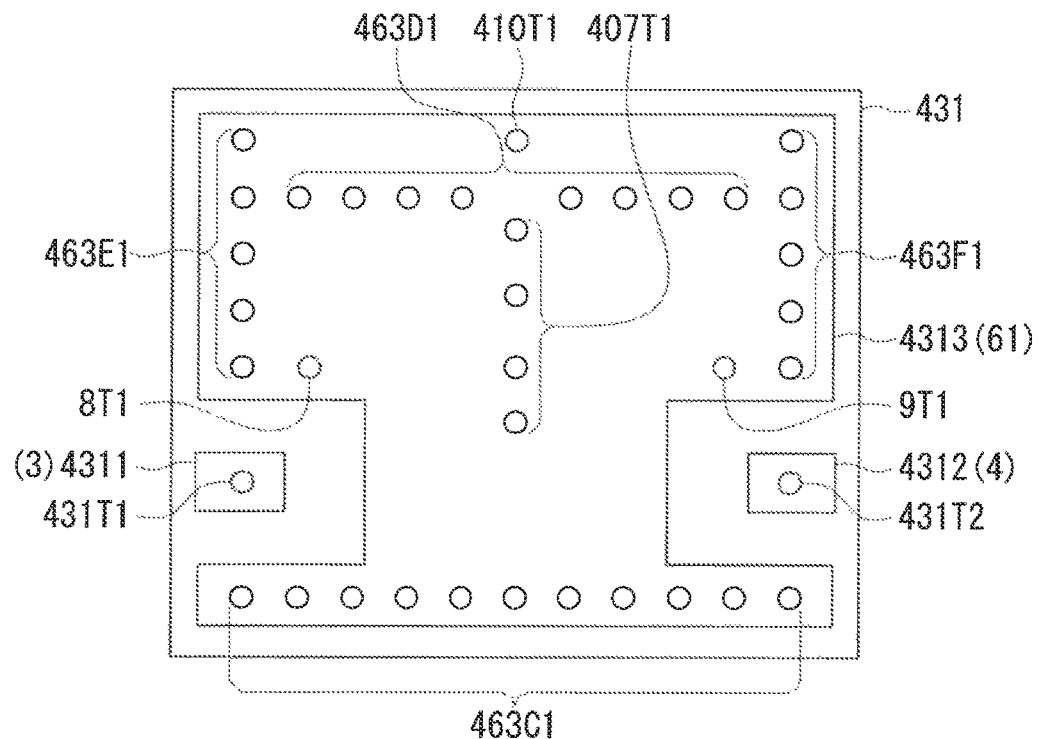
FIG. 28A is an explanatory diagram illustrating a patterned surface of a first dielectric layer of the band-pass filter of FIG. 26.
Figure 28B:
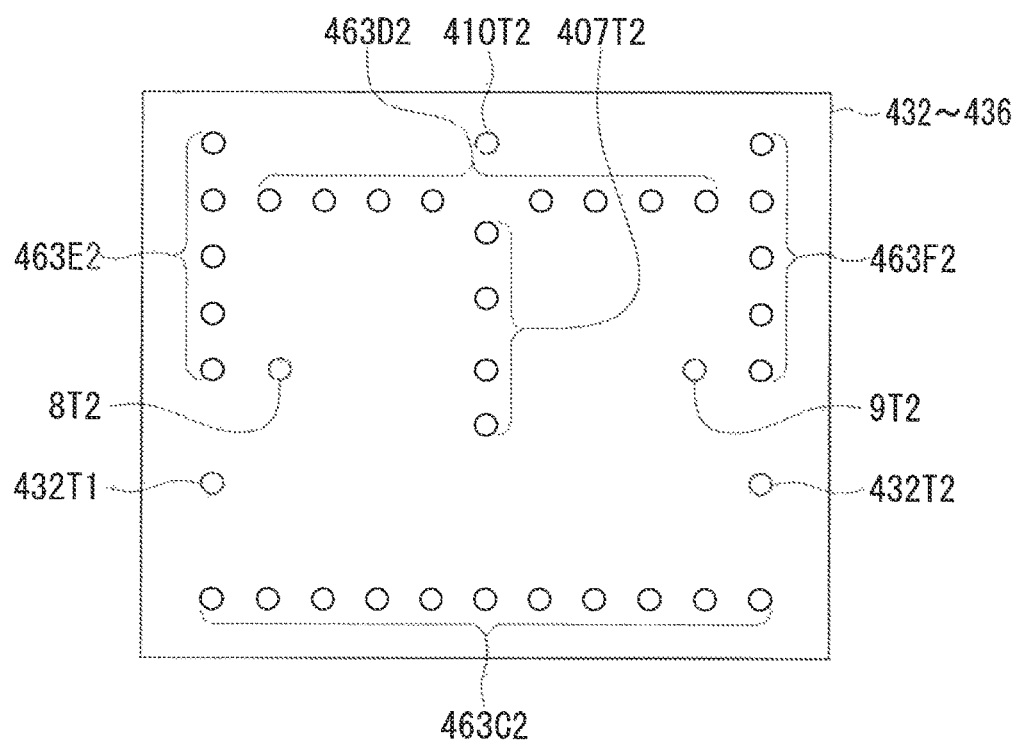
FIG. 28B is an explanatory diagram illustrating a patterned surface of each of a second to a sixth dielectric layer of the band-pass filter of FIG. 26.
Figure 29A:
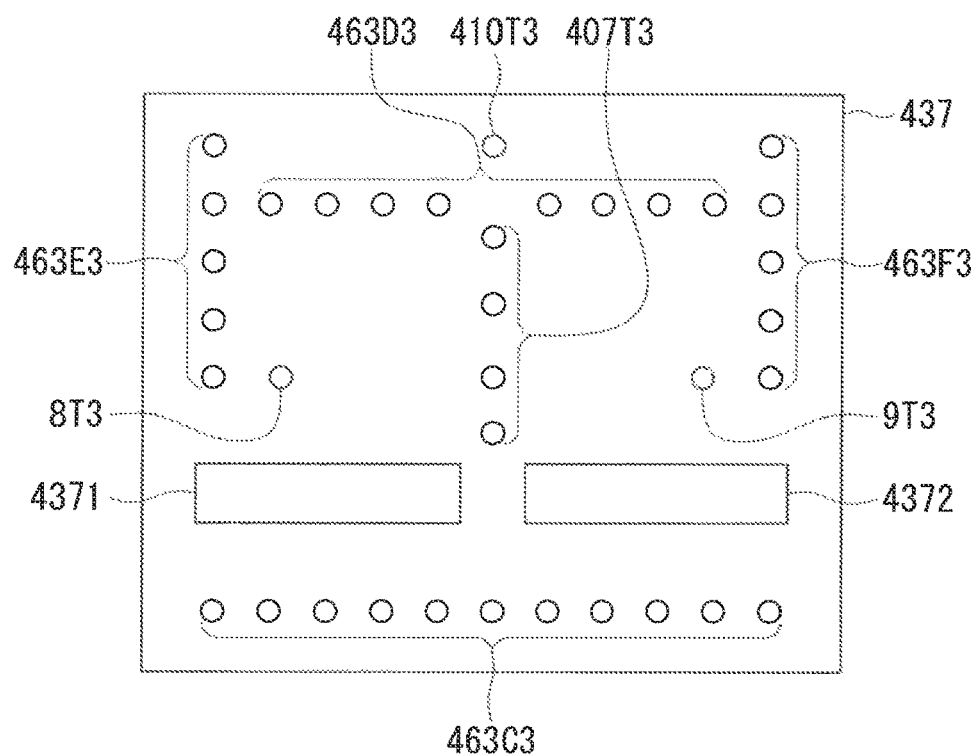
FIG. 29A is an explanatory diagram illustrating a patterned surface of a seventh dielectric layer of the band-pass filter of FIG. 26.
Figure 29B:
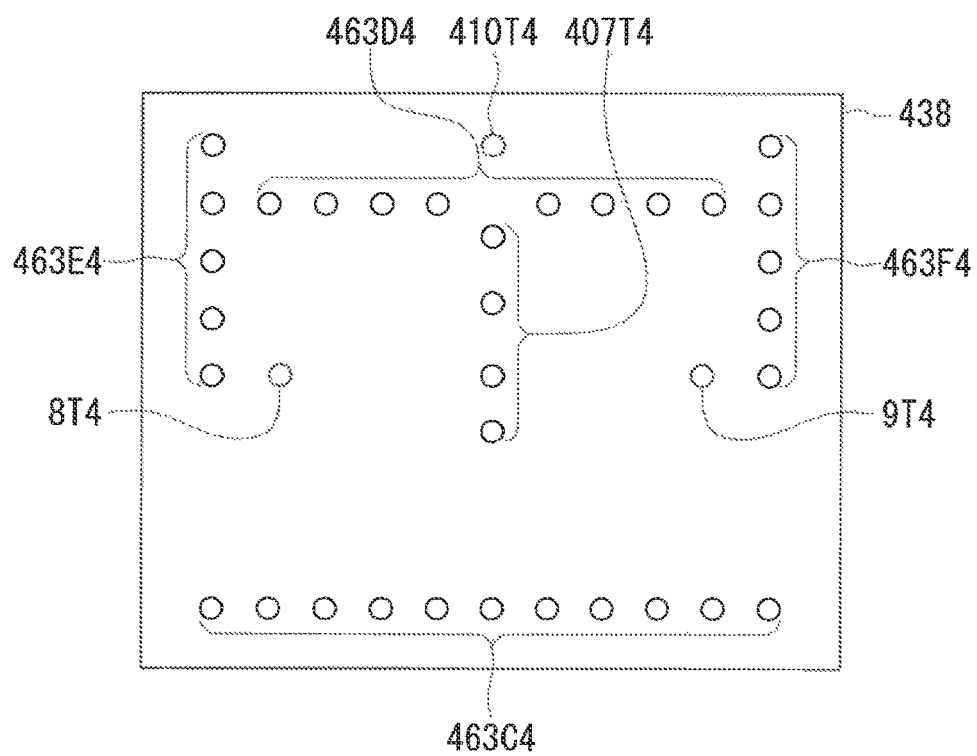
FIG. 29B is an explanatory diagram illustrating a patterned surface of an eighth dielectric layer of the band-pass filter of FIG. 26.
Figure 30A:
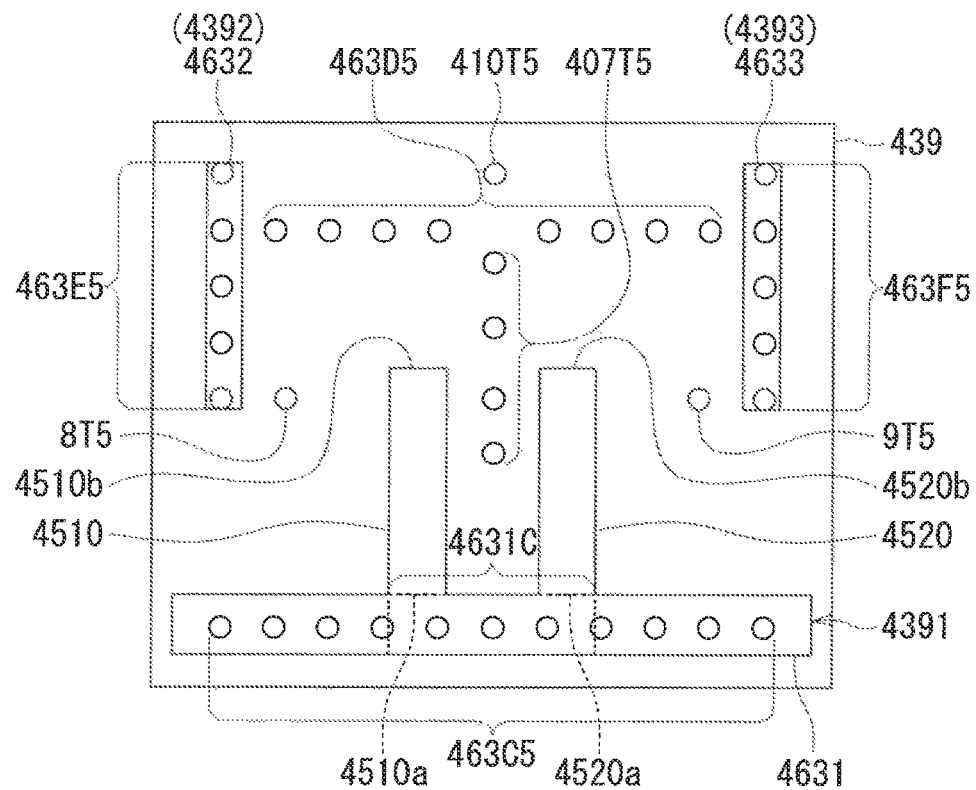
FIG. 30A is an explanatory diagram illustrating a patterned surface of a ninth dielectric layer of the band-pass filter of FIG. 26.
Figure 30B:
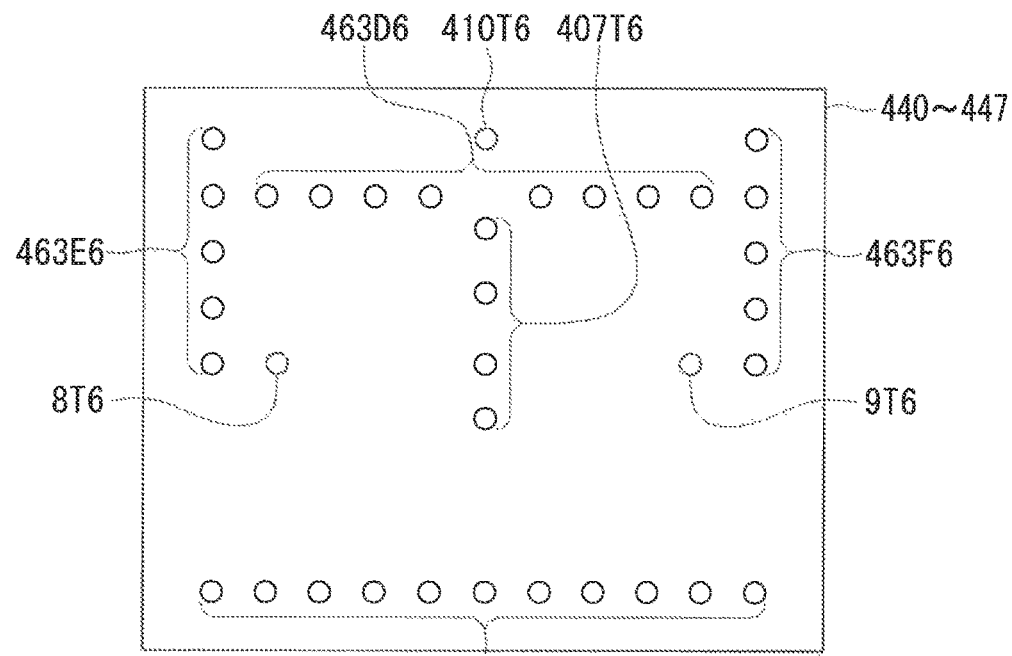
FIG. 30B is an explanatory diagram illustrating a patterned surface of each of a tenth to a seventeenth dielectric layer of the band-pass filter of FIG. 26.
Figure 31:
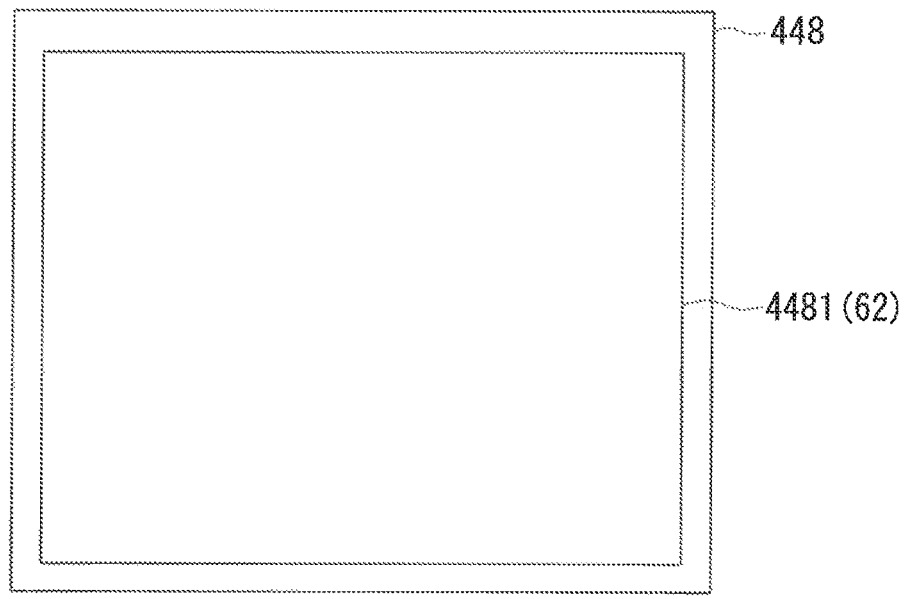
FIG. 31 is an explanatory diagram illustrating a patterned surface of an eighteenth dielectric layer of the band-pass filter of FIG. 26.

FIG. 28A illustrates a patterned surface of the first dielectric layer. FIG. 28B illustrates a patterned surface of each of the second to the sixth dielectric layer. FIG. 29A illustrates a patterned surface of the seventh dielectric layer. FIG. 29B illustrates a patterned surface of the eighth dielectric layer. FIG. 30A illustrates a patterned surface of the ninth dielectric layer. FIG. 30B illustrates a patterned surface of each of the tenth to the seventeenth dielectric layer. FIG. 31 illustrates a patterned surface of the eighteenth dielectric layer. The first to the eighteenth dielectric layer are denoted by reference numerals 431 to 448.

On the patterned surface of the first dielectric layer 431, as shown in FIG. 28A, there are formed a conductor layer 4311 forming the first input/output port 3, a conductor layer 4312 forming the second input/output port 4, and the first conductor layer 4313 forming the first portion 61 of the shield 6.

Further, formed in the dielectric layer 431 are a through hole 431T1 connected to the conductor layer 4311, a through hole 431T2 connected to the conductor layer 4312, a through hole 8T1 constituting part of the through hole line 8T, a through hole 9T1 constituting part of the through hole line 9T, and a through hole 410T1 constituting part of the through hole line 410T. Further, four through holes 407T1 constituting respective portions of the four first through hole lines 407T are formed in the dielectric layer 431.

Further, formed in the dielectric layer 431 are a plurality of through holes 463C1 constituting respective portions of the plurality of through hole lines 463C, a plurality of through holes 463D1 constituting respective portions of the plurality of through hole lines 463D, a plurality of through holes 463E1 constituting respective portions of the plurality of through hole lines 463E, and a plurality of through holes 463F1 constituting respective portions of the plurality of through hole lines 463F.

The through holes 8T1, 9T1, 407T1, 410T1, 463C1, 463D1, 463E1, and 463F1 are connected to the first conductor layer 4313.

As shown in FIG. 28B, through holes 432T1, 432T2, 8T2, 9T2 and 410T2 are formed in each of the second to the sixth dielectric layer 432 to 436. The through holes 431T1, 431T2, 8T1, 9T1 and 410T1 shown in FIG. 28A are respectively connected to the through holes 432T1, 432T2, 8T2, 9T2 and 410T2 formed in the second dielectric layer 432.

Further, four through holes 407T2 are formed in each of the second to the sixth dielectric layer 432 to 436. The four through holes 407T1 shown in FIG. 28A are respectively connected to the four through holes 407T2 formed in the second dielectric layer 432.

In each of the second to the sixth dielectric layer 432 to 436, further formed are a plurality of through holes 463C2, a plurality of through holes 463D2, a plurality of through holes 463E2, and a plurality of through holes 463F2. The plurality of through holes 463C1 shown in FIG. 28A are connected to the plurality of through holes 463C2 formed in the second dielectric layer 432. The plurality of through holes 463D1 shown in FIG. 28A are connected to the plurality of through holes 463D2 formed in the second dielectric layer 432. The plurality of through holes 463E1 shown in FIG. 28A are connected to the plurality of through holes 463E2 formed in the second dielectric layer 432. The plurality of through holes 463F1 shown in FIG. 28A are connected to the plurality of through holes 463F2 formed in the second dielectric layer 432.

In the dielectric layers 432 to 436, every vertically adjacent through holes denoted by the same reference signs are connected to each other.

On the patterned surface of the seventh dielectric layer 437, as shown in FIG. 29A, there are formed a conductor layer 4371 for forming the capacitor C1, and a conductor layer 4372 for forming the capacitor C2. The through holes 432T1 and 432T2 formed in the sixth dielectric layer 436 (see FIG. 28B) are connected to the conductor layers 4371 and 4372, respectively.

Through holes 8T3, 9T3 and 410T3 are formed in the dielectric layer 437. The through holes 8T2, 9T2 and 410T2 formed in the sixth dielectric layer 436 are connected to the through holes 8T3, 9T3 and 410T3, respectively.

Further, four through holes 407T3 are formed in the dielectric layer 437. The four through holes 407T2 formed in the sixth dielectric layer 436 are connected to the four through holes 407T3, respectively.

Further formed in the dielectric layer 437 are a plurality of through holes 463C3, a plurality of through holes 463D3, a plurality of through holes 463E3, and a plurality of through holes 463F3. The plurality of through holes 463C2 formed in the sixth dielectric layer 436 are connected to the plurality of through holes 463C3. The plurality of through holes 463D2 formed in the sixth dielectric layer 436 are connected to the plurality of through holes 463D3. The plurality of through holes 463E2 formed in the sixth dielectric layer 436 are connected to the plurality of through holes 463E3. The plurality of through holes 463F2 formed in the sixth dielectric layer 436 are connected to the plurality of through holes 463F3.

As shown in FIG. 29B, through holes 8T4, 9T4 and 410T4 are formed in the eighth dielectric layer 438. The through holes 8T3, 9T3 and 410T3 shown in FIG. 29A are connected to the through holes 8T4, 9T4 and 410T4, respectively.

Further, four through holes 407T4 are formed in the dielectric layer 438. The four through holes 407T3 shown in FIG. 29A are connected to the four through holes 407T4.

Further formed in the dielectric layer 438 are a plurality of through holes 463C4, a plurality of through holes 463D4, a plurality of through holes 463E4, and a plurality of through holes 463F4. The plurality of through holes 463C3 shown in FIG. 29A are connected to the plurality of through holes 463C4. The plurality of through holes 463D3 shown in FIG. 29A are connected to the plurality of through holes 463D4. The plurality of through holes 463E3 shown in FIG. 29A are connected to the plurality of through holes 463E4. The plurality of through holes 463F3 shown in FIG. 29A are connected to the plurality of through holes 463F4.

As shown in FIG. 30A, three conductor layers 4391, 4392 and 4393 are formed on the patterned surface of the ninth dielectric layer 439. The conductor layer 4391 includes the resonator conductor portion 4510, the resonator conductor portion 4520, and the shield conductor portion 4631. The conductor layer 4392 includes the shield conductor portion 4632. The conductor layer 4393 includes the shield conductor portion 4633. In FIG. 30A the boundary between the resonator conductor portion 4510 and the shield conductor portion 4631, and the boundary between the resonator conductor portion 4520 and the shield conductor portion 4631 are indicated by broken lines.

The resonator conductor portion 4510 has a first end 4510a and a second end 4510b opposite to each other in the longitudinal direction, i.e., the Y direction. The first end 4510a is connected to the shield conductor portion 4631 and thereby connected to the ground. The second end 4510b is open.

The resonator conductor portion 4520 has a first end 4520a and a second end 4520b opposite to each other in the longitudinal direction, i.e., the Y direction. The first end 4520a is connected to the shield conductor portion 4631 and thereby connected to the ground. The second end 4520b is open.

In the present embodiment, as shown in FIG. 30A, the resonator conductor portions 4510 and 4520 are formed of different portions of the single conductor layer 4391. The shield conductor portion 4631 of the conductor layer 4391 includes a connecting portion 4631C connecting the first end 4510a of the resonator conductor portion 4510 and the first end 4520a of the resonator conductor portion 4520. In FIG. 30A, the two boundaries between the connecting portion 4631C and the other portions of the shield conductor portion 4631 are indicated by dotted lines. The connecting portion 4631C has the role of enhancing the magnetic coupling between the resonators 451 and 452. The magnitude of the magnetic coupling between the resonators 451 and 452 is adjusted by the magnitude of the magnetic coupling between the resonators 451 and 452 without the connection portion 4631C taken into consideration, and the connection portion 4631C.

Through holes 8T5, 9T5 and 410T5 are formed in the ninth dielectric layer 439 shown in FIG. 30A. The through holes 8T4, 9T4 and 410T4 shown in FIG. 29B are connected to the through holes 8T5, 9T5 and 410T5, respectively.

Further, four through holes 407T5 are formed in the dielectric layer 439. The four through holes 407T4 shown in FIG. 29B are connected to the four through holes 407T5.

Further formed in the dielectric layer 439 are a plurality of through holes 463C5, a plurality of through holes 463D5, a plurality of through holes 463E5, and a plurality of through holes 463F5.

The plurality of through holes 463C5 are connected to the shield conductor portion 4631. The plurality of through holes 463C4 shown in FIG. 29B are connected to the plurality of through holes 463C5.

The plurality of through holes 463D4 shown in FIG. 29B are connected to the plurality of through holes 463D5.

The plurality of through holes 463E5 are connected to the shield conductor portion 4632. The plurality of through holes 463E4 shown in FIG. 29B are connected to the plurality of through holes 463E5.

The plurality of through holes 463F5 are connected to the shield conductor portion 4633. The plurality of through holes 463F4 shown in FIG. 29B are connected to the plurality of through holes 463F5.

As shown in FIG. 30B, through holes 8T6, 9T6 and 410T6 are formed in each of the tenth to the seventeenth dielectric layer 440 to 447. The through holes 8T5, 9T5 and 410T5 shown in FIG. 30A are respectively connected to the through holes 8T6, 9T6 and 410T6 formed in the tenth dielectric layer 440.

Further, four through holes 407T6 are formed in each of the tenth to the seventeenth dielectric layer 440 to 447. The four through holes 407T5 shown in FIG. 30A are respectively connected to the four through holes 407T6 formed in the tenth dielectric layer 440.

In each of the tenth to the seventeenth dielectric layer 440 to 447, further formed are a plurality of through holes 463C6, a plurality of through holes 463D6, a plurality of through holes 463E6, and a plurality of through holes 463F6. The plurality of through holes 463C5 shown in FIG. 30A are connected to the plurality of through holes 463C6 formed in the tenth dielectric layer 440. The plurality of through holes 463D5 shown in FIG. 30A are connected to the plurality of through holes 463D6 formed in the tenth dielectric layer 440. The plurality of through holes 463E5 shown in FIG. 30A are connected to the plurality of through holes 463E6 formed in the tenth dielectric layer 440. The plurality of through holes 463F5 shown in FIG. 30A are connected to the plurality of through holes 463F6 formed in the tenth dielectric layer 440.

In the dielectric layers 440 to 447, every vertically adjacent through holes denoted by the same reference signs are connected to each other.

As shown in FIG. 31, the second conductor layer 4481 forming the second portion 62 of the shield 6 is formed on the patterned surface of the eighteenth dielectric layer 448. The through holes 8T6, 9T6, 407T6, 410T6, 463C6, 463D6, 463E6, and 463F6 formed in the seventeenth dielectric layer 447 (see FIG. 30A) are connected to the second conductor layer 4481.

The band-pass filter 400 according to the present embodiment is formed by stacking the first to the eighteenth dielectric layer 431 to 448 such that the patterned surface of the first dielectric layer 431 also serves as the first end face 2A of the main body 2. A surface of the eighteenth dielectric layer 448 opposite to the patterned surface serves as the second end face 2B of the main body 2. The first to the eighteenth dielectric layer 431 to 448 constitute the multilayer structure 20.

The resonator conductor portions 4510 and 4520 are located at the same position in the multilayer structure 20 in the first direction, i.e., the Z direction.

The conductor layer 4311 forming the first input/output port 3 is connected to the conductor layer 4371 shown in FIG. 29A via the through holes 431T1 and 432T1. The conductor layer 4371 is opposed to the resonator conductor portion 4510 shown in FIG. 30A with the dielectric layers 437 and 438 interposed therebetween. The capacitor C1 shown in FIG. 27 is composed of the conductor layer 4371 and the resonator conductor portion 4510, and the dielectric layers 437 and 438 interposed therebetween.

The conductor layer 4312 forming the second input/output port 4 is connected to the conductor layer 4372 shown in FIG. 29A via the through holes 431T2 and 432T2. The conductor layer 4372 is opposed to the resonator conductor portion 4520 shown in FIG. 30A with the dielectric layers 437 and 438 interposed therebetween. The capacitor C2 shown in FIG. 27 is composed of the conductor layer 4372 and the resonator conductor portion 4520, and the dielectric layers 437 and 438 interposed therebetween.

The plurality of through hole lines 407T of the partition 7 are formed by connecting the plurality of through holes 407T1, 407T2, 407T3, 407T4, 407T5 and 407T6 in series in the Z direction.

The through hole line 8T is formed by connecting the plurality of through holes 8T1, 8T2, 8T3, 8T4, 8T5 and 8T6 in series in the Z direction. The through hole line 9T is formed by connecting the plurality of through holes 9T1, 9T2, 9T3, 9T4, 9T5 and 9T6 in series in the Z direction. The through hole line 410T is formed by connecting the plurality of through holes 410T1, 410T2, 410T3, 410T4, 410T5 and 410T6 in series in the Z direction.

The plurality of through hole lines 463C are formed by connecting the plurality of through holes 463C1, 463C2, 463C3, 463C4, 463C5 and 463C6 in series in the Z direction. The plurality of through hole lines 463D are formed by connecting the plurality of through holes 463D1, 463D2, 463D3, 463D4, 463D5 and 463D6 in series in the Z direction. The plurality of through hole lines 463E are formed by connecting the plurality of through holes 463E1, 463E2, 463E3, 463E4, 463E5 and 463E6 in series in the Z direction. The plurality of through hole lines 463F are formed by connecting the plurality of through holes 463F1, 463F2, 463F3, 463F4, 463F5 and 463F6 in series in the Z direction.

The band-pass filter 400 according to the present embodiment includes the resonators 451 and 452 which are provided between the first input/output port 3 and the second input/output port 4 and arranged in the listed order from the first-input/output-port-3 side in circuit configuration. The resonators 451 and 452 include the resonator conductor portions 4510 and 4520, respectively. Each of the resonator conductor portions 4510 and 4520 has a length of ¼ the wavelength corresponding to the center frequency of the passband of the band-pass filter 400. Each of the resonators 451 and 452 operates as a quarter-wave resonator.

Figure 32:
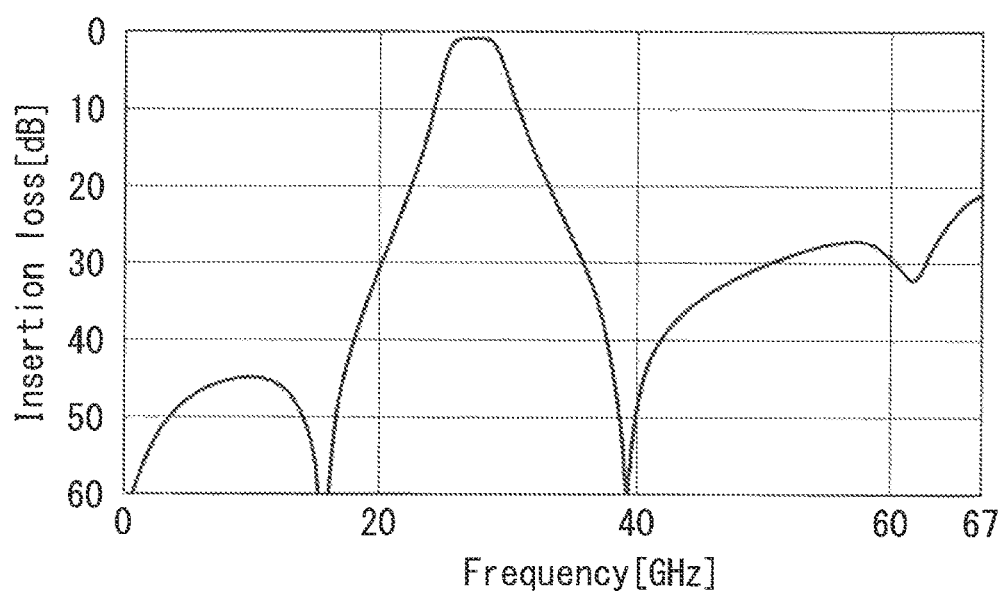
FIG. 32 is a characteristic diagram illustrating an example of the frequency characteristic of the insertion loss of the band-pass filter according to the fifth embodiment of the invention.

FIG. 32 shows an example of the frequency characteristic of the insertion loss of the band-pass filter 400 according to the present embodiment. The characteristic shown in FIG. 32 was obtained by simulation. In FIG. 32, the horizontal axis represents frequency, and the vertical axis represents insertion loss.

The other configuration, function, and effects of the present embodiment are the same as those of the first embodiment.

The present invention is not limited to the foregoing embodiments, and various modifications may be made thereto. For example, at least part of the connecting portion of the shield 6 may be composed of conductor layer(s) formed on one or more side surfaces of the main body 2, instead of a plurality of through hole lines. Further, the partition 7 may be composed of plate-shaped conductor portions, instead of a plurality of through hole lines.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A band-pass filter comprising:
   a main body formed of a dielectric;
   a first input/output port and a second input/output port integrated with the main body;
   a plurality of resonators provided within the main body, and located between the first input/output port and the second input/output port in circuit configuration;
   a shield formed of a conductor and integrated with the main body; and
   a partition formed of a conductor, provided within the main body, and electrically connected to the shield, wherein
   the shield includes a first portion and a second portion spaced from each other in a first direction, and a connecting portion connecting the first and second portions,
   the first portion, the second portion and the connecting portion are arranged to surround the plurality of resonators,
   the plurality of resonators include a first resonator and a second resonator,
   the first resonator includes a first resonator conductor portion formed of a conductor,
   the second resonator includes a second resonator conductor portion formed of a conductor,
   each of the first and second resonator conductor portions is shaped to be elongated in a direction intersecting the first direction, and has a first end and a second end opposite to each other in a longitudinal direction of the resonator conductor portion,
   the first end is connected to a ground,
   the second end is open, and
   the partition extends in a direction intersecting the longitudinal direction of each of the first and second resonator conductor portions such that at least part of the partition passes through between the first and second resonator conductor portions, and is in contact with the first portion and the second portion.

2. The band-pass filter according to claim 1, wherein the direction intersecting the first direction is orthogonal to the first direction.

3. The band-pass filter according to claim 1, wherein each of the first and second resonator conductor portions has a length smaller than or equal to ¼ a wavelength corresponding to a center frequency of a passband of the band-pass filter.

4. The band-pass filter according to claim 1, wherein the partition extends in the first direction and connects the first portion and the second portion via a shortest path.

5. The band-pass filter according to claim 1, wherein
   the first resonator further includes a first capacitor provided between the second end of the first resonator conductor portion and the ground, and
   the second resonator further includes a second capacitor provided between the second end of the second resonator conductor portion and the ground.

6. The band-pass filter according to claim 1, wherein the first resonator and the second resonator are configured to be electromagnetically coupled to each other.

7. The band-pass filter according to claim 1, wherein the plurality of resonators are three or more resonators configured so that two resonators adjacent to each other in circuit configuration are electromagnetically coupled to each other.

8. The band-pass filter according to claim 7, wherein the first resonator and the second resonator are adjacent to each other in circuit configuration.

9. The band-pass filter according to claim 7, wherein the first resonator and the second resonator are not adjacent to each other in circuit configuration.

10. The band-pass filter according to claim 7, wherein
all the plurality of resonators except the first and second resonators each include a third resonator conductor portion formed of a conductor,
the third resonator conductor portion is shaped to be elongated in a second direction intersecting the first direction, and has a first end and a second end opposite to each other in the longitudinal direction of the third resonator conductor portion,
the first end of the third resonator conductor portion is connected to the ground, and
the second end of the third resonator conductor portion is open.

11. The band-pass filter according to claim 10, wherein the second direction is orthogonal to the first direction.

12. The band-pass filter according to claim 10, wherein the third resonator conductor portion has a length smaller than or equal to 114 a wavelength corresponding to a center frequency of a passband of the band-pass filter.

13. The band-pass filter according to claim 1, wherein the main body includes a multilayer structure composed of a plurality of dielectric layers stacked on each other.

14. The band-pass filter according to claim 13, wherein
the multilayer structure includes a main portion composed of two or more dielectric layers stacked on each other, among the plurality of dielectric layers,
the main portion has a first end face and a second end face located at opposite ends in a direction in which the two or more dielectric layers are stacked,
the first portion is formed of a first conductor layer disposed on the first end face,
the second portion is formed of a second conductor layer disposed on the second end face, and
the partition runs through the two or more dielectric layers.

15. The band-pass filter according to claim 14, wherein
the partition includes a plurality of first through hole lines each running through the two or more dielectric layers, and
each of the plurality of first through hole lines includes two or more through holes connected in series.

16. The band-pass filter according to claim 14, wherein
the connecting portion of the shield includes a plurality of second through hole lines each running through the two or more dielectric layers, and
each of the plurality of second through hole lines includes two or more through holes connected in series.

17. The band-pass filter according to claim 13, wherein the first resonator conductor portion and the second resonator conductor portion are located at the same position in the multilayer structure in the first direction.

18. The band-pass filter according to claim 17, wherein the first resonator conductor portion and the second resonator conductor portion are formed of different portions of a single conductor layer.

* * * * *